US007696562B2

(12) United States Patent
Kawamata et al.

(10) Patent No.: US 7,696,562 B2
(45) Date of Patent: Apr. 13, 2010

(54) SEMICONDUCTOR DEVICE

(75) Inventors: Ikuko Kawamata, Atsugi (JP); Yasuyuki Arai, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 281 days.

(21) Appl. No.: 11/785,962

(22) Filed: Apr. 23, 2007

(65) Prior Publication Data
US 2007/0252234 A1     Nov. 1, 2007

(30) Foreign Application Priority Data
Apr. 28, 2006     (JP)     ............................. 2006-127007

(51) Int. Cl.
*H01L 29/792*     (2006.01)
*H01L 21/8238*     (2006.01)
(52) U.S. Cl. ...................................... 257/324; 438/216
(58) Field of Classification Search ................ 257/506, 257/324, 411, E21.625, E21.639; 438/216, 438/287
See application file for complete search history.

(56) References Cited

U.S. PATENT DOCUMENTS

| 4,477,310 | A |   | 10/1984 | Park et al. |
| 4,851,257 | A |   | 7/1989 | Young et al. |
| 5,185,535 | A | * | 2/1993 | Farb et al. .................... 257/351 |
| 5,605,847 | A |   | 2/1997 | Zhang |
| 5,886,364 | A |   | 3/1999 | Zhang |
| 5,998,838 | A |   | 12/1999 | Tanabe et al. |
| 6,063,694 | A |   | 5/2000 | Togo |
| 6,215,155 | B1 | * | 4/2001 | Wollesen ..................... 257/351 |
| 6,258,638 | B1 |   | 7/2001 | Tanabe et al. |
| 6,335,540 | B1 |   | 1/2002 | Zhang |
| 6,388,291 | B1 |   | 5/2002 | Zhang et al. |

(Continued)

FOREIGN PATENT DOCUMENTS

CN     1098818     2/1995

(Continued)

OTHER PUBLICATIONS

Office Action (Application No. 200710102490.6) dated Dec. 18, 2009 with English translation.

(Continued)

*Primary Examiner*—Calvin Lee
(74) *Attorney, Agent, or Firm*—Eric J. Robinson; Robinson Intellectual Property Law Office, P.C.

(57) ABSTRACT

To provide a highly reliable semiconductor device and a method for manufacturing the semiconductor device, where defects such as a short between a gate electrode layer and a semiconductor layer and a leakage current, which would otherwise be caused due to a coverage defect of the semiconductor layer with an insulating layer, can be prevented. In order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

14 Claims, 27 Drawing Sheets

U.S. PATENT DOCUMENTS

| | | |
|---|---|---|
| 6,410,938 B1 | 6/2002 | Xiang |
| 6,433,361 B1 | 8/2002 | Zhang et al. |
| 6,441,436 B1 | 8/2002 | Wu et al. |
| 6,444,508 B1 | 9/2002 | Tanabe et al. |
| 6,573,589 B2 | 6/2003 | Zhang |
| 6,703,267 B2 | 3/2004 | Tanabe et al. |
| 2003/0094669 A1 | 5/2003 | Nakashima |
| 2004/0038488 A1 | 2/2004 | Mouli |
| 2005/0023577 A1* | 2/2005 | Ito .............................. 257/288 |
| 2006/0014332 A1 | 1/2006 | Mouli |
| 2007/0252179 A1 | 11/2007 | Isobe et al. |
| 2007/0252209 A1* | 11/2007 | Yamazaki et al. ........... 257/347 |
| 2007/0252233 A1 | 11/2007 | Yamazaki et al. |

FOREIGN PATENT DOCUMENTS

| | | |
|---|---|---|
| JP | 10-242471 | 9/1998 |

OTHER PUBLICATIONS

Specification, Claims, Abstract, Drawings of U.S. Appl. No. 08/205,300 to Zhang et al.

* cited by examiner

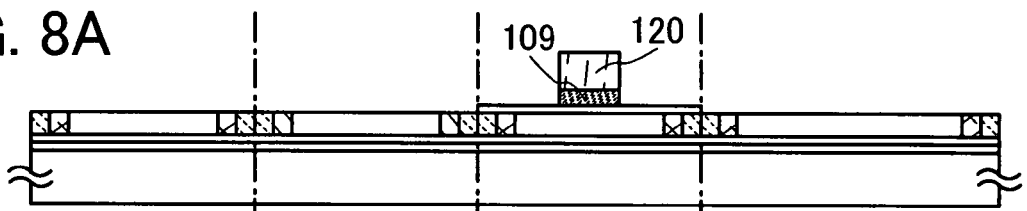
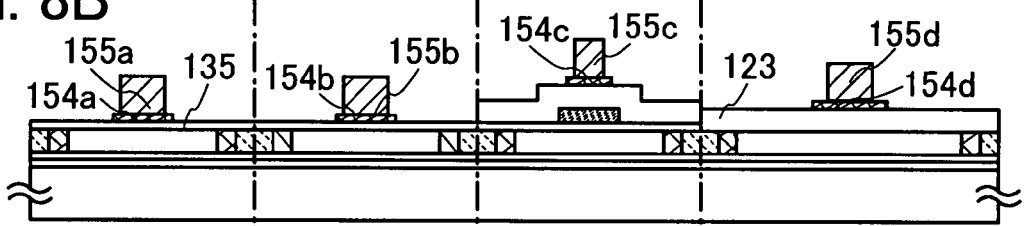
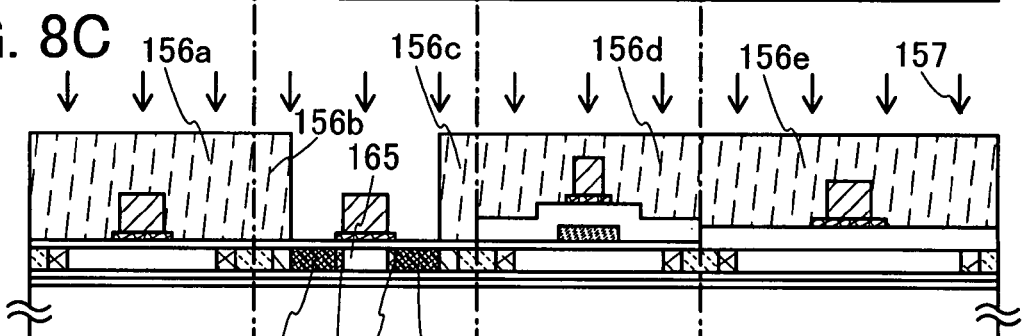
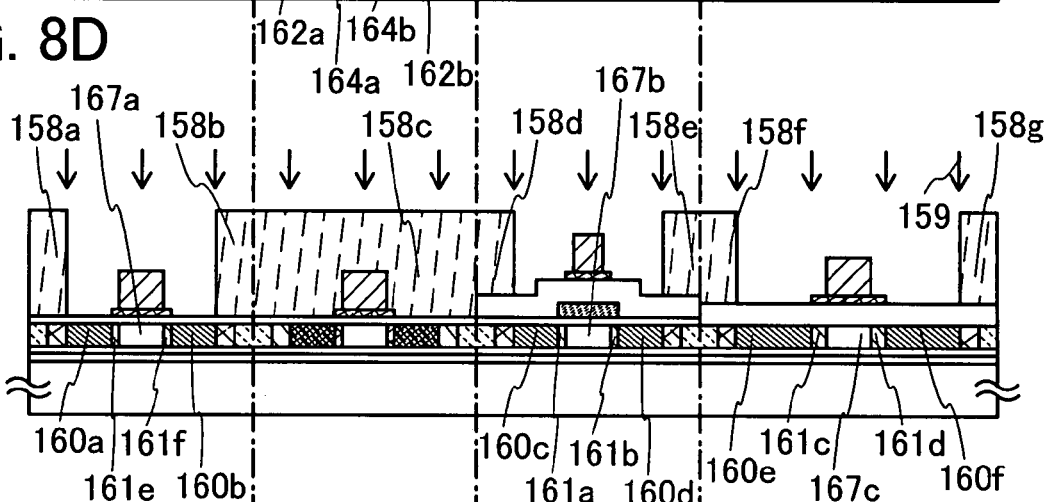
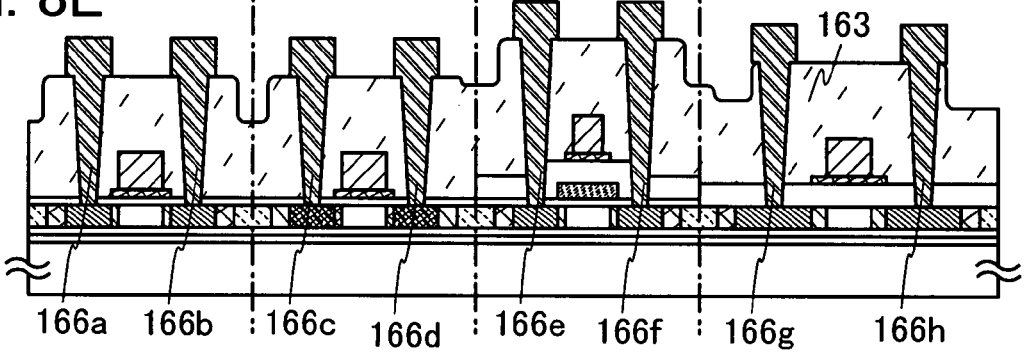

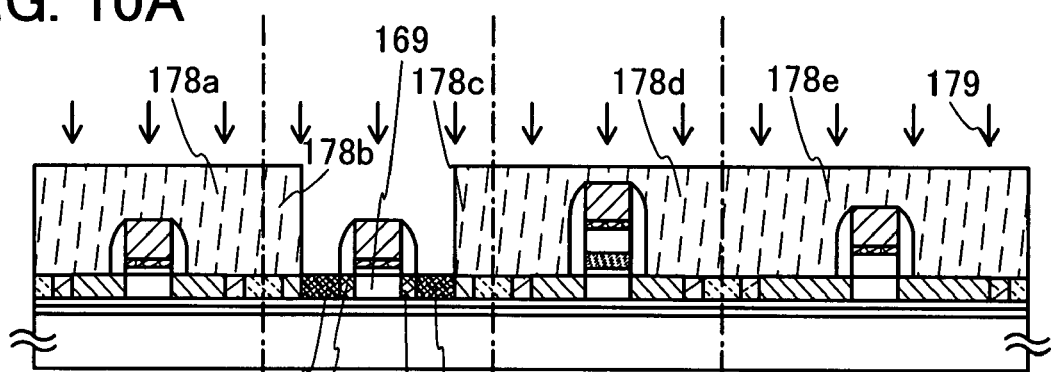
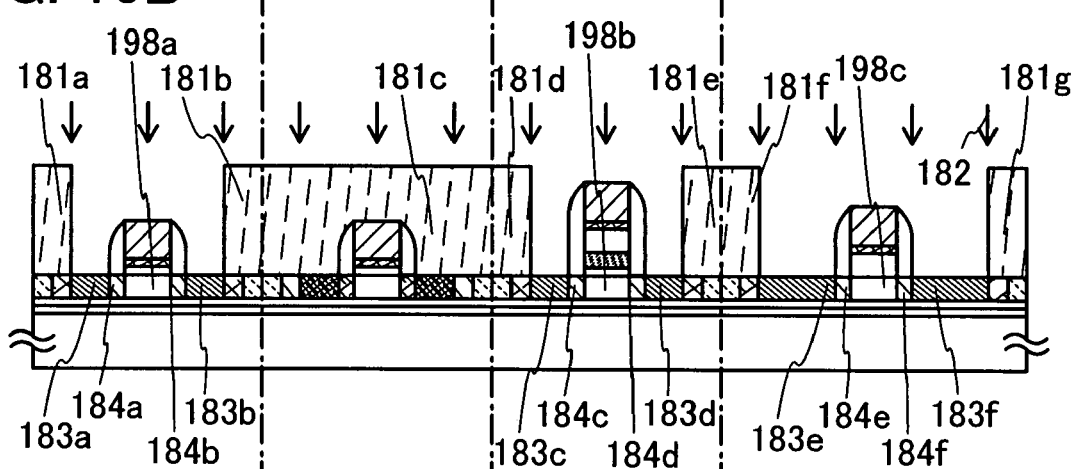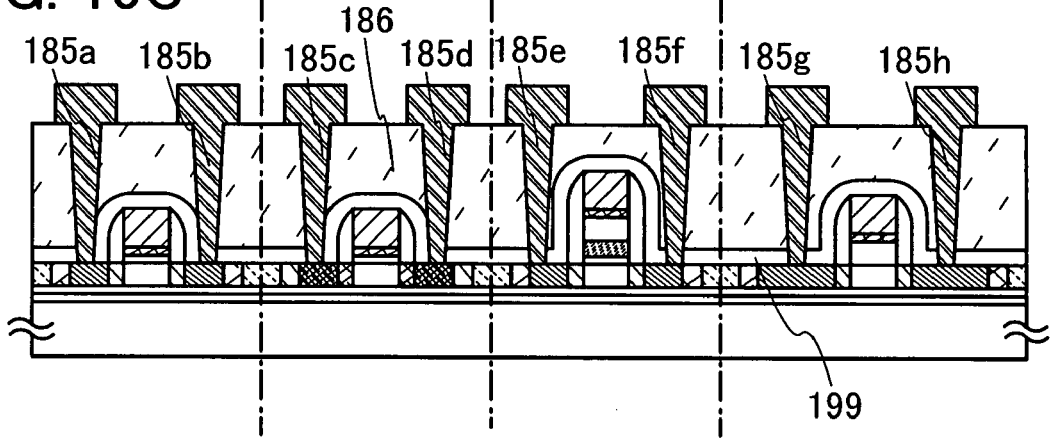

FIG. 12
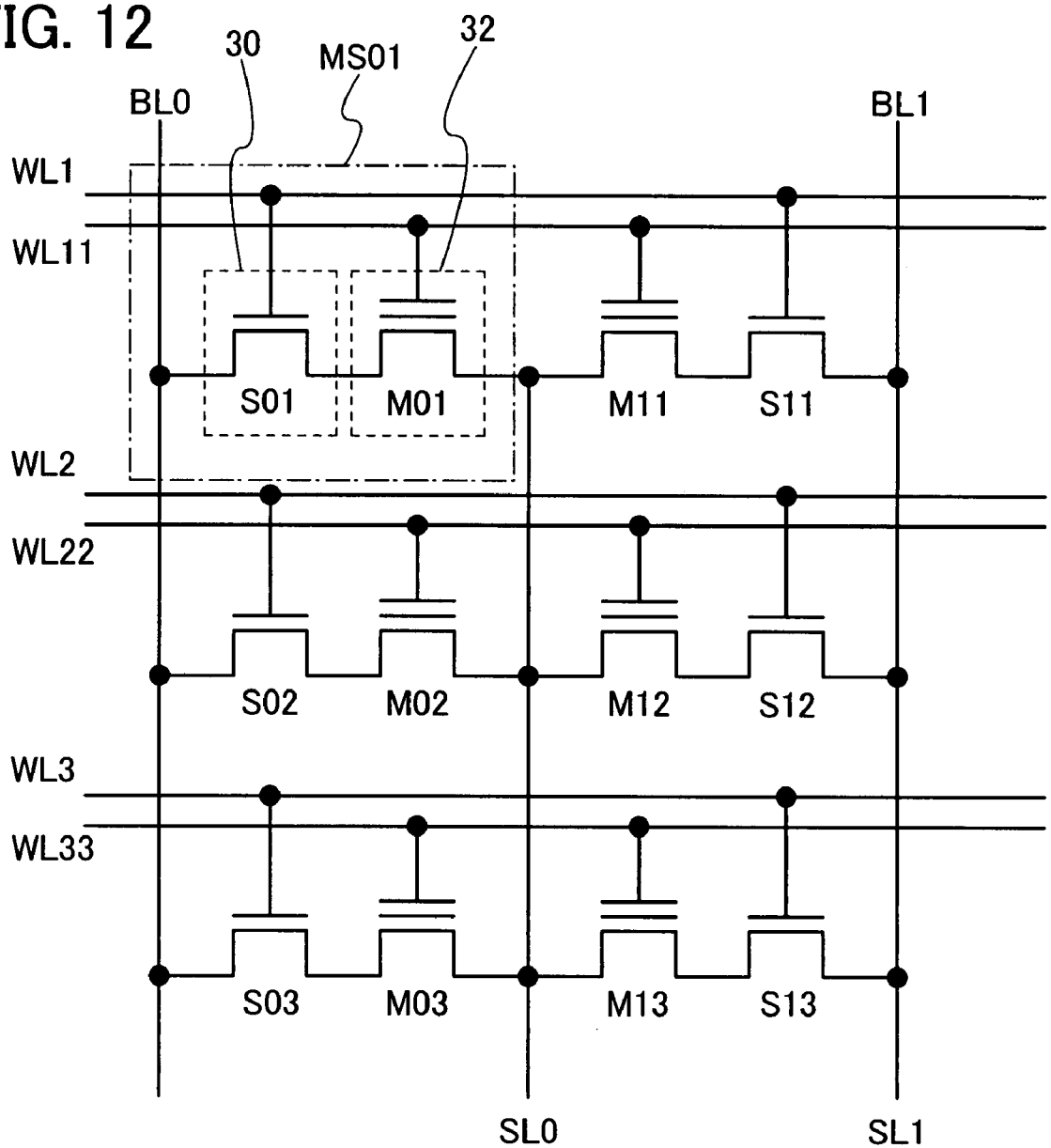
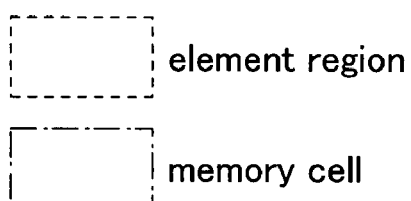

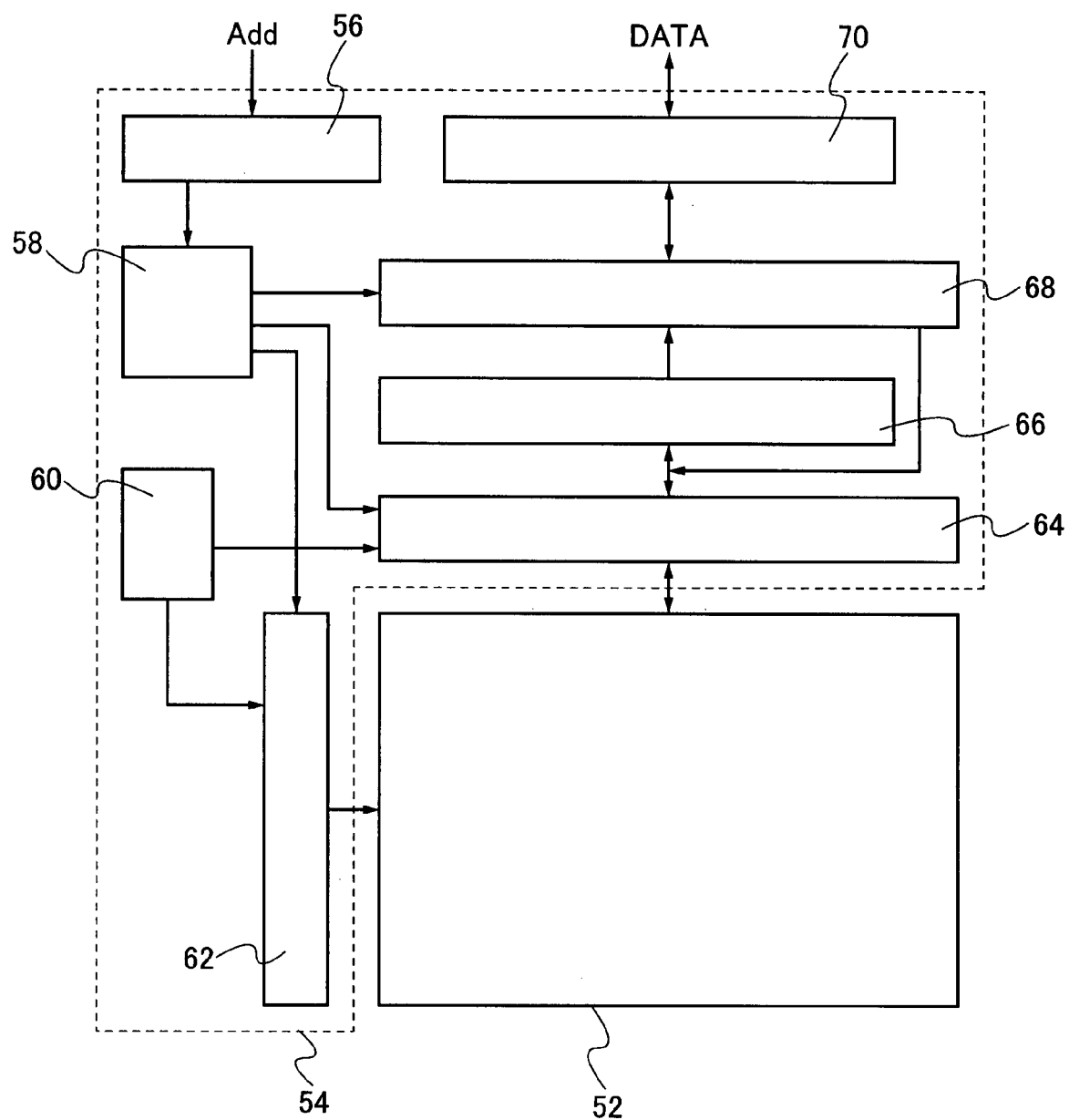

SEMICONDUCTOR DEVICE

BACKGROUND OF THE INVENTION

1. Field of the Invention

The present invention relates to a semiconductor device having a plurality of semiconductor elements and a method for manufacturing the same.

2. Description of the Related Art

When providing a plurality of semiconductor elements over an insulating surface, a method is employed in which a semiconductor film formed over an insulating surface is processed into a plurality of island-shape semiconductor layers by etching. A semiconductor element has a stacked structure of a plurality of thin films. In the case of a planar thin film transistor, a gate insulating layer is stacked so as to cover semiconductor layers which are isolated in island shapes.

Semiconductor layers which have been processed into island shapes have steps at the ends of the layers; therefore, a gate insulating layer formed over the ends of the semiconductor layers could have defects such as a thin film thickness or breaking of the film.

When a thin gate insulating layer is formed, characteristic defects of a semiconductor device could be caused such as a leakage current which flows between a gate electrode and a semiconductor layer. Further, if the gate insulating layer breaks, the gate electrode and the semiconductor layer could have a contact and thus be shorted.

In order to solve the foregoing problems, a method has been known in which two gate insulating layers with different shapes are stacked, so that steps resulting from the ends of the semiconductor layers are mitigated and thus the coverage of the semiconductor layers is improved (e.g., see Reference 1: Japanese Published Patent Application No. H10-242471).

SUMMARY OF THE INVENTION

However, when the above-described method for mitigating the steps is employed, it has been impossible to sufficiently prevent defects such as a short caused by a contact between the semiconductor layer and the gate electrode and a leakage current, depending on the thickness of the semiconductor layer and the gate insulating layer. In particular, when semiconductor elements are miniaturized (e.g., down to a gate length of 1 μm or less), there is a problem in that the leakage current increases significantly.

It is an object of the invention to provide a highly reliable semiconductor device and a method for manufacturing the semiconductor device, where defects such as a short between a gate electrode and a semiconductor layer and a leakage current, which would otherwise be caused due to a coverage defect of the semiconductor layer with a gate insulating layer, can be prevented.

In the invention, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one continuous semiconductor layer with a first impurity element which does not contribute to the conductivity, in order to electrically insulate the element regions from each other. Note that in this specification, the phrase "not to contribute to the conductivity" means that adding the element will not improve the conductivity.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one continuous semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects of the first element isolation region and the second element isolation region. Therefore, a higher element insulation/isolation effect can be obtained.

Note that in this specification, an element region includes an element formation region in which an element is not formed yet. Therefore, even when an element is not completed in the manufacturing step of the element (at the stage before other electrode layers or insulating layers are formed), an element formation region which is insulated from another element formation region by an element isolation region which is a high-resistance region provided in the semiconductor layer will be called an element region.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Therefore, when the invention is employed, a semiconductor layer can be isolated into a plurality of element regions without being separated into island shapes, and steps resulting from the ends of the semiconductor layer are not produced. Thus, since a gate insulating layer is formed over a flat semiconductor layer, the coverage of the semiconductor layer with the gate insulating layer can be improved. Therefore, a highly reliable semiconductor device and a method for manufacturing the semiconductor device can be provided, where defects such as a short between a gate electrode and a semiconductor layer and a leakage current, which would otherwise be caused due to a coverage defect of the semiconductor layer with a gate insulating layer, can be prevented.

Note that in the invention, a semiconductor device refers to a device which can function by utilizing the semiconductor characteristics. By using the invention, a device having a circuit including semiconductor elements (e.g., transistors, memory elements, and/or diodes) or a semiconductor device such as a chip including a processor circuit can be manufactured.

One aspect of the invention is a semiconductor device including a semiconductor layer over an insulating surface. The semiconductor layer includes a first element isolation region, a second element isolation region, and an element region. The element region includes a source region, a drain region, and a channel formation region; the second element isolation region has a contact with the element region; the first element isolation region has a contact with the second element isolation region; the first element isolation region contains at least one first impurity element selected from the group consisting of oxygen, nitrogen, and carbon; the second element isolation region contains a second impurity element which imparts a conductivity type opposite to that of the source region and the drain region to the second element isolation region; and the first element isolation region has lower crystallinity than the channel formation region.

In the semiconductor device of the invention with the above structure, the element region is surrounded by the second element isolation region, and the second element isolation region is surrounded by the first element isolation region.

One aspect of the invention is a semiconductor device including a semiconductor layer over an insulating surface. The semiconductor layer includes a first element isolation region, a second element isolation region, a first element region, and a second element region. The first element region and the second element region are close to each other with the first element isolation region and the second element isolation region interposed therebetween; the first element region includes a first source region, a first drain region, and a first channel formation region; the second element region includes a second source region, a second drain region, and a second channel formation region; the first source region, the first drain region, the second source region, and the second drain region have the same conductivity type; the first element isolation region contains at least one first impurity element selected from the group consisting of oxygen, nitrogen, and carbon; the second element isolation region has a contact with the first element region and the second element region; the first element isolation region has a contact with the second element isolation region; the second element isolation region contains a second impurity element which imparts a conductivity type opposite to that of the first source region, the first drain region, the second source region, and the second drain region to the second element isolation region; and the first element isolation region has lower crystallinity than the first channel formation region and the second channel formation region.

One aspect of the invention is a semiconductor device including a semiconductor layer over an insulating surface. The semiconductor layer includes a first element isolation region, a second element isolation region, a third element isolation region, a first element region, and a second element region. The first element region and the second element region are close to each other with the first element isolation region, the second element isolation region, and the third element isolation region interposed therebetween; the first element region includes a first source region, a first drain region, and a first channel formation region; the second element region contains a second source region, a second drain region, and a second channel formation region; the first source region and the first drain region are n-type impurity regions; the second source region and the second drain region are p-type impurity regions; the first element isolation region contains at least one first impurity element selected from the group consisting of oxygen, nitrogen, and carbon; the second element isolation region has a contact with the first element region; the first element isolation region has a contact with the second element isolation region; the third element isolation region has a contact with the second element region; the first element isolation region has a contact with the second element isolation region and the third element isolation region; the second element isolation region contains an impurity element which imparts p-type conductivity to the second element isolation region; the third element isolation region contains an impurity element which imparts n-type conductivity to the third element isolation region; and the first element isolation region has lower crystallinity than the first channel formation region and the second channel formation region.

One aspect of the invention is a method for manufacturing a semiconductor device, which includes the steps of forming a semiconductor layer over an insulating surface; selectively doping the semiconductor layer with at least one first impurity element selected from the group consisting of oxygen, nitrogen, and carbon, thereby forming an element region and a first element isolation region containing the first impurity element in the semiconductor layer; selectively doping the semiconductor layer with a second impurity element which imparts one conductivity type, thereby forming a second element isolation region between the first element isolation region and the element region; forming an insulating layer over the element region, the first element isolation region, and the second element isolation region; forming a conducive layer over the element region and the insulating layer; and forming a channel formation region and source and drain regions, which have a conductivity type opposite to that of the second impurity element, in the element region.

One aspect of the invention is a method for manufacturing a semiconductor device, which includes the steps of forming a semiconductor layer over an insulating surface; selectively doping the semiconductor layer with at least one first impurity element selected from the group consisting of oxygen, nitrogen, and carbon, thereby forming an element region and a first element isolation region containing the first impurity element in the semiconductor layer; selectively doping the semiconductor layer with a second impurity element which imparts one conductivity type, thereby forming a second element isolation region between the first element isolation region and the element region; forming an insulating layer over the element region, the first element isolation region, and the second element isolation region; forming a conductive layer over the element region and the insulating layer; and doping the element region with an impurity element which imparts a conductivity type opposite to that of the second impurity element, thereby forming a channel formation region and source and drain regions which have a conductivity type opposite to that of the second element isolation region.

One aspect of the invention is a method for manufacturing a semiconductor device, which includes the steps of: forming a semiconductor layer over an insulating surface; forming an insulating layer over the semiconductor layer; selectively doping the semiconductor layer with at least one first impurity element selected from the group consisting of oxygen, nitrogen, and carbon through the insulating layer, thereby forming an element region and a first element isolation region containing the first impurity element in the semiconductor layer; selectively doping the semiconductor layer with a second impurity element which imparts one conductivity type through the insulating layer, thereby forming a second element isolation region between the first element isolation region and the element region; and forming a channel formation region and source and drain regions, which have a conductivity type opposite to that of the second impurity element, in the element region.

One aspect of the invention is a method for manufacturing a semiconductor device, which includes the steps of: forming a semiconductor layer over an insulating surface; forming an insulating layer over the semiconductor layer; selectively doping the semiconductor layer with at least one first impurity element selected from the group consisting of oxygen, nitrogen, and carbon through the insulating layer, thereby forming an element region and a first element isolation region containing the first impurity element in the semiconductor layer; selectively doping the semiconductor layer with a second impurity element which imparts one conductivity type through the insulating layer, thereby forming a second element isolation region between the first element isolation region and the element region; and doping the element region with an impurity element which imparts a conductivity type opposite to that of the second impurity element, thereby forming a channel formation region and source and drain regions which have a conductivity type opposite to that of the second element isolation region.

When the invention is employed, a semiconductor layer can be isolated into a plurality of element regions without being separated into island shapes, so that a plurality of semiconductor elements can be manufactured. Therefore, steps resulting from the ends of the semiconductor layer are not produced, and a gate insulating layer is formed over a flat semiconductor layer. Thus, the coverage of the semiconductor layer with the gate insulating layer is improved.

Thus, a highly reliable semiconductor device and a method for manufacturing the semiconductor device can be provided, where defects such as a short between a gate electrode and a semiconductor layer and a leakage current, which would otherwise be caused due to a coverage defect of the semiconductor layer with a gate insulating layer, can be prevented. Accordingly, further miniaturization and higher integration of the semiconductor device are possible, and higher performance of the semiconductor device can be achieved.

BRIEF DESCRIPTION OF THE DRAWINGS

In the accompanying drawings:

FIGS. 8A to 8E illustrate a method for manufacturing a semiconductor device of the invention;

FIGS. 10A to 10C illustrate a method for manufacturing a semiconductor device of the invention;

FIG. 12 shows an exemplary equivalent circuit of a semiconductor device;

FIG. 19 is an exemplary circuit block diagram of a semiconductor device;

DETAILED DESCRIPTION OF THE INVENTION

Figure 1A:
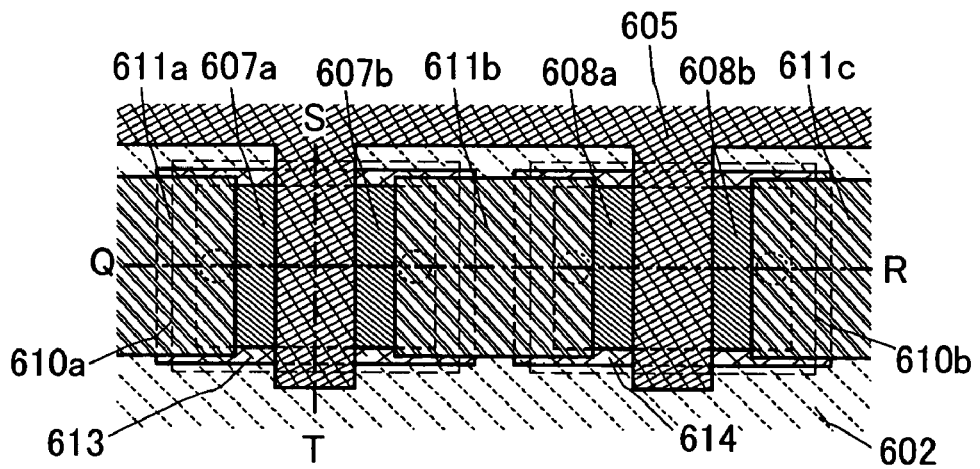
FIG. 1A is a top view of a semiconductor device of the invention.

Embodiment modes of the invention will be described in detail below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiment modes. In the structure of the invention described below, like reference numerals are used to designate portions which are identical in different drawings, and their repetitive description is omitted.

Embodiment Mode 1

In this embodiment mode, an NMOS (N-channel Metal Oxide Semiconductor) and a CMOS (Complementary Metal Oxide Semiconductor) will be described with reference to the drawings, as an example of a highly reliable semiconductor device where defects such as a short between a gate electrode layer and a semiconductor layer and a leakage current, which would otherwise be caused due to a coverage defect of the semiconductor layer with a gate insulating layer, can be prevented.

Figure 1B:
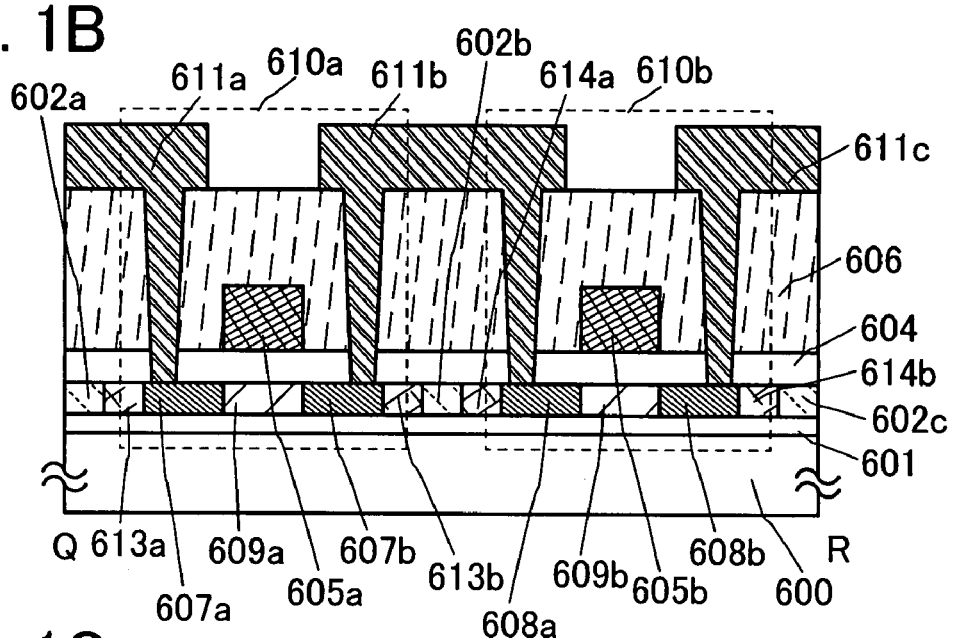
FIGS. 1B and 1C are cross-sectional views thereof.
Figure 1C:
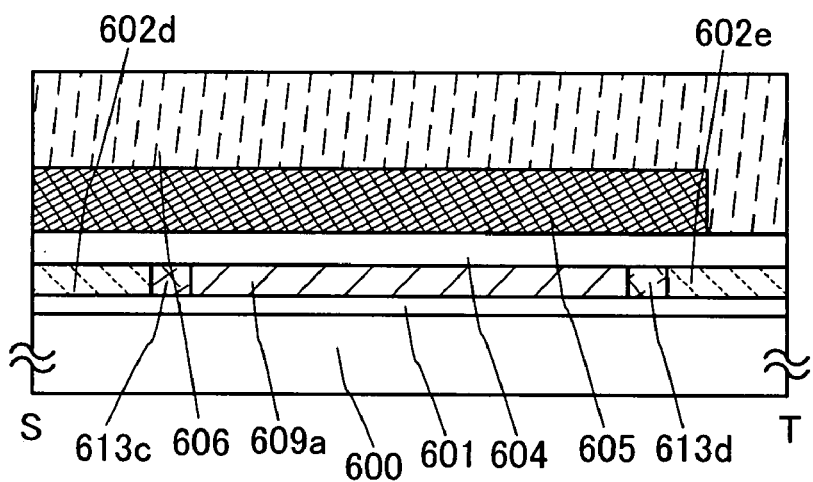

FIGS. 1A to 1C show an exemplary semiconductor device having an NMOS structure of this embodiment mode. FIG. 1 is a top view, FIG. 1B is a cross-sectional view taken along a line Q-R of FIG. 1A, and FIG. 1C is a cross-sectional view taken along a line S-T of FIG. 1A.

Over a substrate 600 having an insulating layer 601 functioning as a base film of a semiconductor layer, an NMOS structure which includes an n-channel thin film transistor 610a and an n-channel thin film transistor 610b, and an insulating layer 606 are formed. The transistor 610a includes an element region including n-type impurity regions 607a and 607b and a channel formation region 609a, and a gate electrode layer 605a. The transistor 610b includes an element region including n-type impurity regions 608a and 608b and a channel formation region 609b, and a gate electrode layer 605b. A gate insulating layer 604 and the insulating layer 606 are formed continuously in the transistors 610a and 610b. In addition, a wiring layer 611a which is a source electrode layer or a drain electrode layer connected to the n-type impurity region 607a; a wiring layer 611b which is a source electrode layer and a drain electrode layer connected to the n-type impurity region 607b and the n-type impurity region 608a; and a wiring layer 611c which is a source electrode layer or a drain electrode layer connected to the n-type impurity region 608b are provided. The wiring layer 611b electrically connects the transistor 610a and the transistor 610b (see FIGS. 1A to 1C).

In the semiconductor layer, the element region including the n-type impurity regions 607a and 607b and the channel formation region 609a, which partially constitutes the transistor 610a, and the element region including the n-type impurity regions 608a and 608b and the channel formation region 609b, which partially constitutes the transistor 610b, are electrically insulated from each other by first element isolation region 602 (602a to 602e) and second element isolation regions 613 (613a and 613b) and 614 (614a and 614b).

FIGS. 1A to 1C show the case of forming a plurality of n-channel thin film transistors. Since source and drain regions of the transistor 610a are the n-type impurity regions 607a and 607b, the second element isolation regions 613a and 613b having a contact with the n-type impurity regions 607a and 607b respectively are formed as p-type impurity regions. Similarly, since source and drain regions of the transistor 610b are the n-type impurity regions 608a and 608b, the second element isolation regions 614a and 614b having a contact with the n-type impurity regions 608a and 608b respectively are formed as p-type impurity regions. The second element isolation regions 613 (613a and 613b) and 614 (614a and 614b) which are the p-type impurity regions can be formed by adding an impurity element which imparts p-type conductivity (e.g., boron (B), aluminum (Al), or gallium (Ga)).

The first element isolation regions 602a, 602b, and 602c are provided in contact with the second element isolation regions 613a, 613b and 614a, and 614b, respectively. As for the element region of the transistor 610a and the element region of the transistor 610b, as shown in FIG. 1B, the second element isolation region 613b is provided in contact with the n-type impurity region 607b, the second element isolation region 614a is provided in contact with the n-type impurity region 608a, and the first element isolation region 602b is provided between the second element isolation region 613b and 614a. Referring to the top view in FIG. 1A, the element regions of the transistors 610a and 610b are surrounded by the second element isolation regions 613 and 614 respectively, and the second element isolation regions 613 and 614 are surrounded by the first element isolation region 602. In this manner, by providing the first element isolation regions 602 and the second element isolation regions 613 and 614, the transistor 610a and the transistor 610b are insulated from each other and thus formed as individual elements.

Figure 27A:
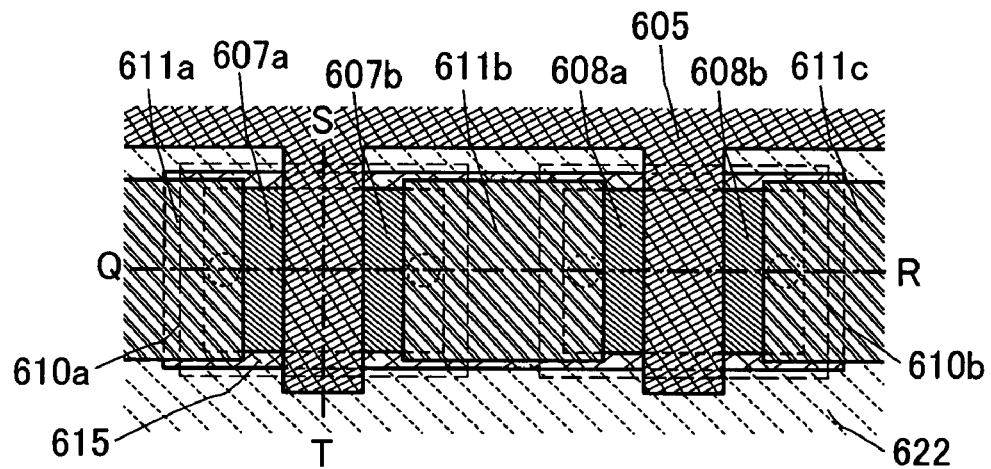
FIG. 27A is a top view of a semiconductor device of the invention.
Figure 27B:
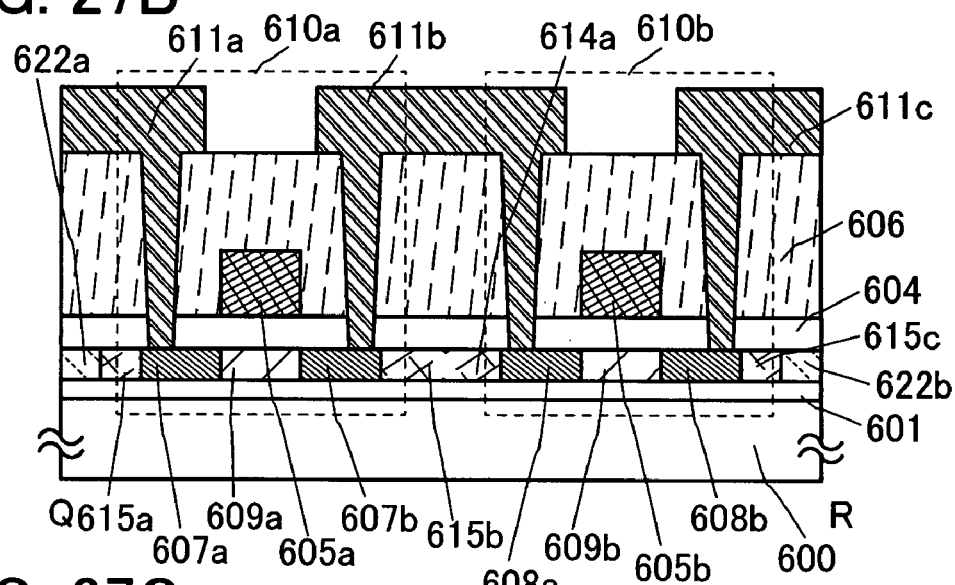
FIGS. 27B and 27C are cross-sectional views thereof.
Figure 27C:
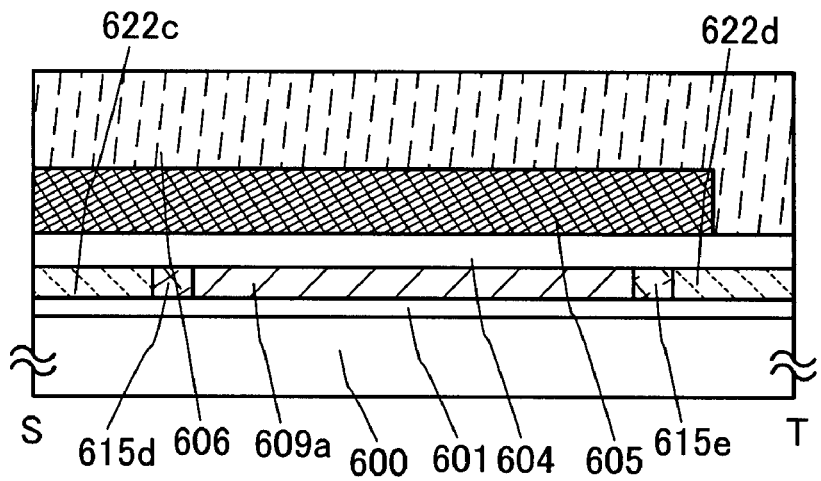

In the case of insulating the element regions of the transistors having the same conductivity type as shown in FIGS. 1A to 1C, it is also possible to provide the second element isolation region continuously between the two element regions. FIGS. 27A to 27C show an example where the positions of the first element isolation regions and the second element isolation regions are different from those of the NMOS structure shown in FIGS. 1A to 1C. In FIGS. 27A to 27C, the element region of the transistor 610a and the element region of the transistor 610b are insulated from each other by first element isolation region 622 (622a to 622d) and second element isolation region 615 (615a to 615e).

In FIGS. 27A to 27C, the second element isolation region 615b which is a p-type impurity region is formed continuously between the n-type impurity region 607b of the transistor 610a and the n-type impurity region 608a of the transistor 610b. Since the n-type impurity region 607b, the second element isolation region 615b which is the p-type impurity region, and the n-type impurity region 608a are formed contiguously, PNP and PN junctions are repeatedly formed. As a result, the n-type impurity regions and the p-type impurity regions are alternately provided. Thus, the impurity regions having the same conductivity type can be insulated from each other. In this manner, the second element isolation region is not necessarily required to be provided for each element, and it may be provided continuously so as to surround a plurality of elements having the same conductivity type.

Figure 4A:
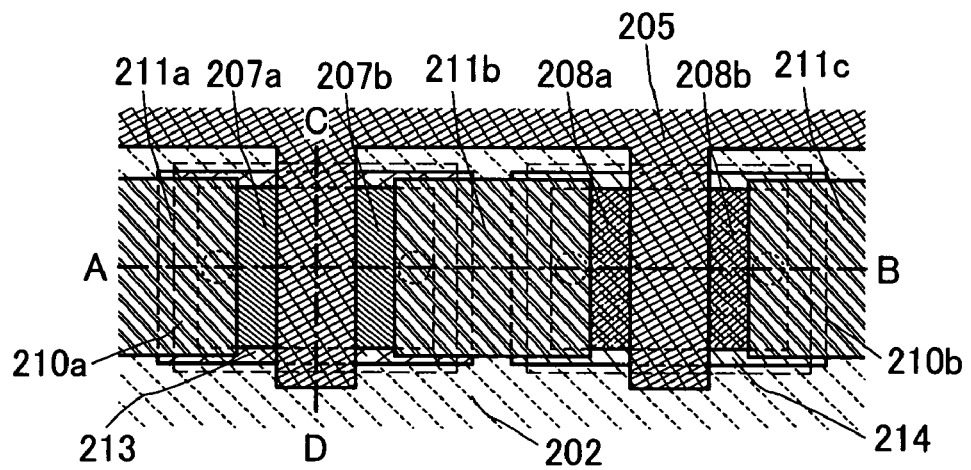
FIG. 4A is a top view of a semiconductor device of the invention.
Figure 4B:
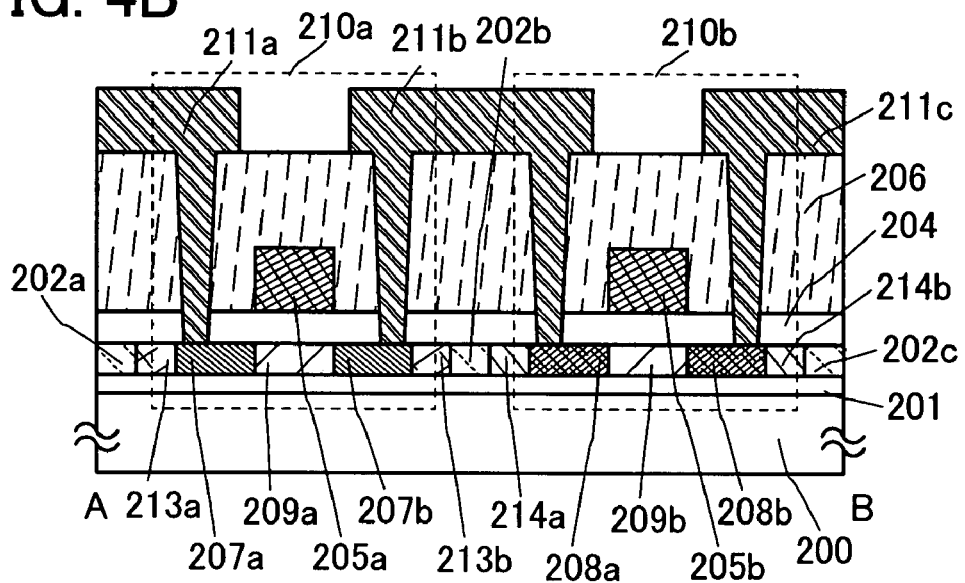
FIGS. 4B and 4C are cross-sectional views thereof.
Figure 4C:
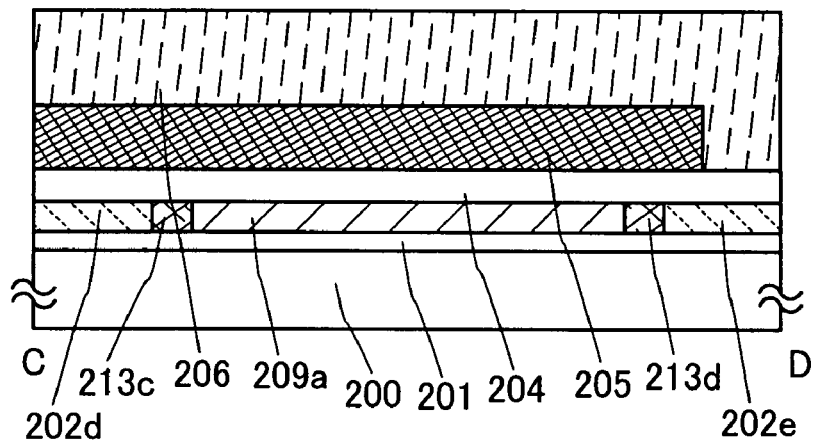

FIGS. 4A to 4C show an exemplary semiconductor device having a CMOS structure of this embodiment mode. FIG. 4 is a top view, FIG. 4B is a cross-sectional view taken along a line A-B of FIG. 4A, and FIG. 4C is a cross-sectional view taken along a line C-D of FIG. 4A.

Over a substrate 200 having an insulating layer 201 functioning as a base film of a semiconductor layer, a CMOS structure which includes an n-channel thin film transistor 210a and a p-channel thin film transistor 210b, and an insulating layer 206 are formed. The transistor 210a includes an element region including n-type impurity regions 207a and 207b and a channel formation region 209a, and a gate electrode layer 205a. The transistor 210b includes an element region including p-type impurity regions 208a and 208b and a channel formation region 209b, and a gate electrode layer 205b. A gate insulating layer 204 and the insulating layer 206 are formed continuously in the transistors 210a and 210b. In addition, a wiring layer 211a which is a source electrode layer or a drain electrode layer connected to the n-type impurity region 207a; a wiring layer 211b which is a source electrode layer and a drain electrode layer connected to the n-type impurity region 207b and the p-type impurity region 208a; and a wiring layer 211c which is a source electrode layer or a drain electrode layer connected to the p-type impurity region 208b are provided. The wiring layer 211b electrically connects the transistor 210a and the transistor 210b (see FIGS. 4A to 4C).

In the semiconductor layer, the element region including the n-type impurity regions 207a and 207b and the channel formation region 209a, which partially constitutes the transistor 210a, and the element region including the p-type impurity regions 208a and 208b and the channel formation region 209b, which partially constitutes the transistor 210b, are electrically insulated from each other by first element isolation region 202 (202a to 202e) and second element isolation regions 213 (213a and 213b) and 214 (214a and 214b).

FIGS. 4A to 4C show the case of forming the n-channel thin film transistor and the p-channel thin film transistor. Since source and drain regions of the transistor 210a are the n-type impurity regions 207a and 207b, the second element isolation regions 213a and 213b having a contact with the n-type impurity regions 207a and 207b respectively are formed as p-type impurity regions. On the other hand, since source and drain regions of the transistor 210b are the p-type impurity regions 208a and 208b, the second element isolation regions 214a and 214b having a contact with the p-type impurity regions 208a and 208b respectively are formed as n-type impurity regions. The second element isolation region 213 (213a and 213b) which is the p-type impurity region and the second element isolation regions 214 (214a and 214b) which are the n-type impurity regions can be formed by adding an impurity element which imparts n-type conductivity (e.g., phosphorus (P) or arsenic (As)), or an impurity element which imparts p-type conductivity (e.g., boron (B), aluminum (Al), or gallium (Ga)).

The first element isolation regions 202a, 202b, and 202c are provided in contact with the second element isolation regions 213a, 213b and 214a, and 214b, respectively. As for the element region of the transistor 210a and the element region of the transistor 210b, as shown in FIG. 4B, the second element isolation region 213b is provided in contact with the n-type impurity region 207b, the second element isolation region 214a is provided in contact with the p-type impurity region 208a, and the first element isolation region 202b is provided between the second element isolation regions 213b and 214a. Referring to the top view in FIG. 4A, the element regions of the transistors 210a and 210b are surrounded by the second element isolation regions 213 and 214 respectively, and the second element isolation regions 213 and 214 are surrounded by the first element isolation region 202. In this manner, by providing the first element isolation region 202 and the second element isolation regions 213 and 214, the transistor 210a and the transistor 210b are insulated from each other and thus formed as individual elements.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, the element region of the transistor 210a and the element region of the transistor 210b are positioned close to each other by interposing the second element isolation region 213b having a contact with the element region of the transistor 210a, the first element isolation region 202b, and the second element isolation region 214a having a contact with the element region of the transistor 210b between the element regions.

When the source and drain regions in the element regions of the transistor 210a and the transistor 210b have the same conductivity type, e.g., n-type impurity regions, the second element isolation regions of both the element regions are p-type impurity regions having a conductivity type opposite to that of the element regions. On the other hand, when the source and drain regions in the element regions of the transistor 210a and the transistor 210b have opposite conductivity types such that the source and drain regions in the element region of the transistor 210a are n-type impurity regions and the source and drain regions in the element region of the transistor 210b are p-type impurity regions, the second element isolation regions of the two transistors have opposite conductivity types correspondingly, such that the second element isolation region of the transistor 210a is a p-type impurity region and the second element isolation region of the transistor 210b is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other. Note that in this specification, the phrase "not to contribute to the conductivity" means that adding the element will not improve the conductivity.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1\times10^{10}$ Ω·cm or more, and the concentration of the first impurity element such as oxygen, nitrogen, or carbon is preferably $1\times10^{20}$ cm$^{-3}$ or more and less than $4\times10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

Note that in this specification, an element region includes an element formation region in which an element is not formed yet. Therefore, even when an element is not completed in the manufacturing step of the element (at the stage before other electrode layers or insulating layers are formed), an element formation region which is insulated from another element formation region by an element isolation region which is a high-resistance region provided in the semiconductor layer will be called an element region.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Although this embodiment mode has illustrated the NMOS structure and the CMOS structure, the invention can be similarly applied to a PMOS structure. In the case of a PMOS structure, source and drain regions of an element region are p-type impurity regions; therefore, an element isolation region adjacent to the element region may be doped with a second impurity element which imparts n-type conductivity so as to form an n-type impurity region. Therefore, the invention can be applied to any of an NMOS structure, a PMOS structure, and a CMOS structure.

Referring to FIG. 1C, a gate electrode layer 605 is formed over the channel formation region 609a, the first element isolation regions 602d and 602e, and the second element isolation regions 613c and 613d which are included in the semiconductor layer, with the gate insulating layer 604 interposed therebetween. In the invention, the element isolation regions and the element regions are provided in one continuous semiconductor layer. Therefore, the first element isolation regions 602d and 602e, the second element isolation regions 613c and 613d, and the element region which is the channel formation region 609a are contiguous. Therefore, the surface of the regions is highly flat and has no steep steps.

Similarly, referring to FIG. 4C, a gate electrode layer 205 is formed over the channel formation region 209a, the first element isolation regions 202d and 202e, and the second element isolation regions 213c and 213d which are included in the semiconductor layer, with the gate insulating layer 204 interposed therebetween. In the invention, the element isolation regions and the element regions are provided in one continuous semiconductor layer. Therefore, the first element isolation regions 202d and 202e, the second element isolation regions 213c and 213d, and the element region which is the channel formation region 209a are contiguous. Therefore, the surface of the regions is highly flat and has no steep steps.

Since the gate insulating layers 604 and 204 are formed over the highly flat semiconductor layers, the coverage of the semiconductor layer is high and shape defects of the film could hardly occur. Therefore, defects such as a leakage current and a short between the element regions and the gate electrode layers 605 and 205 which are formed over the gate insulating layers 604 and 204 respectively can be prevented. Thus, a semiconductor device having the NMOS structure or the CMOS structure in this embodiment mode can be provided as a highly reliable semiconductor device where defects such as a short between a gate electrode and a semiconductor layer and a leakage current, which would otherwise be caused due to a coverage defect of the semiconductor layer with a gate insulating layer, can be prevented.

In FIG. 1B, although the impurity regions are shown by hatching on a white background, this does not mean that the white background portion is not doped with an impurity element, but is shown so that it will be intuitively understood that the concentration distribution of the impurity element in the region reflects masks or doping conditions. Note that the same can be said for the other drawings in this specification. For example, when the surface of the semiconductor layer is doped with an impurity element not perpendicularly but obliquely, the doped region of the semiconductor layer differs.

For the substrate 200 having an insulating surface, a glass substrate, a quartz substrate, a sapphire substrate, a ceramic substrate, a metal substrate having an insulating layer formed on its surface, or the like can be used.

For the insulating layer 201, the gate insulating layer 204, and the insulating layer 206, silicon oxide, silicon nitride, silicon oxynitride, silicon nitride oxide, or the like can be used, and either a single-layer structure or a stacked structure of two or three layers can be employed. Note that in this specification, silicon oxynitride means a substance in which the composition ratio of oxygen is higher than that of nitrogen. Therefore, it can also be called silicon oxide containing nitrogen. Similarly, silicon nitride oxide means a substance in which the composition ratio of nitrogen is higher than that of oxygen. Therefore, it can also be called silicon nitride containing oxygen.

Alternatively, the insulating layer 201, the gate insulating layer 204, and the insulating layer 206 can be formed using materials selected from among aluminum nitride, aluminum oxynitride in which the composition ratio of oxygen is higher than that of nitrogen, aluminum nitride oxide in which the composition ratio of nitrogen is higher than that of oxygen, aluminum oxide, diamond-like carbon (DLC), carbon containing nitrogen, polysilazane, and other substances containing inorganic insulating materials. It is also possible to use a material containing siloxane. Note that siloxane corresponds to a material having a Si—O—Si bond. Siloxane has a skeletal structure with the bond of silicon (Si) and oxygen (O). As a substituent of siloxane, an organic group containing at least hydrogen (e.g., an alkyl group or an aryl group) is used. Alternatively, a fluoro group may be used as the substituent. As a further alternative, both an organic group containing at least hydrogen and a fluoro group may be used as the substituent. Further, an oxazole resin such as photo-curing polybenzoxazole can also be used.

The insulating layer 201, the gate insulating layer 204, and the insulating layer 206 can be formed by a sputtering method, a PVD (Physical Vapor Deposition) method, a CVD (Chemical Vapor Deposition) method such as low-pressure CVD (LPCVD) or plasma CVD, a droplet discharge method by which patterns can be formed selectively, a printing method by which patterns can be transferred or depicted (a method by which patterns are formed such as screen printing or offset printing), a coating method such as spin coating, a dipping method, a dispensing method, or the like.

An etching process for processing a film into a desired shape may be conducted by using either plasma etching (dry etching) or wet etching. Plasma etching is suitable for processing a large-area substrate. As an etching gas, a fluorine-source gas such as $CF_4$ or $NF_3$ or a chlorine-source gas such as $Cl_2$ or $BCl_3$ may be used, and an inert gas such as He or Ar may also be mixed into the etching gas as appropriate. Further, when an etching process is conducted by atmospheric discharge plasma, local discharge processing becomes possible; therefore, there is no need to form a mask layer over the entire surface of the substrate.

Further, the gate insulating layer may be formed by conducting plasma treatment to the semiconductor layer. By conducting plasma treatment under a nitrogen atmosphere or an oxygen atmosphere, the surface of a semiconductor layer made of silicon or the vicinity thereof, for example, can be nitrided or oxidized, so that a nitrogen-plasma-treated layer or an oxygen-plasma-treated layer can be formed. In addition, when plasma oxidation treatment or plasma nitridation treatment is performed (or both of them may be performed) to the gate insulating layer, the surface of the gate insulating layer can be modified so that a denser gate insulating layer can be obtained. Therefore, defects such as pin holes can be suppressed, and the characteristics of the semiconductor device and the like can be improved.

For the solid-phase oxidation treatment or solid-phase nitridation treatment by plasma treatment, it is preferable to use plasma which is excited by microwaves (typically, 2.45 GHz) and which has an electron density of $1\times10^{11}$ to $1\times10^{13}$ $cm^{-3}$, inclusive and an electron temperature of 0.5 to 1.5 eV, inclusive. This is in order to form a dense insulating layer as well as obtaining a practical reaction speed by the solid-phase oxidation treatment or solid-phase nitridation treatment at a temperature of 500° C. or less.

In the case of oxidizing the surface of the semiconductor layer by such plasma treatment, the plasma treatment is conducted under an oxygen atmosphere (e.g., an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). In the case of conducting nitridation by plasma treatment, the plasma treatment is conducted under a nitrogen atmosphere (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a mixed gas of Ar and Kr can also be used. Note that the plasma treatment includes oxidation treatment, nitridation treatment, oxynitridation treatment, hydrogenation treatment, and surface modification treatment for a semiconductor layer, an insulating layer, or a conductive layer. When plasma is excited by the introduction of microwaves, plasma with a low electron temperature (3 eV or less, preferably 1.5 eV or less) and a high electron density ($1\times10^{11}$ $cm^{-3}$ or more) can be generated. With oxygen radicals (which may include OH radicals) and/or nitrogen radicals (which may include NH radicals) which are produced by the high-density plasma, the surface of the semiconductor layer can be oxidized or nitrided. When the plasma treatment gas is mixed with a rare gas such as argon, oxygen radicals or nitrogen radicals can be efficiently generated by excited species of the rare gas.

By oxidizing the surface of a silicon layer by plasma treatment as a typical example of the semiconductor layer, a dense oxide layer without a distorted interface can be formed. Further, by forming a nitride layer by further nitriding the surface of the oxide layer by plasma treatment so as to substitute nitrogen for oxygen of the outermost surface, an even denser film can be obtained. Accordingly, an insulating layer with high withstand voltage can be formed.

Note that the plasma treatment in the invention is conducted with the conditions that the electrical characteristics of transistors are not adversely affected.

Further, even after forming the substrate, the insulating layer, the interlayer insulating layer, or other insulating layers, conductive layers, and the like which constitute the semiconductor device, plasma oxidation treatment or plasma nitridation treatment may be conducted on the surface of the substrate, the insulating layer, or the interlayer insulating layer. By oxidizing or nitriding the surface of the insulating layer by plasma treatment, the surface of the insulating layer can be modified, so that an insulating layer which is denser than an insulating layer formed by a CVD method or a sputtering method can be formed. Therefore, defects such as pin holes can be suppressed, and the characteristics and the like of the semiconductor device can be improved. The above-described plasma treatment can also be conducted for a conductive layer or the like such as a gate electrode layer, a source wiring layer, and a drain wiring layer. In that case, the surface of the layer or the vicinity of the surface can be nitrided or oxidized.

The semiconductor layer is preferably formed using a single-crystalline semiconductor or a polycrystalline semiconductor. For example, the semiconductor layer can be obtained by crystallizing a semiconductor layer which is formed over the entire surface of the substrate by a sputtering method, a plasma CVD method, or a low-pressure CVD method. The semiconductor material is preferably silicon, and a silicon germanium semiconductor can also be used. Crystallization of the semiconductor layer can be conducted by a laser crystallization method, a thermal crystallization method using rapid thermal annealing (RTA) or an annealing furnace, a crystallization method using a metal element which promotes the crystallization, or a method combining them.

The semiconductor layer may be doped with a p-type impurity. As a p-type impurity, boron is used for example, and it may be added so as to be contained in the semiconductor layer at a concentration of about $5\times10^{15}$ to $1\times10^{16}$ atoms/$cm^3$. This is in order to control the threshold voltage of the transistors, and the impurity can effectively act by being added into the channel formation regions 209a and 209b.

Note that a wiring layer and a gate electrode layer of the transistor can be formed using a conductive material such as indium tin oxide (ITO), IZO (Indium Zinc Oxide) which is obtained by mixing indium oxide with zinc oxide (ZnO), or a mixture of indium oxide and silicon oxide ($SiO_2$); organic indium; organotin; indium oxide containing tungsten oxide; indium zinc oxide containing tungsten oxide; indium oxide containing titanium oxide; indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of the metal; or nitride of the metal.

The invention is not limited to this embodiment mode, and a thin film transistor may have any of a single-gate structure in which one channel formation region is formed in one thin film transistor, a double-gate structure in which two channel formation regions are formed, and a triple-gate structure in which three channel formation regions are formed. In addition, thin film transistors in the peripheral driver circuit region may also have any of a single-gate structure, a double-gate structure, and a triple-gate structure.

Therefore, when the invention is employed, a semiconductor layer can be isolated into a plurality of element regions without being separated into island shapes, and steps resulting from the ends of the semiconductor layer are not produced. Thus, since a gate insulating layer is formed over a flat semiconductor layer, the coverage of the semiconductor layer can be improved. Therefore, a highly reliable semiconductor device and a method for manufacturing the semiconductor device can be provided, where defects such as a short between a gate electrode layer and a semiconductor layer and a leakage current, which would otherwise be caused due to a coverage defect of the semiconductor layer with a gate insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

Embodiment Mode 2

In this embodiment mode, a nonvolatile semiconductor memory device is described with reference to the drawings as an example of a highly reliable semiconductor device where defects such as a short between an electrode layer and a semiconductor layer and a leakage current, which would otherwise be caused due to a coverage defect of the semiconductor layer with an insulating layer, can be prevented.

A nonvolatile memory element is similar in structure to a MOSFET (Metal Oxide Semiconductor Field Effect Transistor), and has a region capable of accumulating charges for a long time, over a channel formation region. Since such a charge accumulating region is formed on an insulating layer and electrically insulated from surrounding regions, it is also called a floating gate electrode layer. In addition, since the floating gate electrode layer has a function of accumulating charges, it is also called a charge accumulating layer. In this specification, the charge accumulating layer including the floating gate electrode layer is mainly called a charge accumulating layer. Over the floating gate electrode layer, a control gate electrode layer is further provided with an insulating layer interposed therebetween.

In a so-called floating-gate nonvolatile semiconductor memory device having the above structure, charges are accumulated in or released from the charge accumulating layer by a voltage applied to the control gate electrode layer. That is, by injecting or releasing charges into/from the charge accumulating layer, data can be stored in or deleted from the memory. Specifically, injection and releasing of charges into/from the charge accumulating layer are conducted by applying a high voltage between the control gate electrode layer and the semiconductor layer in which the channel formation region is formed. At this time, it is considered that Fowler-Nordheim (F-N) tunnel current (in the case of a NAND type) or thermoelectrons (in the case of a NOR type) flow through the insulating layer on the channel formation region. Therefore, this insulating layer is also called a tunnel insulating layer.

Figure 2A:
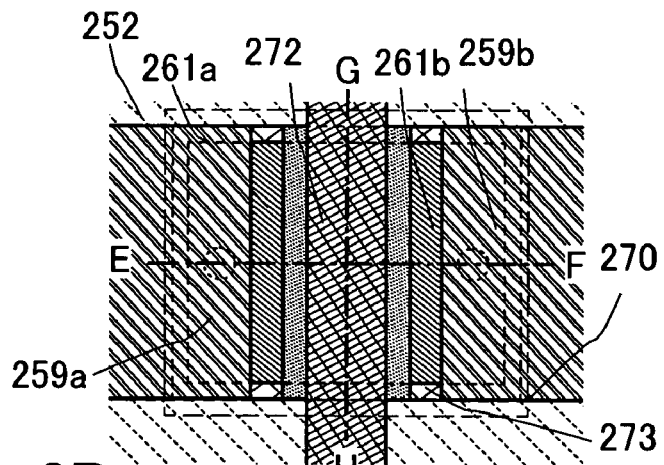
FIG. 2A is a top view of a semiconductor device of the invention.
Figure 2B:
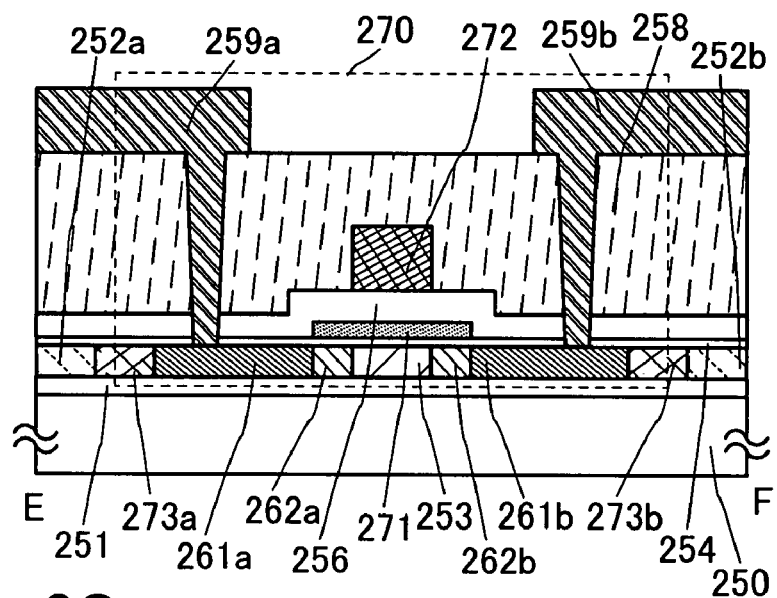
FIGS. 2B and 2C are cross-sectional views thereof.
Figure 2C:
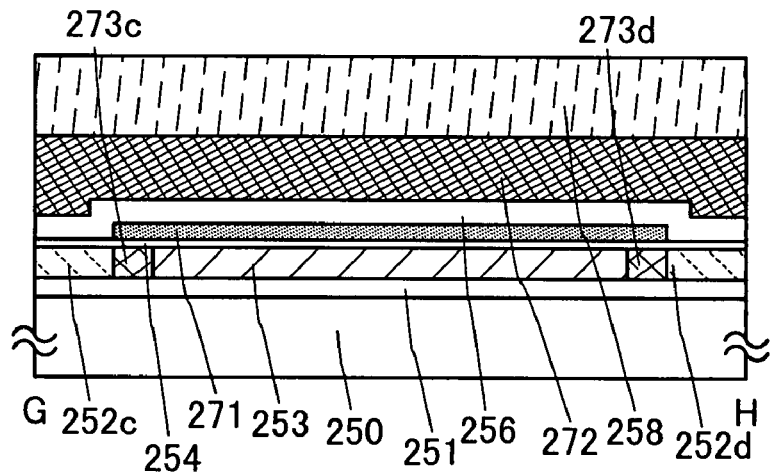

FIGS. 2A to 2C show an exemplary semiconductor device which is a nonvolatile semiconductor memory device in this embodiment mode. FIGS. 2A is a top view, FIG. 2B is a cross-sectional view taken along a line E-F of FIG. 2A, and FIG. 2C is a cross-sectional view taken along a line G-H of FIG. 2A.

Over a substrate 250 having an insulating layer 251 functioning as a base film of a semiconductor layer, a memory element 270 which is a nonvolatile memory element and an interlayer insulating layer 258 are formed. The memory element 270 includes an element region including high-concentration impurity regions 261a and 261b, low-concentration impurity regions 262a and 262b, and a channel formation region 253; a first insulating layer 254; a charge accumulating layer 271; a second insulating layer 256; a control gate electrode layer 272; and wiring layers 259a and 259b. Second element isolation regions 273a and 273b are formed in contact with the element region, and first element isolation regions 252a and 252b are provided adjacent to the outer sides of the second element isolation regions 273a and 273b respectively (see FIGS. 2A to 2C).

The high-concentration impurity regions 261a and 261b and the low-concentration impurity regions 262a and 262b contain an impurity element which imparts n-type conductivity (e.g., phosphorus (P) or arsenic (As)) as an impurity element which imparts one conductivity type. The high-concentration impurity regions 261a and 261b are regions functioning as a source and a drain of the memory element.

In the semiconductor layer, the element region including the high-concentration impurity regions 261a and 261b, the low-concentration impurity regions 262a and 262b, and the channel formation region 253 is electrically insulated from other memory elements by the surrounding second element isolation region 273 (273a to 273d) and first element isolation region 252 (252a to 252d).

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

FIGS. 2A to 2C show the case of forming a plurality of memory elements. Since the second element isolation regions 273 (273a to 273d) are provided in contact with the high-concentration n-type impurity regions 261a and 261b, the second element isolation regions 273 may be formed as p-type impurity regions by being doped with an impurity element which imparts p-type conductivity (e.g., boron (B), aluminum (Al), or gallium (Ga)) as the second impurity element which imparts a conductivity type opposite to that of the high-concentration n-type impurity regions 261a and 261b.

Referring to FIG. 2C, the control gate electrode layer 272 is formed over the channel formation region 253, the first element isolation regions 252c and 252d, and the second element isolation regions 273c and 273d which are included in the semiconductor layer, with the first insulating layer 254, the charge accumulating layer 271, and the second insulating layer 256 interposed therebetween. In the invention, the element isolation regions and the element regions are provided in one continuous semiconductor layer. Therefore, the first element isolation regions 252c and 252d, the second element isolation regions 273c and 273d, and the channel formation region 253 are contiguous. Thus, the surface of the regions is highly flat and has no steep steps.

Since the first insulating layer 254 is formed over the highly flat semiconductor layer, the coverage of the semiconductor layer is high, and shape defects of the film could hardly occur. Therefore, defects such as a leakage current and a short between the channel formation region 253 and the charge accumulating layer 271 formed over the first insulating layer 254 can be prevented. Thus, the semiconductor device of this embodiment mode which is a nonvolatile semiconductor memory device can be formed as a highly reliable semiconductor device where defects such as a short between a charge accumulating layer and a semiconductor layer and a leakage current, which would otherwise be caused due to a coverage defect of the semiconductor layer with the insulating layer 254, can be prevented.

Although FIGS. 2A to 2C show an example where the element region in the semiconductor layer is narrower than the charge accumulating layer 271 in the G-H line direction and wider than the control gate electrode layer 272 in the E-F line direction, the invention is not limited to this. FIGS. 26A to 26C and 3A to 3C show other combinations of sizes of the element region, the charge accumulating layer, and the control gate electrode layer. Note that components other than the charge accumulating layer and the control gate electrode layer in FIGS. 3A to 3C and FIGS. 26A to 26C are the same as those in FIGS. 2A to 2C. Therefore, they are denoted by the same reference numerals as those in FIGS. 2A to 2C, and their repetitive description is omitted.

Figure 26A:
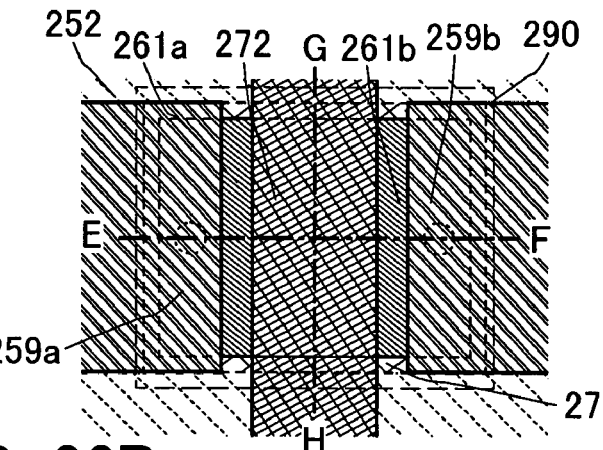
FIG. 26A is a top view of a semiconductor device of the invention.
Figure 26B:
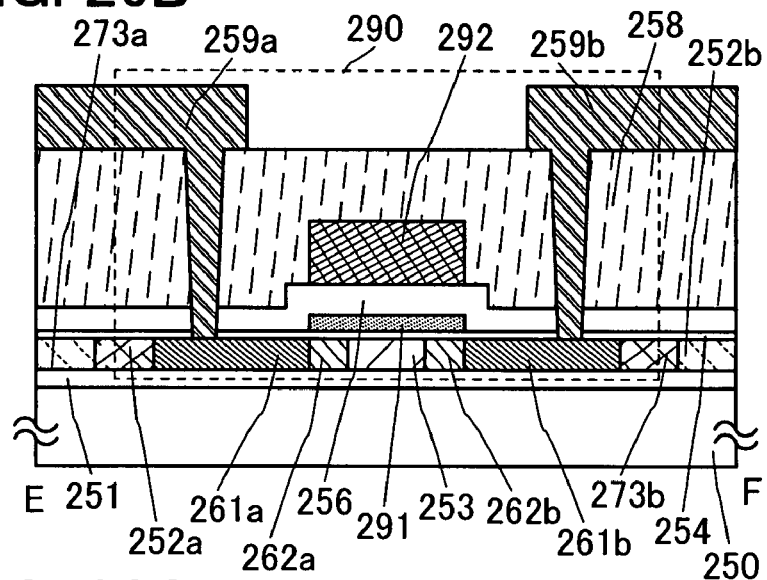
FIGS. 26B and 26C are cross-sectional views thereof.
Figure 26C:
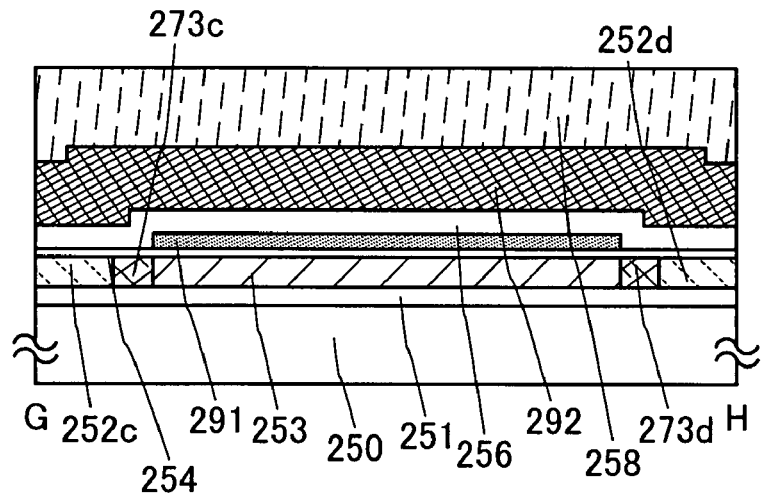

In a memory element 290 in FIGS. 26A to 26C, an element region in a semiconductor layer has substantially the same width as a charge accumulating layer 291 in the G-H line direction and is wider than a control gate electrode layer 292 in the E-F line direction. Therefore, in FIG. 26B, the ends of the charge accumulating layer 291 and the ends of the control gate electrode layer 292, which are overlapping with the second insulating layer 256 interposed therebetween, roughly correspond to each other. In FIG. 26C, the ends of the channel formation region 253 in the element region and the ends of the charge accumulating layer 291, which are overlapping with the first insulating layer 254 interposed therebetween, roughly correspond to each other.

Figure 3A:
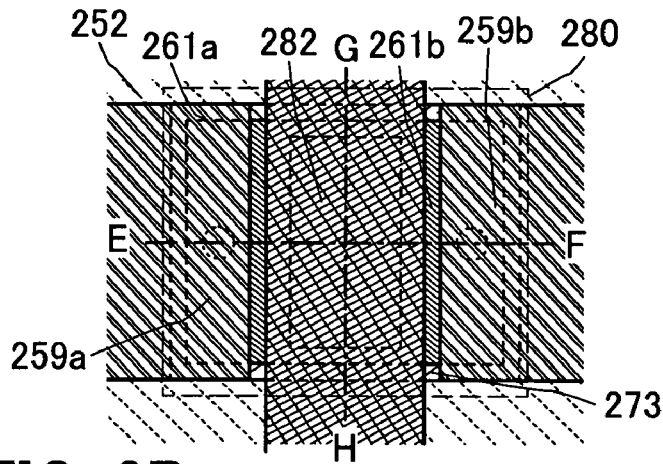
FIG. 3A is a top view of a semiconductor device of the invention.
Figure 3B:
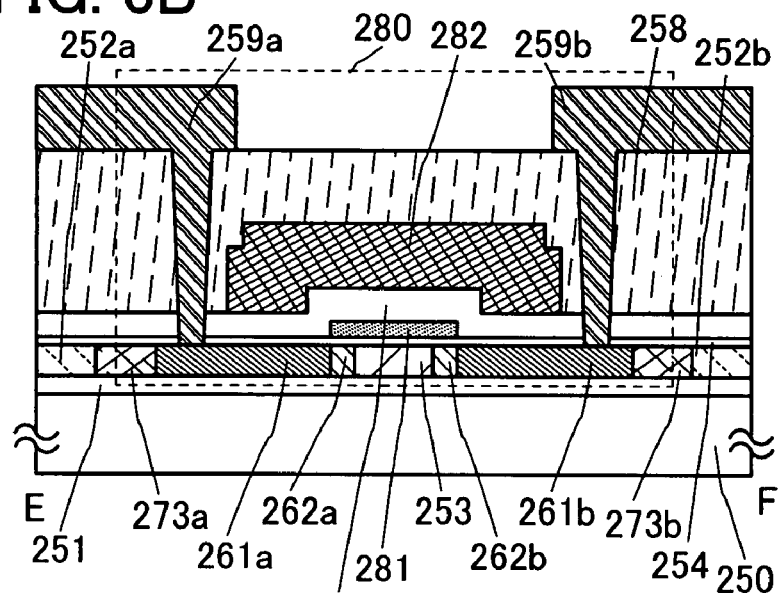
FIGS. 3B and 3C are cross-sectional views thereof.
Figure 3C:
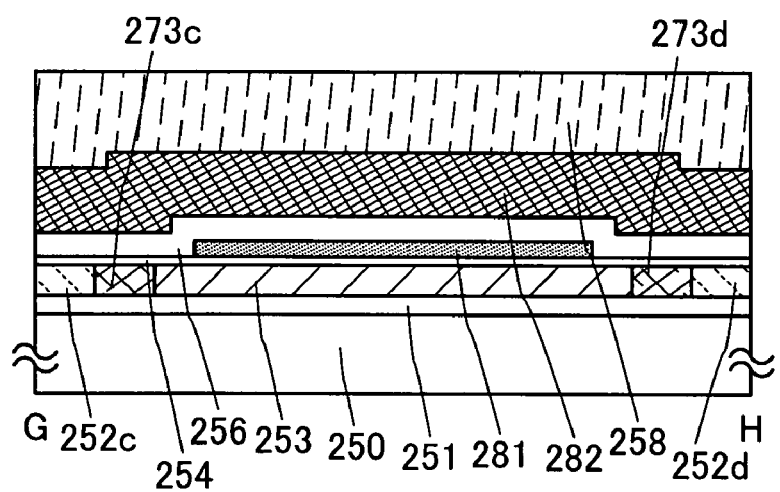

In a memory element 280 in FIGS. 3A to 3C, an element region in a semiconductor layer is wider than a charge accumulating layer 281 in the G-H line direction and is also wider than a control gate electrode layer 282 in the E-F line direction. Therefore, in FIG. 3B, the ends of the charge accumulating layer 281 which is provided below the second insulating layer 256 are positioned on the inner side than the ends of the control gate electrode layer 282. In FIG. 3C, the ends of the channel formation region 253 in the element region which is provided below the first insulating layer 254 are positioned on the outer side than the ends of the channel accumulating layer 281.

In this manner, by combining the element region, the charge accumulating layer, and the control gate electrode layer with various sizes, it becomes possible to control the capacitance formed by the charge accumulating layer, the second insulating layer 256 between and the control gate electrode layer and also control the capacitance formed by the charge accumulating layer, the first insulating layer 254, and the semiconductor layer. Therefore, a voltage value applied thereto can also be controlled.

For the interlayer insulating layer 258, silicon oxide, silicon nitride, silicon oxynitride, silicon nitride oxide, or the like can be used, and either a single-layer structure or a stacked structure of two or three layers can be employed. Note that in this specification, silicon oxynitride means a substance in which the composition ratio of oxygen is higher than that of nitrogen. Therefore, it can also be called silicon oxide containing nitrogen. Similarly, silicon nitride oxide means a substance in which the composition ratio of nitrogen is higher than that of oxygen. Therefore, it can also be called silicon nitride containing oxygen.

Alternatively, the interlayer insulating layer 258 can be formed using a material selected from among aluminum nitride, aluminum oxynitride in which the composition ratio of oxygen is higher than that of nitrogen, aluminum nitride oxide in which the composition ratio of nitrogen is higher than that of oxygen, aluminum oxide, diamond-like carbon (DLC), carbon containing nitrogen, polysilazane, or other substances containing inorganic insulating materials. It is also possible to use a material containing siloxane. Note that siloxane corresponds to a material having a Si—O—Si bond. Siloxane has a skeletal structure with the bond of silicon (Si) and oxygen (O). As a substituent of siloxane, an organic group containing at least hydrogen (e.g., an alkyl group or an aryl group) is used. Alternatively, a fluoro group may be used as the substituent. As a further alternative, both an organic group containing at least hydrogen and a fluoro group may be used as the substituent. Further, an oxazole resin such as photo-curing polybenzoxazole can also be used.

The interlayer insulating layer 258 can be formed by a sputtering method, a PVD (Physical Vapor Deposition) method, a CVD (Chemical Vapor Deposition) method such as low-pressure CVD (LPCVD) or plasma CVD, a droplet discharge method by which patterns can be formed selectively, a printing method by which patterns can be transferred or depicted (a method by which patterns are formed such as screen printing or offset printing), a coating method such as spin coating, a dipping method, a dispensing method, or the like.

An etching process for processing a film into a desired shape may be conducted by using either plasma etching (dry etching) or wet etching. Plasma etching is suitable for processing a large-area substrate. As an etching gas, a fluorine-source gas such as $CF_4$ or $NF_3$ or a chlorine-source gas such as $Cl_2$ or $BCl_3$ may be used, and an inert gas such as He or Ar may also be mixed into the etching gas as appropriate. Further, when an etching process is conducted by atmospheric discharge plasma, local discharge processing becomes possible; therefore, there is no need to form a mask layer over the entire surface of the substrate.

The semiconductor layer is preferably formed using a single-crystalline semiconductor or a polycrystalline semiconductor. For example, the semiconductor layer can be obtained by crystallizing a semiconductor layer which is formed over the entire surface of the substrate by a sputtering method, a plasma CVD method, or a low-pressure CVD method. The semiconductor material is preferably silicon, and a silicon germanium semiconductor can also be used. Crystallization of the semiconductor layer can be conducted by a laser crystallization method, a thermal crystallization method using rapid thermal annealing (RTA) or an annealing furnace, a crystallization method using a metal element which promotes the crystallization, or a method combining them.

The semiconductor layer may be doped with a p-type impurity. As a p-type impurity, boron is used for example, and it may be added so as to be contained in the semiconductor layer at a concentration of about $5\times10^{15}$ to $1\times10^{16}$ atoms/cm$^3$. This is in order to control the threshold voltage of the semiconductor element, and the impurity can effectively act by being added into the channel formation region 253.

The first insulating layer 254 may be formed using silicon oxide or a stacked structure of silicon oxide or silicon nitride. Although the first insulating layer 254 may be formed by depositing an insulating layer by a plasma CVD method or a low-pressure CVD, it is preferably formed by solid-phase oxidation or solid-phase nitridation by plasma treatment. This is because an insulating layer formed by oxidizing or nitriding a semiconductor layer (typically, a silicon layer) by plasma treatment has a dense film quality, high withstand voltage, and high reliability. Since the first insulating layer 254 is used as a tunnel insulating layer for injecting charges into the charge accumulating layers 271, 281, and 291, it is preferably strong like the one shown above. The first insulating layer 254 is preferably formed to a thickness of 1 to 20 nm, preferably 3 to 6 nm. For example, given that the gate length is 600 nm, the first insulating layer 254 can be formed to a thickness of 3 to 6 nm.

For the solid-phase oxidation treatment or solid-phase nitridation treatment by plasma treatment, it is preferable to use plasma which is excited by microwaves (typically, 2.45 GHz) and which has an electron density of $1\times10^{11}$ to $1\times10^{13}$ cm$^{-3}$, inclusive and an electron temperature of 0.5 to 1.5 eV, inclusive. This is in order to form a dense insulating layer as well as obtaining a practical reaction speed by the solid-phase oxidation treatment or solid-phase nitridation treatment at a temperature of 500° C. or less.

In the case of oxidizing the surface of the semiconductor layer by such plasma treatment, the plasma treatment is conducted under an oxygen atmosphere (e.g., an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). Meanwhile, in the case of conducting nitridation by plasma treatment, the plasma treatment is conducted under a nitrogen atmosphere (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a mixed gas of Ar and Kr can also be used. Note that the plasma treatment includes oxidation treatment, nitridation treatment, oxynitridation treatment, hydrogenation treatment, and surface modification treatment for a semiconductor layer, an insulating layer, or a conductive layer. When plasma is excited by the introduction of microwaves, plasma with a low electron temperature (3 eV or less, preferably 1.5 eV or less) and a high electron density ($1\times10^{11}$ cm$^{-3}$ or more) can be generated. With oxygen radicals (which may include OH radicals) and/or nitrogen radicals (which may include NH radicals) which are produced by the high-density plasma, the surface of the semiconductor layer can be oxidized or nitrided. When the plasma treatment gas is mixed with a rare gas such as argon, oxygen radicals or nitrogen radicals can be efficiently generated by excited species of the rare gas.

Referring again to FIGS. 2A to 2C, as a preferable example of the first insulating layer 254 formed by plasma treatment, the following steps are conducted: forming a silicon oxide layer with a thickness of 3 to 6 nm on the semiconductor layer by plasma treatment under an oxygen atmosphere, and forming a nitrogen-plasma-treated layer on the surface of the silicon oxide layer by plasma treatment under a nitrogen atmosphere. Specifically, the silicon oxide layer is formed to a thickness of 3 to 6 nm on the semiconductor layer by plasma treatment under an oxygen atmosphere. Subsequently, by conducting plasma treatment under a nitrogen atmosphere, the nitrogen-plasma-treated layer containing a high concentration of nitrogen is provided on the surface of the silicon oxide layer or in the vicinity of the surface. Note that the vicinity of the surface means a region from the surface of the silicon oxide layer to a depth of about 0.5 to 1.5 nm. For example, by conducting plasma treatment under a nitrogen atmosphere, a structure is obtained in which the silicon oxide layer contains 20 to 50 atomic % nitrogen in a region from the surface to a depth of about 1 nm.

By oxidizing the surface of a silicon layer which is a typical example of a semiconductor layer by plasma treatment, a dense oxide layer without a distorted interface can be formed. Further, by forming a nitride layer by further nitriding the surface of the oxide layer by plasma treatment so as to substitute nitrogen for oxygen of the outermost surface, an even denser film can be obtained. Accordingly, an insulating layer with high withstand voltage can be formed.

In any instances, by using the above-described solid-phase oxidation treatment or solid-phase nitridation treatment by the plasma treatment, an insulating layer which is substantially the same as a thermally oxidized film that is formed at a temperature of 950 to 1050° C. can be obtained even when a glass substrate with an allowable temperature limit of 700° C. or less is used. That is, a tunnel insulating layer which has high reliability as the tunnel insulating layer of the nonvolatile memory element can be formed.

Each of the charge accumulating layers 271, 281, and 291 is formed over the first insulating layer 254. Each of the charge accumulating layers 271, 281, and 291 may be provided as either a single layer or stacked layers of a plurality of layers.

Note that as a semiconductor material for forming the charge accumulating layers 271, 281, and 291, silicon, a silicon compound, germanium, or a germanium compound can typically be used. As a silicon compound, silicon nitride, silicon nitride oxide, silicon carbide, silicon germanium which contains 10 atomic % or more of germanium, metal nitride, metal oxide, or the like can be used. As a typical example of a germanium compound, silicon germanium can be given, in which case 10 atomic % or more of germanium is preferably contained with respect to silicon.

Although the charge accumulating layer functioning as the floating gate is applied to the nonvolatile semiconductor memory device in accordance with the invention for the purpose of accumulating charges, any other materials having similar functions can be used. For example, a ternary semiconductor containing germanium may be used, or the semiconductor material may be hydrogenated. Alternatively, as a material having a function of the charge accumulating layer of the nonvolatile memory element, oxide or nitride of the germanium or the germanium compound can be used.

Alternatively, the charge accumulating layers 271, 281, and 291 can be formed using metal nitride or metal oxide. As metal nitride, tantalum nitride, tungsten nitride, molybdenum nitride, titanium nitride, or the like can be used. As metal oxide, tantalum oxide, titanium oxide, tin oxide, or the like can be used.

It is also possible to form the charge accumulating layers 271, 281, and 291 to have a stacked structure of the above-described materials. When a layer made of the above-described silicon, silicon compound, metal nitride, or metal oxide is formed above a layer made of germanium or a germanium compound, the upper layer can be used as a barrier layer having a water-resistant property or a chemical-resistant property in the manufacturing process. Therefore, handling of the substrate in photolithography, etching, and washing processes becomes easier, and thus the productivity can be improved. That is, the processing of the charge accumulating layer can be facilitated.

The second insulating layer 256 is formed to have either a single layer or a plurality of layers by a low-pressure CVD method or a plasma CVD method, using silicon oxide, silicon oxynitride ($SiO_xN_y$, where x >y >0), silicon nitride ($SiN_x$), silicon nitride oxide ($SiN_xO_y$, where x>y>0), and/or the like. Alternatively, the second insulating layer 256 can be formed using aluminum oxide ($AlO_x$), hafnium oxide ($HfO_x$), or tantalum oxide ($TaO_x$). The second insulating layer 256 is formed to a thickness of 1 to 20 nm, preferably 5 to 10 nm. For example, the second insulating layer 256 can be formed by depositing a silicon nitride layer to a thickness of 3 nm and depositing a silicon oxide layer thereover to a thickness of 5 nm. Alternatively, the second insulating layer 256 can be formed by subjecting the surface of the charge accumulating layers 271, 281, and 291 to plasma nitridation treatment and thus forming a nitride film (e.g., silicon nitride in the case where silicon is used for the charge accumulating layers 271, 281, and 291). In either case, by using a nitride film for one or both of the first insulating layer 254 (the upper nitrogen-plasma-treated layer) and the second insulating layer 256 (the lower silicon nitride layer) which have a contact with the charge accumulating layers 271, 281, and 291, the charge accumulating layers 271, 281, and 291 can be prevented from being oxidized.

The control gate electrode layers 272, 282, and 292 are preferably formed from a metal selected from among tantalum (Ta), tungsten (W), titanium (Ti), molybdenum (Mo), chromium (Cr), niobium (Nb), and the like, or an alloy material or a compound material containing such a metal as a main component. Further, polysilicon doped with an impurity element such as phosphorus can also be used. In addition, the control gate electrode layers 272, 282, and 292 may be formed to have either a single layer or a plurality of layers, e.g., a stacked structure of a metal nitride layer and the above-described metal layer. As metal nitride, tungsten nitride, molybdenum nitride, or titanium nitride can be used. By providing the metal nitride layer, adhesion to the second insulating layer 256 can be improved, thereby the control gate electrode layers 272, 282, and 292 can be prevented from being peeled off the second insulating layer 256. When metal nitride such as tantalum nitride having a high work function is used for the control gate electrode layers 272, 282, and 292, the first insulating layer 254 can be formed to be thick by the synergistic effect with the second insulating layer 256.

The wiring layers 259a and 259b can be formed using a conductive material such as indium tin oxide (ITO), IZO (Indium Zinc Oxide) which is obtained by mixing indium oxide with zinc oxide (ZnO), or a mixture of indium oxide and silicon oxide ($SiO_2$); organic indium; organotin; indium oxide containing tungsten oxide; indium zinc oxide containing tungsten oxide; indium oxide containing titanium oxide; indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of the metal; or nitride of the metal.

As a method for injecting electrons into the charge accumulating layer, there is a method using thermoelectrons or a method using F-N tunnel current. In the case of utilizing thermoelectrons, a positive voltage is applied to the control gate electrode layer and a high voltage is applied to the drain so that thermoelectrons are generated. Therefore, thermoelectrons can be injected into the charge accumulating layer. In the case of utilizing F-N tunnel current, a positive voltage is applied to the control gate electrode layer so that electrons are injected from the semiconductor layer into the charge accumulating layer by F-N tunnel current.

As examples of a semiconductor device using the invention, various modes of nonvolatile semiconductor memory devices having nonvolatile memory elements can be given. FIG. 12 shows an exemplary equivalent circuit of a nonvolatile memory cell array. A memory cell MS01 which stores data of 1 bit includes a selection transistor S01 and a nonvolatile memory element M01. The selection transistor S01 is connected in series between a bit line BL0 and the nonvolatile memory element M01, and a gate of the selection transistor S01 is connected to a word line WL1. A gate of the nonvolatile memory element M01 is connected to a word line WL11. When writing data into the nonvolatile memory element M01, the word line WL1 and the bit line BL0 are set at H level, a bit line BL1 is set at L level, and a high voltage is applied to the word line WL11, so that charges are accumulated in the charge accumulating layer as described above. When deleting data, the word line WL1 and the bit line BL0 may be set at H level, and a high voltage of negative polarity may be applied to the word line WL11.

In this memory cell MS01, when the selection transistor S01 and the nonvolatile memory element M10 are formed using element regions 30 and 32 respectively which are formed by isolating a semiconductor layer formed continuously over an insulating surface by providing element isolation regions doped with an impurity element, it is possible to prevent mutual interference with other selection transistors or nonvolatile memory elements. In addition, since both of the selection transistor S10 and the nonvolatile memory element M10 included in the memory cell MS01 are n-channel transistors, when the two elements are formed using one element region, a wiring for connecting the two elements can be omitted.

Figure 13:
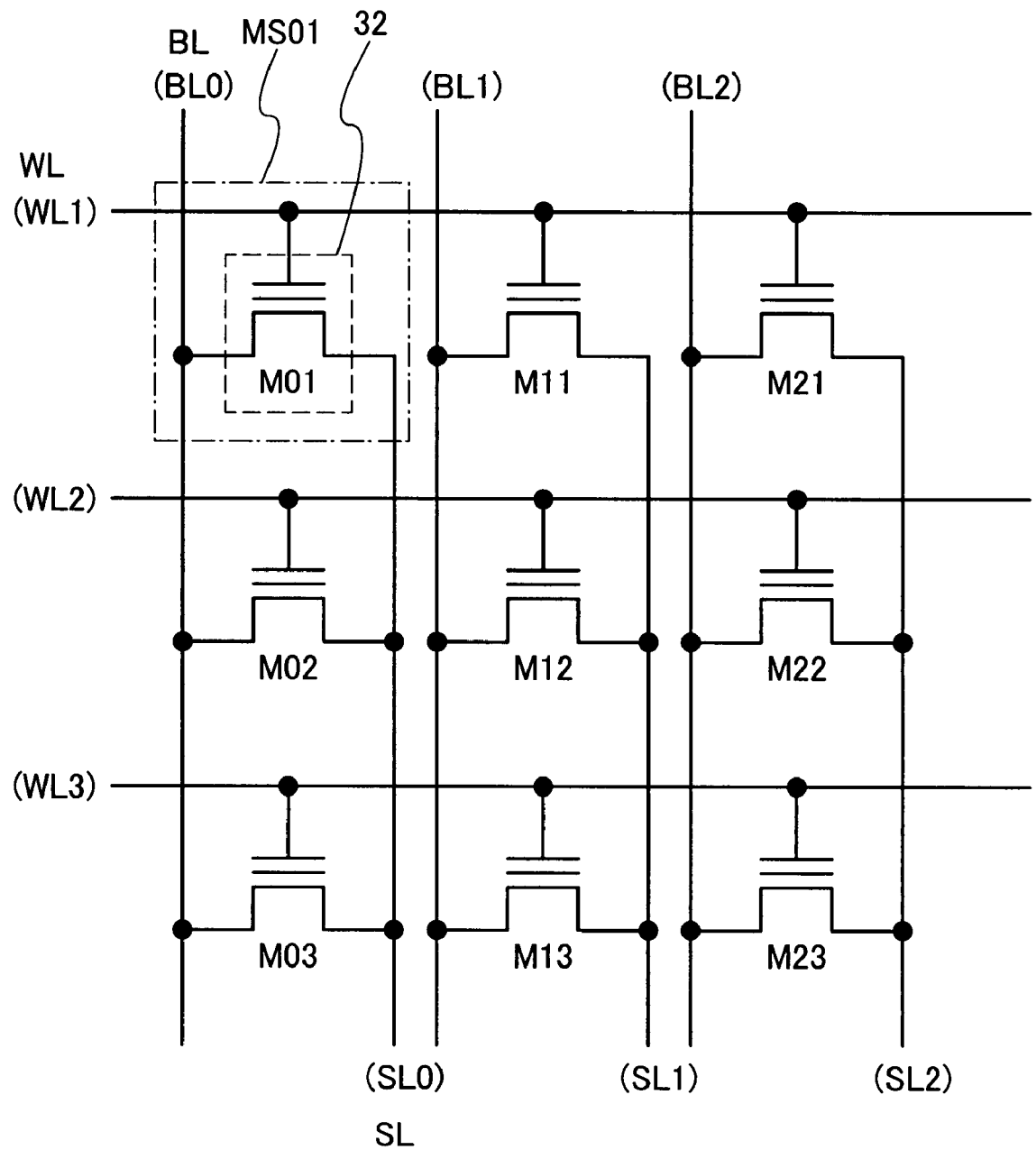
FIG. 13 shows an exemplary equivalent circuit of a semiconductor device.

FIG. 13 shows an equivalent circuit of a NOR-type memory cell array in which nonvolatile memory elements are connected to a bit line. In this memory cell array, word lines WL and bit lines BL are disposed to intersect each other, and a nonvolatile memory clement is disposed at each intersection portion. In the NOR-type memory cell array, drains of the individual nonvolatile memory elements are connected to the bit line BL, and sources of the nonvolatile memory elements are commonly connected to the source line SL.

In this case also, when the nonvolatile memory element M01 in the memory cell MS01 is formed using an element region 32 which is formed by isolating a semiconductor layer formed continuously over an insulating surface by providing element isolation regions doped with an impurity element, it is possible to prevent mutual interference with other nonvolatile memory elements without separating the semiconductor layer into a plurality of island-shape semiconductor layers. Further, when a plurality of nonvolatile memory elements (e.g., M01 to M23 shown in FIG. 13) is regarded as one block, and the nonvolatile memory elements in one block are formed using element regions which are formed by isolating a semiconductor layer formed continuously over an insulating surface by providing element isolation regions doped with an impurity element, a deletion operation can be conduced per block.

The operation of the NOR-type memory cell array is as follows. In data writing, the source line SL is set at 0 V, a high voltage is applied to the word line WL which is selected to write data, and a potential corresponding to the data of "0" or "1" is applied to the bit line BL. For example, an H-level potential corresponding to "0" or an L-level potential corresponding to "1" is applied to the bit line BL. In the nonvolatile memory element which has received an H-level potential to be written the data of "0", hot electrons are generated in the vicinity of the drain and then injected into the charge accumulating layer. In writing the data of "1", such electron injection does not occur.

In the memory cell which has received the data of "0", hot electrons, which are generated in the vicinity of the drain due to a strong transverse electric field between the drain and the source, are injected into the charge accumulating layer. The consequent state in which the threshold voltage is increased with the electrons injected into the charge accumulating layer corresponds to "0". When writing the data of "1", hot electrons are not generated and a state that the threshold voltage remains low without electrons injected into the charge accumulating layer, i.e., a deleted state is retained.

When deleting data, a positive voltage of about 10 V is applied to the source line SL, and the bit line BL is set in a floating state. Then, by applying a high voltage of negative polarity to the word line WL (applying a high voltage of negative polarity to the control gate), electrons are extracted from the charge accumulating layer. Accordingly, a deleted state with the data of "1" results.

The data reading is conducted through the steps of: setting the source line SL at 0 V, setting the bit line BL at about 0.8 V, applying a reading voltage which is set at an intermediate value between the threshold voltages of the data "0" and "1" to the selected world line WL, and judging the presence of a current drawn into the nonvolatile memory element, using a sense amplifier which is connected to the bit line BL.

Figure 14:
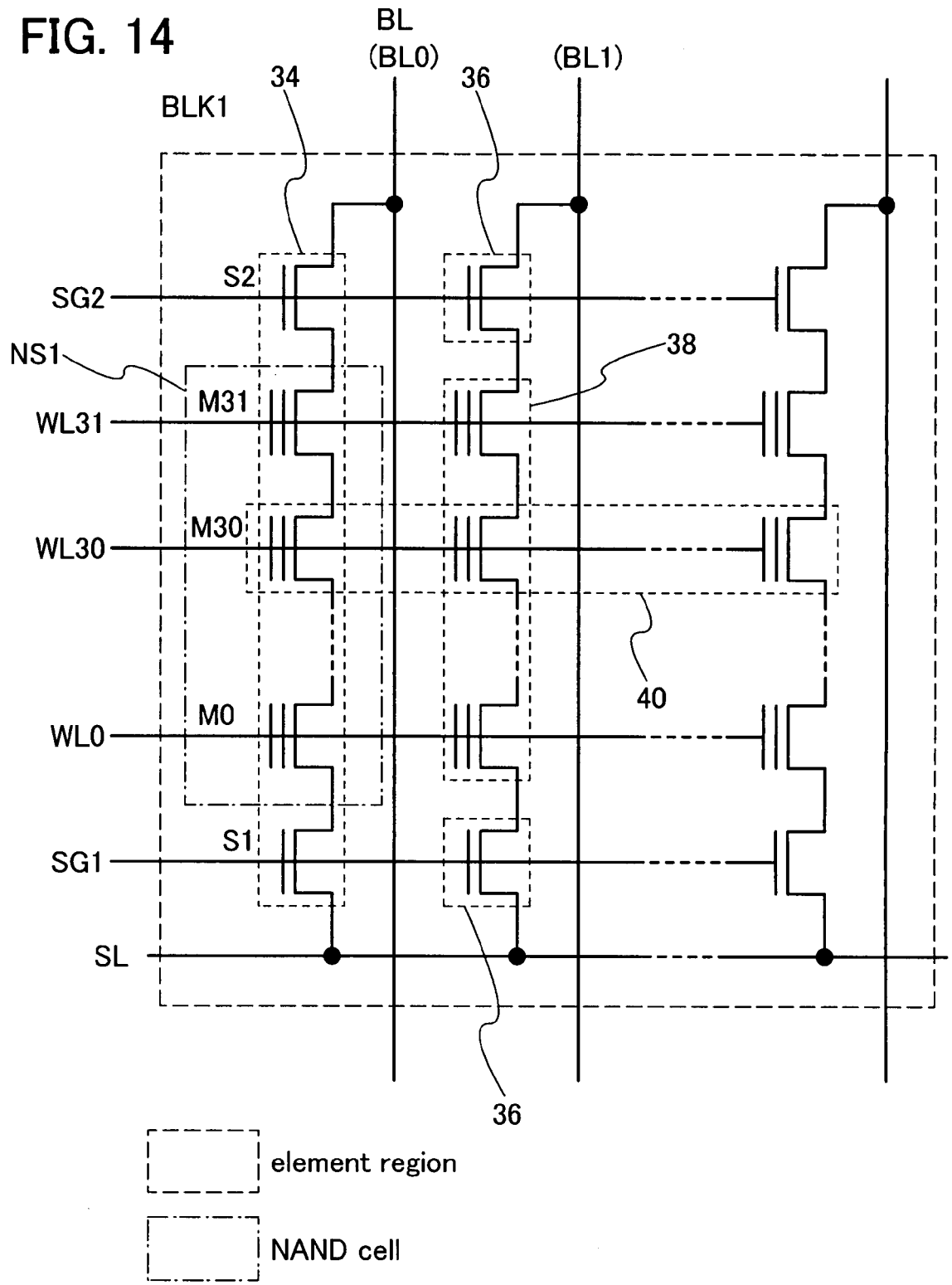
FIG. 14 shows an exemplary equivalent circuit of a semiconductor device.

FIG. 14 shows an equivalent circuit of a NAND-type memory cell array. A bit line BL is connected to a NAND-type cell NS1 which has a plurality of nonvolatile memory elements connected in series. A plurality of NAND-type cells forms one block BLK. A block BLK1 shown in FIG. 14 has 32 word lines (word lines WL0 to WL31). Nonvolatile memory elements positioned in the same row as the block BLK1 are commonly connected to the word lines of the corresponding row.

In this case, since selection transistors S1 and S2 and nonvolatile memory elements M0 to M31 are connected in series, these elements may be formed together by using one semiconductor layer 34. Accordingly, a wiring for connecting the nonvolatile memory elements can be omitted, and the degree of integration can be increased. Further, isolation of the adjacent NAND-type cells can be conducted easily. It is also possible to separately form a semiconductor layer 36 of the selection transistors S1 and S2 and a semiconductor layer 38 of the NAND-type cell. When conducting a deletion operation by which charges are extracted from the charge accumulating layers of the nonvolatile memory elements M0 to M31, the deletion operation can be conducted per NAND-type cell. In addition, it is also possible to form the nonvolatile memory elements which are commonly connected to one word line (e.g., in the row of M30) by using one semiconductor layer 40.

The writing operation is conducted after setting the NAND-type cell NS1 to a deleted state, i.e., the state in which the threshold voltage of each nonvolatile memory element in the NAND-type cell NS1 is set at a negative value. Writing is conducted sequentially starting from the nonvolatile memory element M0 on the source line SL side. Data writing into the nonvolatile memory element M0 is exemplarily described below.

Figure 24A:
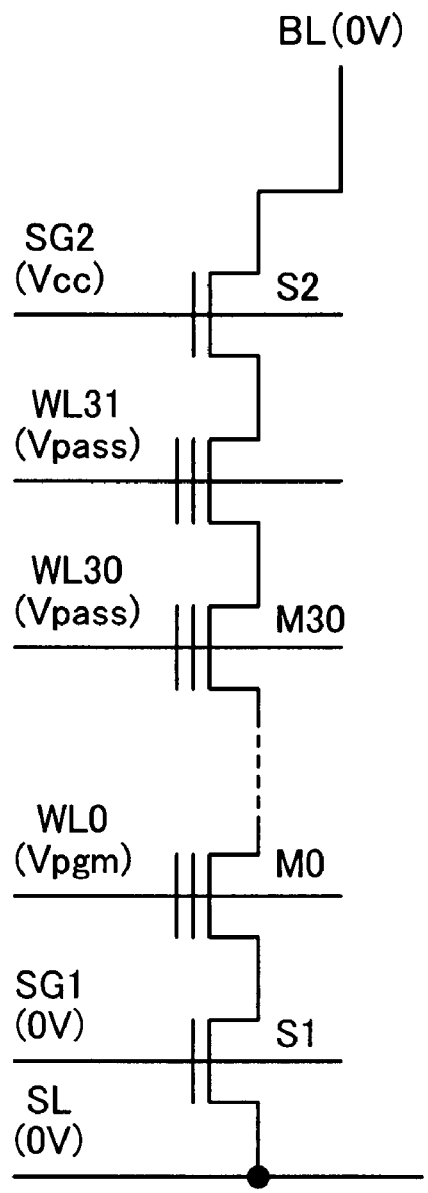
FIGS. 24A and 24B illustrate a writing operation of a semiconductor device.

FIG. 24A shows the case of writing "0". The selection transistor S2 is turned on by applying, for example, Vcc (the power supply voltage) to a selection gate line SG2, and the bit line BL is set at 0 V (the ground voltage). The selection transistor S1 is turned off by setting a selection gate line SG1 at 0 V. Next, a word line WL0 connected to the nonvolatile memory element M0 is set at a high voltage of Vpgm (about 20 V), and the other word lines are set at an intermediate voltage of Vpass (about 10 V). Since the voltage of the bit line BL is 0 V, the potential of the channel formation region of the selected nonvolatile memory element M0 is also 0 V. Thus, there is a big potential difference between the word line WL0 and the channel formation region of the nonvolatile memory element M0, and therefore, electrons are injected into the charge accumulating layer of the nonvolatile memory element M0 due to F-N tunnel current as described above. Accordingly, the threshold voltage of the nonvolatile memory element M0 has a positive value (the state in which "0" is written).

Figure 24B:
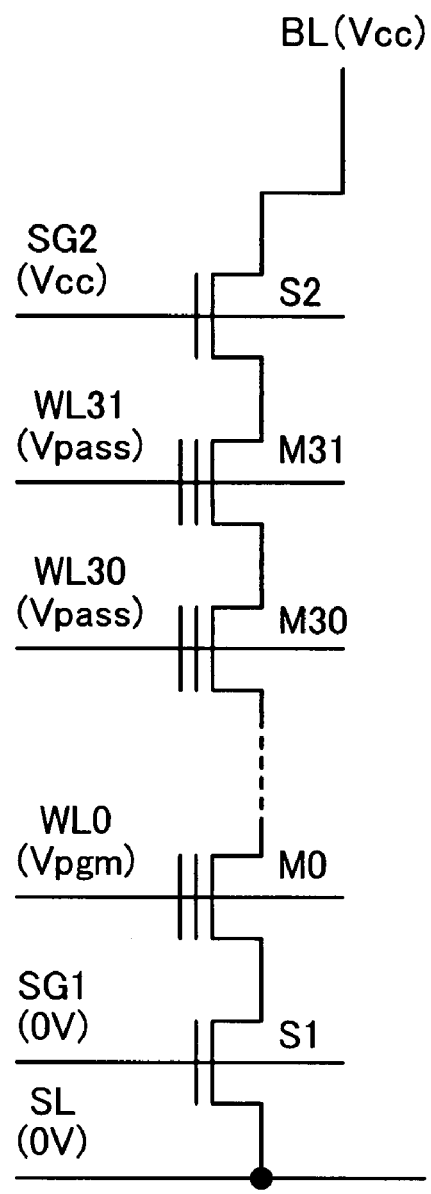

On the other hand, in the case of writing "1", the bit line BL is set at, for example, Vcc (the power supply voltage) as shown in FIG. 24B. Since the selection gate line SG2 has a voltage of Vcc, the selection transistor S2 is turned off when the gate voltage thereof is at Vth (the threshold voltage of the selection transistor S2)>Vcc. Therefore, the channel formation region of the nonvolatile memory element M0 is brought into a floating state. Next, when a high voltage of Vpgm (20 V) is applied to the word line WL0 and an intermediate voltage of Vpass (10 V) is applied to the other word lines, the voltage of the channel formation region of the nonvolatile memory element M0 increases from Vcc-Vth to, for example, about 8 V by the capacitive coupling of each word line and the channel formation region. Although the voltage of the channel formation region is increased, there is a small potential difference between the word line WL0 and the channel formation region of the nonvolatile memory element M0 unlike the case of writing "0". Therefore, electron injection into the charge accumulating layer of the nonvolatile memory element M0 due to F-N tunnel current does not occur. Thus, the threshold voltage of the nonvolatile memory element M01 is kept at a negative value (the state in which "1" is written).

Figure 25A:
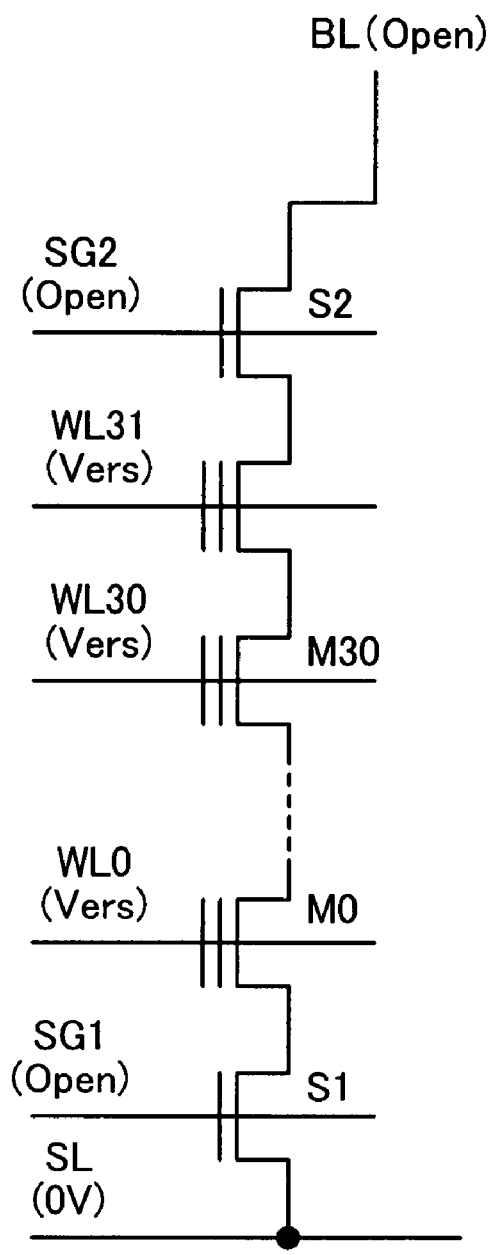
FIGS. 25A and 25B illustrate a deletion operation and a reading operation of a semiconductor device.

In the case of conducting a deletion operation, as shown in FIG. 25A, a high voltage of negative polarity (Vers) is applied to a selected word line (WL0), a voltage Von (for example, 3 V) is applied to the word lines WL of the non-selected nonvolatile memory elements, the selection gate line SG1, and the selection gate line SG2, and an open-voltage Vopen (0V) is applied to the bit line BL and the source line SL. Then, electrons in the charge accumulating layer of the selected nonvolatile memory element can be released as described in the above embodiment mode. As a result, the threshold voltage of the selected nonvolatile memory element shifts in the negative direction.

Figure 25B:
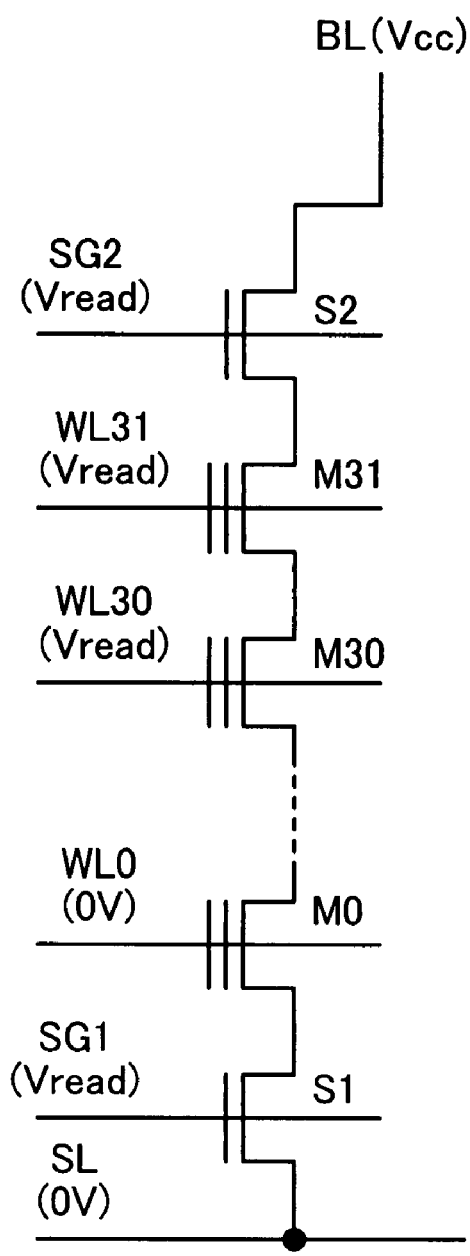

In the reading operation shown in FIG. 25B, the word line WL0 connected to the nonvolatile memory element M0 which is selected to read out data is set at a voltage of Vr (e.g., 0 V), while the word lines WL1 to WL31 connected to the non-selected nonvolatile memory elements and the selection gate lines SG1 and SG2 are set at an intermediate voltage of Vread which is a little higher than the power supply voltage. That is, as shown in FIG. 13, the nonvolatile memory elements other than the selected nonvolatile memory element function as transfer transistors. Accordingly, it is detected whether a current is flowing into the nonvolatile memory element M0 which is selected to read out data. That is, when data stored in the nonvolatile memory element M0 is "0", the nonvolatile memory element M0 is off; therefore, the bit line BL is not discharged. On the other hand, when data stored in the nonvolatile memory element M0 is "1", the nonvolatile memory element M0 is on; therefore, the bit line BL is discharged.

FIG. 19 shows an example of a circuit block diagram of a nonvolatile semiconductor memory device. In the nonvolatile semiconductor memory device, a memory cell array 52 and a peripheral circuit 54 are formed over the same substrate. The memory cell array 52 has the configuration shown in FIG. 12, 13, or 14. The peripheral circuit 54 has the following configuration.

A row decoder 62 for selecting word lines and a column decoder 64 for selecting bit lines are provided around the memory cell array 52. An address is transmitted to a control circuit 58 through an address buffer 56, and an internal row address signal and an internal column address signal are transmitted to the row decoder 62 and the column decoder 64 respectively.

In order to write or delete data, a potential obtained by boosting the power supply potential is used. Therefore, a booster circuit 60 which is controlled by the control circuit 58 according to the operation mode is provided. The output of the booster circuit 60 is supplied to word lines WL and bit lines BL through the row decoder 62 and the column decoder 64 respectively. Data output from the column decoder 64 is input to a sense amplifier 66. Data read out by the sense amplifier 66 is held in a data buffer 68, and the data is randomly accessed by the control of the control circuit 58. Then, the accessed data is output through a data input/output buffer 70. Meanwhile, data to be written is, after being input through the data input/output buffer 70, once held in the data buffer 68, and then transferred to the column decoder 64 by the control of the control circuit 58.

In this manner, in the nonvolatile semiconductor memory device, the memory cell array 52 is required to use a potential which is different from the power supply potential. Therefore, it is desirable that at least the memory cell array 52 and the peripheral circuit 54 be electrically insulated from each other.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a semiconductor device which is a highly reliable nonvolatile semiconductor memory device and a method for manufacturing the semiconductor device can be provided, where defects such as a short between a charge accumulating layer, a control gate electrode layer, and a semiconductor layer and a leakage current, which would otherwise be caused due to a coverage defect of the semiconductor layer with an insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

Embodiment Mode 3

Figure 15:
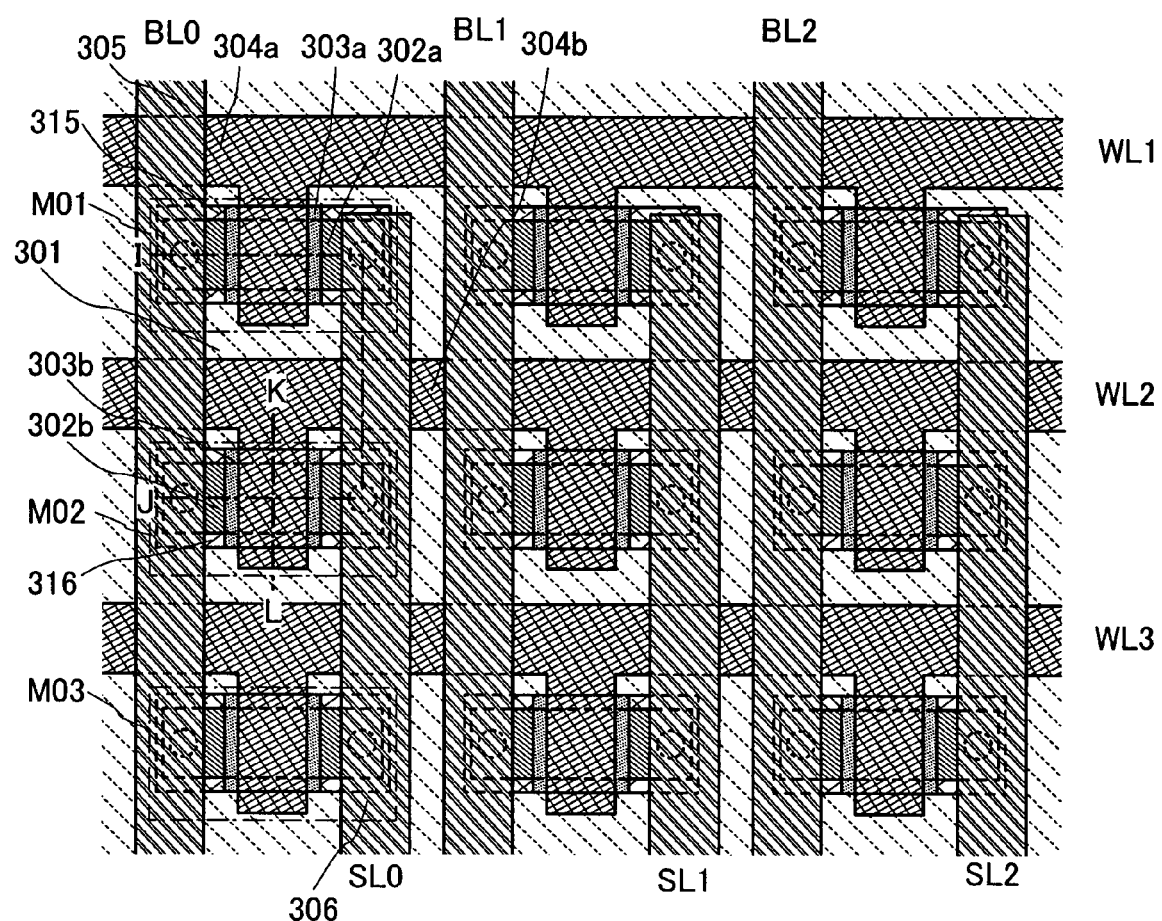
FIG. 15 is a top view of a semiconductor device of the invention.
Figure 16A:
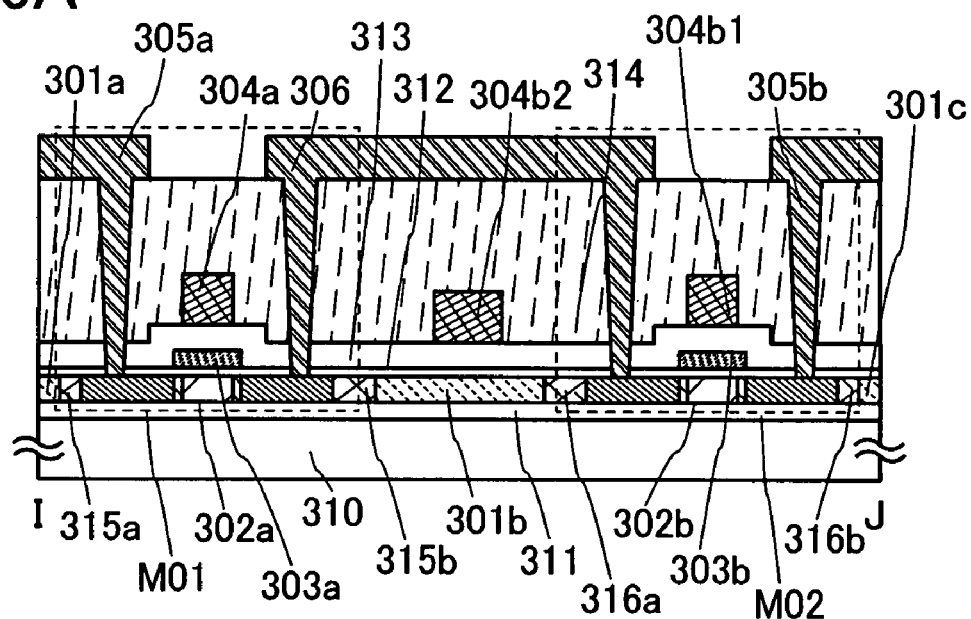
FIGS. 16A and 16B are cross-sectional views of a semiconductor device of the invention.
Figure 16B:
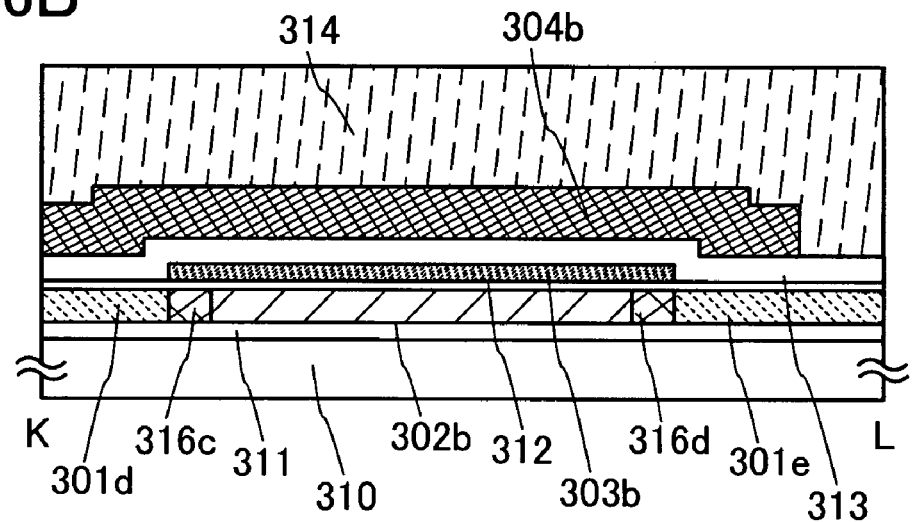

This embodiment mode will describe an example of a highly reliable semiconductor device having memory elements where defects such as a short between a gate electrode layer and a semiconductor layer and a leakage current, which would otherwise be caused due to a coverage defect of the semiconductor layer with an insulating layer, can be prevented, with reference to the drawings. FIG. 15 shows a top view of a semiconductor device in this embodiment mode. FIG. 16A shows a cross-sectional view taken along a line I-J of FIG. 15, and FIG. 16B shows a cross-sectional view taken along a line K-L of FIG. 15.

FIG. 15 shows an equivalent circuit of a NOR-type memory cell array having nonvolatile memory elements M (M01 to M03) which are connected to bit lines BL (BL0 to BL2). In this memory cell array, word lines WL (WL1 to WL3) and the bit lines BL (BL0 to BL2) are disposed to intersect each other, and a nonvolatile memory element (M01 to M03) is disposed at each intersection portion. In the NOR-type memory cell array, drains of the individual nonvolatile memory elements (M01 to M03) are connected to the bit lines BL (BL0 to BL2), and sources of the nonvolatile memory elements are commonly connected to source lines SL (SL0 to SL2).

In FIG. 15, the drains of the memory elements M01 to M03 are connected to a bit line BL305 (305a and 305b), and the sources of the memory elements M01 to M03 are connected to a source line 306. The memory element M01 includes an element region 302a, a charge accumulating layer 303a, and a control electrode layer 304a. The memory element M02 includes an element region 302b, a charge accumulating layer 303b, and a control gate electrode layer 304b. A first insulating layer 312, a second insulating layer 313, and an interlayer insulating layer 314 are formed continuously in the memory elements M01 and M02. Note that each of the element region 302a and the element region 302b includes a channel formation region, high-concentration n-type impurity regions functioning as a source and a drain, and low-concentration impurity regions.

In the semiconductor layer, the element region 302a which forms the memory element M01 is electrically insulated from the element region 302b which forms the memory element M02 by first element isolation region 301 (301a to 301e), and second element isolation regions 315 (315a and 315b) and 316 (316a to 316d).

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the element region 302a and the element region 302b have the same conductivity type, e.g., n-type impurity regions, the second element isolation regions of both the element regions are p-type impurity regions having a conductivity type opposite to that of the element regions. On the other hand, when the element region 302a and the element region 302b have opposite conductivity types such that the source and drain regions of the element region 302a are n-type impurity regions while the source and drain regions of the element region 302b are p-type impurity regions, the second element isolation regions of the two element regions have opposite conductivity types correspondingly, such that the second element isolation region of the element region 302a is a p-type impurity region while the second element isolation region of the element region 302b is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

FIGS. 15, 16A, and 16B show the case of forming a plurality of memory elements. Since the second element isolation regions 315 (315a and 315b) and 316 (316a to 316d) are provided in contact with the element regions 302a and 302b including the n-type impurity regions, the second element isolation regions 315 and 316 may be formed as p-type impurity regions by being doped with an impurity element which imparts p-type conductivity (e.g., boron (B), aluminum (Al), or gallium (Ga)) as the second impurity element which imparts a conductivity type opposite to that of the element regions 302a and 302b. As a result, the n-type impurity regions and the p-type impurity regions can be alternately and adjacently provided, and thus the impurity regions having the same conductivity type can be insulated from each other.

Referring to FIG. 16B, the charge accumulating layer 303b is formed over the element region 302b and the second element isolation regions 316c and 316d which are included in the semiconductor layer, with the first insulating layer 312 interposed therebetween. In the invention, the element isolation regions and the element regions are provided in one continuous semiconductor layer. Therefore, the first element isolation regions 301d and 301e, the second element isolation regions 316c and 316d, and the element region 302b are contiguous. Thus, the surface of the regions is highly flat and has no steep steps.

Since the first insulating layer 312 is formed over the highly flat semiconductor layer, the coverage of the semiconductor layer is high and shape defects of the film could hardly occur. Therefore, defects such as a leakage current and a short between the element regions 302a and 302b and the charge accumulating layers 303a and 303b which are formed over the first insulating layer 312 can be prevented. Thus, the semiconductor device of this embodiment mode which is a nonvolatile semiconductor memory device can be formed as a highly reliable semiconductor device where defects such as a short between a charge accumulating layer and a semiconductor layer and a leakage current, which would otherwise be caused due to a coverage defect of the semiconductor layer with a first insulating layer, can be prevented.

This embodiment mode can be freely implemented in combination with any of the other embodiment modes in this specification.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer, a control gate electrode layer, gate electrode layer, and a semiconductor layer and a leakage current, which would otherwise be caused due to a coverage defect of the semiconductor layer with an insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

Embodiment Mode 4

Figure 17:
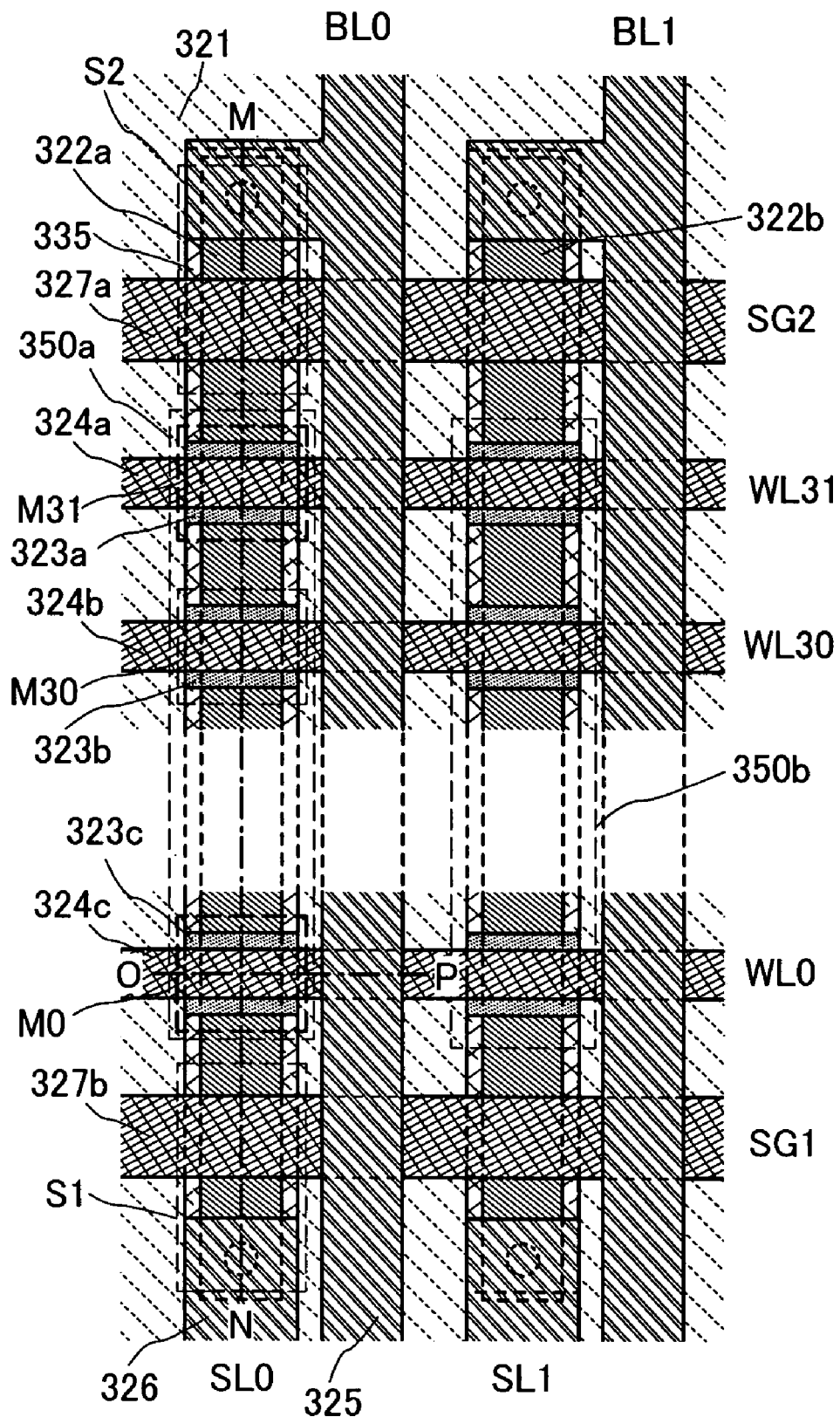
FIG. 17 is a top view of a semiconductor device of the invention.
Figure 18A:
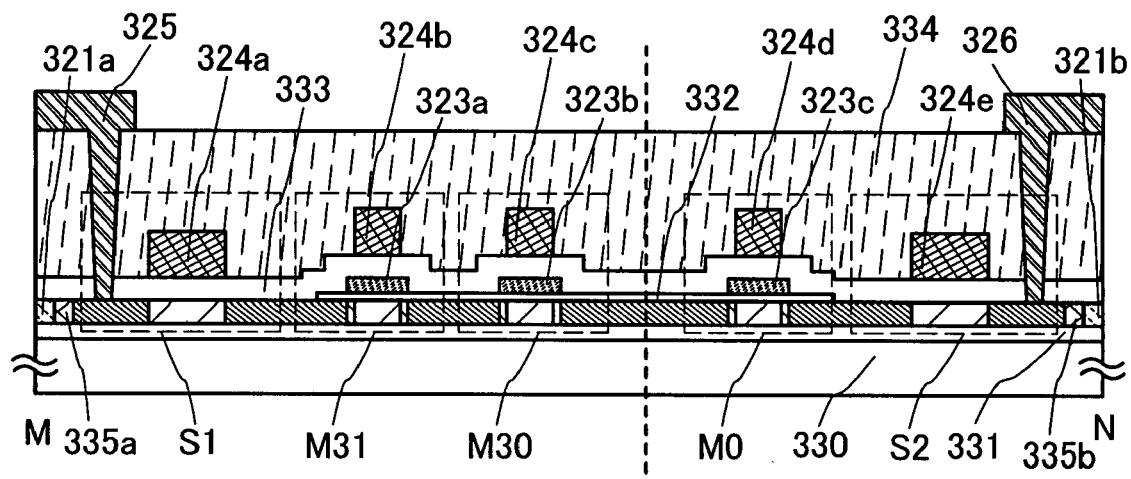
FIGS. 18A and 18B are cross-sectional views of a semiconductor device of the invention.
Figure 18B:
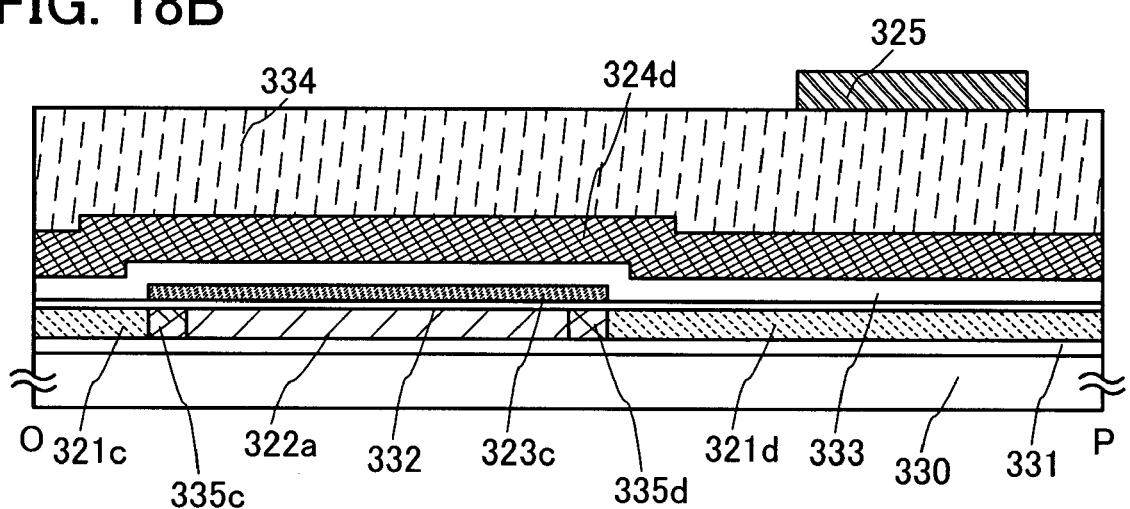

This embodiment mode will describe an example of a highly reliable semiconductor device having memory elements where defects-such as a short between a gate electrode layer and a semiconductor layer and a leakage current, which would otherwise be caused due to a coverage defect of the semiconductor layer with an insulating layer, can be prevented, with reference to the drawings. FIG. 17 shows a top view of a semiconductor device in this embodiment mode. FIG. 18A shows a cross-sectional view taken along a line M-N of FIG. 17, and FIG. 18B shows a cross-sectional view taken along a line O-P of FIG. 17.

In this embodiment, a case where a plurality of memory elements is provided in one element region in the structure shown in Embodiment Mode 2 is described with reference to the drawings. Note that description of the portions common to both embodiment modes will be omitted.

In the semiconductor device shown in this embodiment mode, element regions 322a and 322b are provided in semiconductor layers which are electrically connected to bit lines BL0 and BL1 respectively. A plurality of nonvolatile memory elements is provided in each of the element regions 322a and 322b (see FIGS. 17, 18A and 18B). Specifically, in the element region 322a, a NAND-type cell 350a including a plurality of nonvolatile memory elements M0 to M30 and M31 is provided between selection transistors S1 and S2. Similarly, in the element region 322b, a NAND-type cell 350b including a plurality of nonvolatile memory elements is provided between selection transistors. By providing first element isolation regions 321 (321a to 321d) and second element isolation regions 355 (335a to 335d) between the element regions 322a and 322b, the NAND-type cell 350a and the NAND-type cell 350b which are close to each other can be insulated.

When a plurality of nonvolatile memory elements is provided in one element region, the nonvolatile memory elements can be integrated to a higher degree, and thus a high-capacity nonvolatile semiconductor memory device can be formed.

In FIGS. 17, 18A, and 18B, the selection transistors S1 and S2 and the memory elements M0, M30, and M31 are provided over a substrate 330 having an insulating layer 331 on its surface. Specifically, gate electrode layers (SG2 and SG1) 327a and 327b, charge accumulating layers 323a to 323c, control gate electrode layers (WL31, WL30, and WL0) 324a to 324c, a first insulating layer 332, a second insulating layer 333, and an interlayer insulating layer 334 are provided over the substrate 330. The selection transistor S1 is connected to the bit line BL0 and the selection transistor S2 is connected to a source line (SL0) 326.

In the semiconductor layer, the element region 322a which forms the NAND-type cell 350a is electrically insulated from the element region 322b which forms the NAND-type cell 350b by the first element isolation region 321 (321a to 321d) and the second element isolation region 335 (335a to 335d).

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, the element region 322a and the second element region 322b are positioned close to each other by interposing the second element isolation region having a contact with the element region 322a, the first element isolation region, and the second element isolation region having a contact with the element region 322b between the element regions.

When the source regions and the drain regions of the element region 322a and the element region 322b have the same conductivity type, e.g., n-type impurity regions, the second element isolation regions of both the element regions are p-type impurity regions having a conductivity type opposite to that of the element regions. On the other hand, when the element region 322a and the element region 322b have opposite conductivity types such that the source and drain regions of the element region 322a are n-type impurity regions while the source and drain regions of the element region 322b are p-type impurity regions, the second element isolation regions of the two element regions have opposite conductivity types correspondingly, such that the second element isolation region of the element region 322a is a p-type impurity region while the second element isolation region of the element region 322b is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

FIGS. 17, 18A, and 18B show the case of forming a plurality of memory elements. Since the second element isolation region 335 (335a to 335d) are provided in contact with the element regions 322a and 332b including the n-type impurity regions, the second element isolation region 335 may be formed as p-type impurity regions by being doped with an impurity element which imparts p-type conductivity (e.g., boron (B), aluminum (Al), or gallium (Ga)) as the second impurity element which imparts a conductivity type opposite to that of the element regions 322a and 332b. As a result, the n-type impurity regions and the p-type impurity regions can be alternately and adjacently provided, and thus the impurity regions having the same conductivity type can be insulated from each other.

Referring to FIG. 18B, the charge accumulating layer 323c is formed over the element region 322a and the second element isolation regions 335c and 335d which are included in the semiconductor layer, with the first insulating layer 332 interposed therebetween. In the invention, the element isolation regions and the element regions are provided in one continuous semiconductor layer. Therefore, the first element isolation regions 321c and 321d, the second element isolation regions 335c and 335d, and the element region 322a are contiguous. Thus, the surface of the regions is highly flat and has no steep steps.

Since the first insulating layer 332 is formed over the highly flat semiconductor layer, the coverage of the semiconductor layer is high and shape defects of the film could hardly occur. Therefore, defects such as a leakage current and a short between the element region 322a and the charge accumulating layers 323a to 323c which are formed over the first insulating layer 332 can be prevented. Thus, the semiconductor device of this embodiment mode which is a nonvolatile semiconductor memory device can be formed as a highly reliable semiconductor device where defects such as a short between a charge accumulating layer and a semiconductor layer and a leakage current, which would otherwise be caused due to a coverage defect of the semiconductor layer with a first insulating layer, can be prevented.

This embodiment mode can be freely implemented in combination with any of the other embodiment modes in this specification.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer, a control gate electrode layer, gate electrode layer, and a semiconductor layer and a leakage current, which would otherwise be caused due to a coverage defect of the semiconductor layer with an insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

Embodiment Mode 5

This embodiment mode will describe a nonvolatile semiconductor memory device as an example of a semiconductor device which employs the invention. In the invention, a plurality of semiconductor elements is formed in one semiconductor layer without separating the semiconductor layer into island shapes. The invention can be applied to either a part or all of the semiconductor elements which are provided in the semiconductor device. The invention may be applied as appropriate according to the functions required of the semiconductor elements. An example of such a semiconductor device which employs the invention is described with reference to FIGS. 20A to 20D.

Figure 20A:
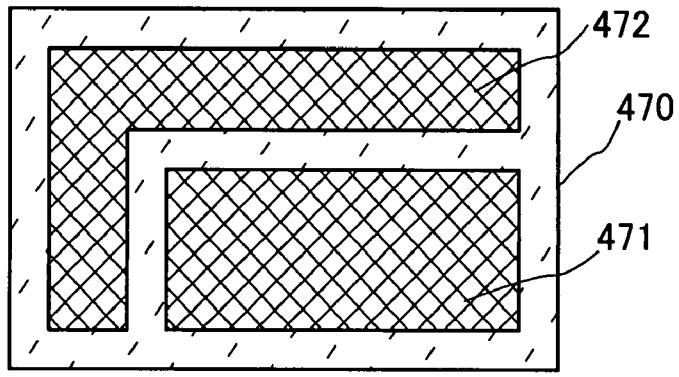
FIGS. 20A to 20D are top views of a semiconductor device of the invention.

FIGS. 20A to 20D are top views of a semiconductor device of the invention, which schematically show a substrate and a peripheral circuit portion and a memory element portion provided over the substrate. In the semiconductor device of this embodiment mode shown in FIGS. 20A to 20D, the memory element portion and the peripheral circuit portion are formed over the same substrate. FIG. 20A shows an example where a peripheral circuit portion 472 and a memory element portion 471 are provided over a substrate 470, and a semiconductor layer is formed over the entire top surface of the substrate 470. Over the substrate 470, a plurality of semiconductor elements is formed by isolating a semiconductor layer of the peripheral circuit portion 472 and the memory element portion 471 into element regions and element isolation regions. The element isolation regions are formed by doping the semiconductor layer with an impurity element in accordance with the invention (i.e., a first element isolation region which is a high-resistance region doped with an impurity element and a second element isolation region which is an impurity region having a conductivity type opposite to that of the element regions). The semiconductor layer in a region other than the peripheral circuit portion 472 and the memory element portion 471 which are provided over the substrate 470 may be used as the first element isolation region which is the high-resistance region doped with an impurity element or the second element isolation region which is the impurity region having a conductivity type opposite to that of the element regions, similarly to the element isolation regions in the peripheral circuit portion 472 and the memory element portion 471.

Figure 20B:
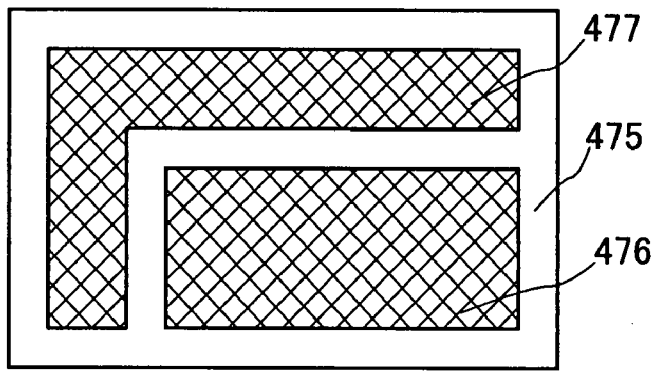

FIG. 20B shows an example where a semiconductor layer is not formed over the entire top surface of a substrate 475, and a semiconductor layer in a region other than a peripheral circuit portion 477 and a memory element portion 476 which are provided over the substrate 475 is removed by etching or the like. Similarly to the peripheral circuit portion 472 and the memory element portion 471 in FIG. 20A, the peripheral circuit portion 477 and the memory element portion 476 in FIG. 20B also have a structure where a plurality of semiconductor elements is formed in one semiconductor layer by providing a first element isolation region which is a high-resistance region doped with an impurity element and a second element isolation region which is an impurity region having a conductivity type opposite to that of the element regions. As shown in FIG. 20B, the semiconductor layer over a region of the substrate where no semiconductor element is formed may be used as either a high resistance region or removed. Alternatively, it is also possible to provide a structure where the element isolation method of the invention is applied to a region of a semiconductor layer where a plurality of semiconductor elements is positioned close to each other, for which fine isolation treatment is required, while a region of the semiconductor layer where the distance between each element is relatively long or where no element is formed is removed.

Figure 20C:
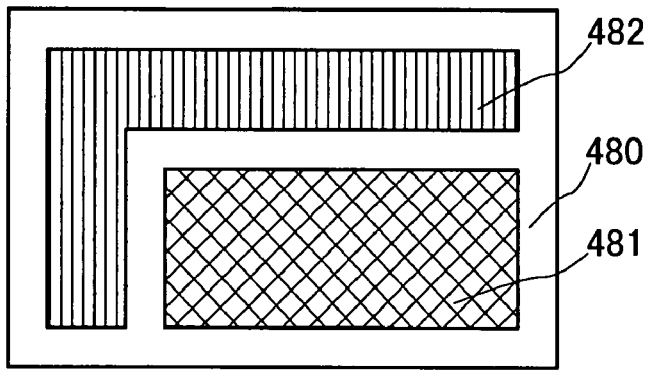

FIG. 20C shows an example where different element isolation methods are applied to semiconductor elements provided over a substrate 480 in accordance with the function or size required of each semiconductor element. In FIG. 20C, a peripheral circuit portion 482 provided over the substrate 480 includes semiconductor elements which have been processed into island shapes, and each semiconductor element is isolated from one another by removing a part of a semiconductor layer by etching. On the other hand, each semiconductor element in a memory element portion 481 is isolated from one another by forming a first element isolation region which is a high-resistance region and a second element isolation region which is an impurity region having a conductivity type opposite to that of element regions, by doping a semiconductor layer with an impurity element. When the characteristics required of the semiconductor elements in the peripheral circuit portion differ from those of the memory element portion, e.g., when a voltage applied to the semiconductor elements in the memory element portion (e.g., (writing) voltage of about 10 to 20 V) is higher than a voltage applied to the semiconductor elements in the peripheral circuit portion (e.g., a voltage of about 3 to 5 V), it is likely that the coverage of the semiconductor layer with a gate insulating layer will be poor, which results in an adverse effect. Therefore, it is preferable to use semiconductor elements, which are obtained by isolating one semiconductor layer into element regions, for the memory element portion 481 and to use semiconductor elements, which are obtained by separating a semiconductor layer into island-shape element regions, for the peripheral circuit portion 482. Therefore, even when the memory element portion which requires a voltage of about 10 to 20 V for writing or deleting data, and the peripheral circuit portion which mainly controls the data input/output or instructions with a voltage of about 3 to 7 V are formed over the same substrate, mutual interference resulting from the difference in the voltage applied to each element can be prevented.

Figure 20D:
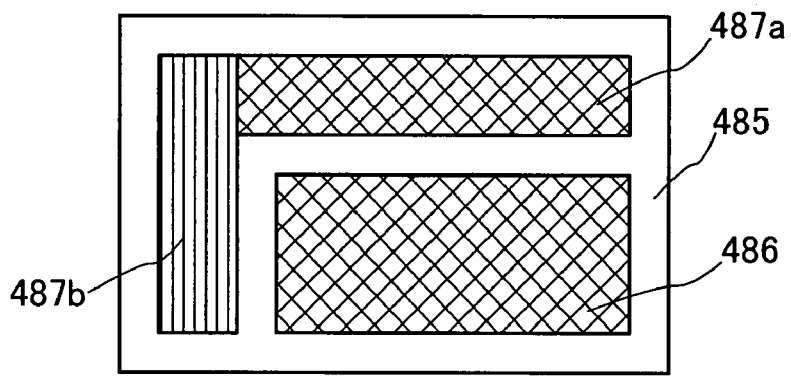

FIG. 20D also shows an example where different element isolation methods are applied to semiconductor elements provided over a substrate 485 in accordance with the function or size required of each semiconductor element. In FIG. 20D, a peripheral circuit portion 487b provided over the substrate 485 includes semiconductor elements which have been processed into island shapes, and each semiconductor element is isolated from one another by removing a part of a semiconductor layer by etching. On the other hand, each semiconductor element in a peripheral circuit portion 487a and a memory element portion 486 is isolated from one another by forming a first element isolation region which is a high-resistance region and a second element isolation region which is an impurity region having a conductivity type opposite to that of element regions by doping a semiconductor layer with an impurity element. In this manner, the structure where element isolation of the peripheral circuit portion 487b is conducted by selectively separating a semiconductor layer into island shapes and the structure where element isolation of the peripheral circuit portion 487a and the memory element portion 486 is conducted by providing element isolation regions in one semiconductor layer, may be combined as appropriate according to the structure of the circuits provided over the substrate.

The characteristics required of semiconductor elements provided over a substrate differ depending on functions. Further, the shapes of the semiconductor elements (e.g., the thickness of a gate insulating layer or the like) differ depending on the characteristics required of the semiconductor elements. In a fine-structure region where a plurality of semiconductor elements is positioned close to each other, the semiconductor elements can be formed by providing element isolation regions in one semiconductor layer. On the other hand, in a region where the distance between each element is relatively long, or where a gate insulating layer is not required to be thinned very much, a plurality of semiconductor elements can be manufactured by forming island-shape semiconductor layers by removing a part of the semiconductor layer. In this manner, by selecting different element isolation methods as appropriate according to the characteristics required of the elements over the substrate, a semiconductor device with high performance and high reliability, which is capable of high-speed response, can be manufactured.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1\times10^{10}$ $\Omega\cdot$cm or more, and the concentration of the first impurity element such as oxygen, nitrogen, or carbon is preferably $1\times10^{20}$ cm$^{-3}$ or more and less than $4\times10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Thus, according to this embodiment mode, a highly reliable semiconductor device having memory elements and a method for manufacturing the semiconductor device can be provided, where defects such as a short between a charge accumulating layer, a control gate electrode layer, a gate electrode layer, and a semiconductor layer and a leakage current, which would otherwise be caused due to a coverage defect of the semiconductor layer with an insulating layer, can be prevented. Accordingly, further miniaturization and higher integration of the semiconductor device having memory elements are possible, and higher performance of the semiconductor device can be achieved. In addition, since defects such as shape defects of the film can be reduced, the semiconductor device can be manufactured with a high yield in the manufacturing process.

Embodiment Mode 6

Figure 11A:
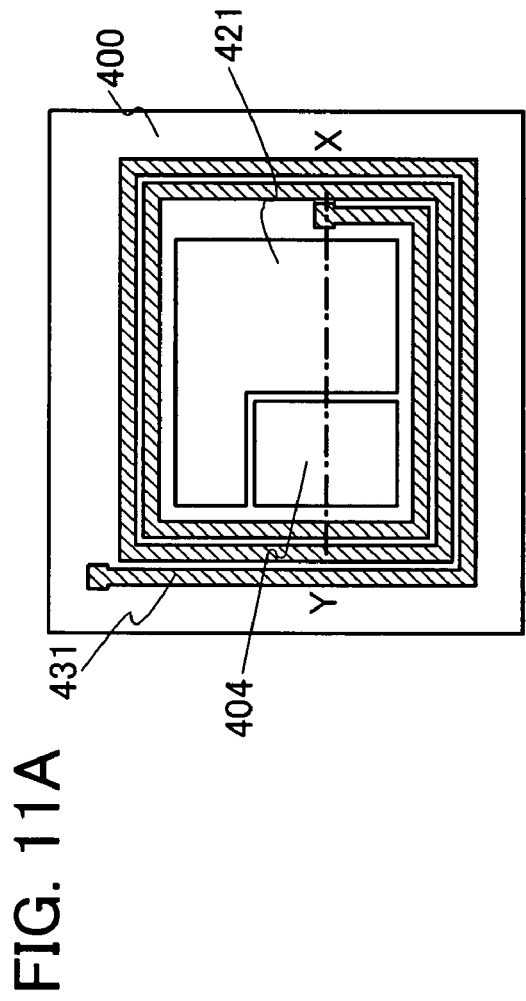
FIG. 11A is a top view of a semiconductor device of the invention.
Figure 11B:
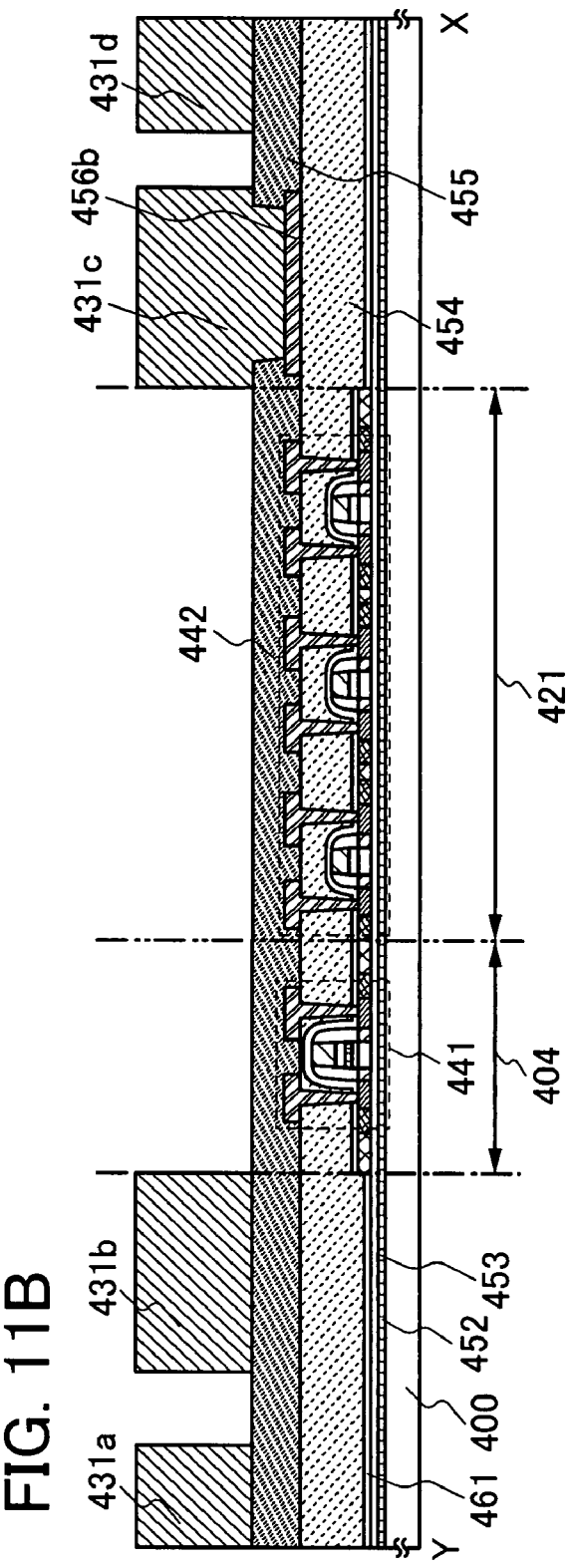
FIG. 11B is a cross-sectional view thereof.

This embodiment mode will describe an example of a highly reliable semiconductor device having memory elements where defects such as a short between a gate electrode layer and a semiconductor layer and a leakage current, which would otherwise be caused due to a coverage defect of the semiconductor layer with an insulating layer can be prevented, with reference to the drawings. FIG. 11A shows a top view of a semiconductor device in this embodiment mode. FIG. 11B shows a cross-sectional view taken along a line X-Y of FIG. 11A.

As shown in FIG. 11A, a memory element portion 404, a circuit portion 421, and an antenna 431 which constitute a semiconductor device having memory elements are formed over a substrate 400. FIGS. 11A and 11B show the semiconductor device in the middle stage of the manufacturing process, which corresponds to the state in which the memory element portion, the circuit portion, and the antenna are formed over the substrate 400 which can withstand the manufacturing conditions. The same material and manufacturing process as those in Embodiment Mode 3 may be used.

Over the substrate 400, a release layer 452 and an insulating layer 453 are formed. Over the insulating layer 453, a memory element 441 is provided in the memory element portion 404 and a transistor 442 is provided in the circuit portion 421. An insulating layer 455 is formed over the memory element 441 and the transistor 442.

In the semiconductor device in FIG. 11B, an antenna 431a, an antenna 431b, an antenna 431c, and an antenna 431d are formed over the insulating layer 455. The antenna 431c is formed in contact with a wiring layer 456b at an opening which is formed in the insulating layer 455 so as to expose the wiring layer 456b, and the antenna is electrically connected to the memory element portion 404 and the circuit portion 421.

Note that this embodiment mode can be freely implemented in combination with any of the other embodiment modes in this specification. In addition, when the semiconductor device manufactured in this embodiment mode is peeled off the substrate in the peeling step, and attached to a flexible substrate, it becomes possible to provide the semiconductor device over a flexible substrate, and thus provide a semiconductor device having flexibility.

A semiconductor device having flexibility which is obtained by attaching a semiconductor device to a flexible substrate is also called an IC film. An IC film is a flexible semiconductor device having a thickness of 100 µm or less, preferably 50 µm or less, or more preferably 20 µm or less. The thickness of a semiconductor layer included in the IC film is 100 µm or less, preferably 70 µm or less.

A flexible substrate corresponds to a film obtained by stacking an adhesive synthetic resin film (e.g., acrylic synthetic resin or epoxy synthetic resin) and any of a substrate made of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film made of polypropylene, polyester, vinyl, polyvinyl fluoride, vinyl chloride, or the like; paper made of a fibrous material; and a base film (e.g., polyester, polyamide, inorganic deposited film, or paper). A film is obtained by applying thermal treatment and pressure treatment to a treatment subject. When conducting thermal treatment and pressure treatment, an adhesive layer provided on the outermost surface of the film or a layer (which is not an adhesive layer) provided on the outermost surface is melted by thermal treatment and then attached to a base substrate by applying pressure. The base substrate may be either provided with or not provided with an adhesive layer. An adhesive layer corresponds to a layer containing an adhesive such as a thermal curing resin, a UV curing resin, an epoxy resin, or a resin additive.

The semiconductor device having memory elements of the invention may be manufactured by the steps of forming memory elements over a first substrate which can withstand the process conditions (e.g., temperature) and then transferring the memory elements to a second substrate. In addition, in this specification, "to transfer" means "to peel memory elements formed over a first substrate off the first substrate and move them to a second substrate." That is, it can also be said that "to move the position of providing memory elements to another substrate."

Note that, for the step of transferring memory elements to another substrate, it is possible to appropriately use any of the following methods: a method in which a release layer and an insulating layer are formed between a substrate and an element formation layer, a metal oxide film is provided between the release layer and the insulating layer, and the metal oxide film is weakened by crystallization so that the element formation layer is peeled off the substrate; a method in which an amorphous silicon film containing hydrogen is provided between a highly heat-resistant substrate and an element formation layer, and the amorphous silicon film is removed by laser irradiation or etching so that the element formation layer is peeled off the substrate; or a method in which a release layer and an insulating layer are formed between a substrate and an element formation layer, a metal oxide film is provided between the release layer and the insulating layer, the metal oxide film is weakened by crystallization, and a part of the release layer is removed by etching using a solution or a halogen fluoride gas such as $NF_3$, $BrF_3$, or $ClF_3$ so that separation occurs at the weakened metal oxide film; or a method in which a substrate over which an element formation layer is formed is removed mechanically or by etching with a solution or a halogen fluoride gas such as $NF_3$, $BrF_3$, or $ClF_3$. Alternatively, it is also possible to use a method in which a film containing nitrogen, oxygen, hydrogen, or the like (e.g., an amorphous silicon film containing hydrogen, an alloy film containing hydrogen, or an alloy film containing oxygen) is used as a release layer, and the release layer is irradiated with laser light so that nitrogen, oxygen, or hydrogen contained in the release layer is dissipated as a gas, thereby promoting separation between the element formation layer and the substrate.

When the above-described peeling methods are combined, the transfer step can be conducted easily. That is, peeling can be conducted with physical force (e.g., by a machine or the like) after making it easier for the release layer and the element formation layer to be separated from each other by conducting laser irradiation, etching the release layer with a gas or a solution, and/or mechanically removing the release layer using a keen knife.

The antenna may be provided to overlap with the memory element portion or provided around the memory element portion without overlapping. In addition, when the antenna is provided to overlap with the memory element portion, it may overlap with either a part of or the entire surface of the memory element portion. When the antenna portion and the memory element portion overlap with each other, it is possible to reduce noise or the like which is superposed on signals that the antenna communicates or reduce malfunctions of the semiconductor device due to the effect of fluctuation of electromotive force which is generated by electromagnetic induction. Thus, the reliability of the semiconductor device is improved. Further, the size of the semiconductor device can be reduced.

The signal transmission method of the above-described semiconductor device which is capable of wireless data communication can be an electromagnetic coupling method, an electromagnetic induction method, a microwave method, or the like. The transmission method can be selected appropriately by a practitioner in consideration of the intended purpose, and an optimal antenna may be provided in accordance with the transmission method.

For example, in the case of using an electromagnetic coupling method or an electromagnetic induction method (e.g., 13.56 MHz) as the signal transmission method of the semiconductor device, a conductive layer functioning as an antenna is formed in an annular form (e.g., a loop antenna) or a helical form (e.g., a spiral antenna) in order to utilize electromagnetic induction which occurs with changes in magnetic density.

In the case of using a microwave method (e.g., UHF band (860 to 960 MHz) or 2.45 GHz band) as the signal transmission method of the semiconductor device, the shape (e.g., length) of a conductive layer functioning as an antenna may be appropriately set in consideration of the wavelength of an electromagnetic wave used for signal transmission. For example, a conductive layer functioning as an antenna may be formed in a linear form (e.g., a dipole antenna), a flat form (e.g., a patch antenna), a ribbon form, or the like. The shape of the conductive layer functioning as the antenna is not limited to the linear form. For example, the conductive layer may be provided in a curved form, a serpentine form, or the like in consideration of the wavelength of electromagnetic waves.

The conductive layer functioning as the antenna is formed using a conductive material by a CVD method, a sputtering method, a printing method such as screen printing or gravure printing, a droplet discharge method, a dispensing method, a plating method, or the like. The conductive material is selected from an element such as aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as a main component. In addition, the conductive layer may be formed to have either a single-layer structure or a stacked structure.

For example, in the case of forming the conductive layer functioning as the antenna by a screen printing method, it may be provided by selectively printing a conductive paste in which conductive particles with a particle size of several nm to several tens of Jim are dissolved or dispersed in an organic resin. The conductive particles can be at least one of metal particles selected from among silver (Ag), gold (Ag), copper (Cu), nickel (Ni), platinum (Pt), palladium (Pd), tantalum (Ta), molybdenum (Mo), and titanium (Ti); fine particles of silver halide; or dispersive nanoparticles. In addition, the organic resin included in the conductive paste can be one or more of organic resins functioning as a binder, a solvent, a dispersing agent, and a coating material for the metal particles. Typically, an organic resin such as an epoxy resin and a silicone resin can be given as examples. In addition, it is preferable to form a conductive layer by extruding a conductive paste and baking it. For example, in the case of using fine particles (e.g., a particle size of 1 to 100 nm) containing silver as the main component for a material of the conductive paste, a conductive layer can be obtained by baking and hardening the conductive paste at temperatures in the range of 150 to 300° C. It is also possible to use fine particles of solder or lead-free solder. In that case, fine particles with a particle size of 20 μm or less are preferably used. Solder and lead-free solder have the advantages of low cost. Besides the above-described materials, ceramic, ferrite, or the like may also be used for the antenna.

In the case of using the electromagnetic coupling method or the electromagnetic induction method, and forming the semiconductor device having the antenna to be in contact with metal, it is preferable to provide a magnetic material having magnetic permeability between the semiconductor device and the metal. When the semiconductor device having the antenna is provided in contact with the metal, eddy current flows through the metal in accordance with changes in magnetic field, and in turn, a demagnetizing field which is generated by the eddy current weakens the changes in magnetic field, so that the communication distance decreases. Therefore, by providing a magnetic material having magnetic permeability between the semiconductor device and the metal, eddy current which flows through the metal can be suppressed, and thus a decrease in communication distance can be suppressed. As a magnetic material, ferrite or a thin metal film having high magnetic permeability and low loss of high frequency can be used.

In addition, when providing the antenna, it is possible to directly form semiconductor elements such as transistors and a conductive layer functioning as an antenna over one substrate. Alternatively, it is also possible to provide semiconductor elements and a conductive layer functioning as an antenna over different substrates, and then attach the substrates to each other so that the semiconductor elements and the antenna are electrically connected.

The invention is applied to the memory element 441 and the transistor 442. The channel formation regions of these elements are formed in element regions which are provided in one semiconductor layer. The memory element and the transistor are electrically insulated from each other by a first element isolation region with high resistance and a second element isolation region which has a contact with the element regions and has a conductivity type opposite to that of the source and drain regions of the element regions. In this manner, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved.

Thus, according to this embodiment mode, a highly reliable semiconductor device having memory elements and a method for manufacturing the semiconductor device can be provided, where defects such as a short between a charge accumulating layer, a control gate electrode layer, a gate electrode layer, and a semiconductor layer and a leakage current, which would otherwise be caused due to a coverage defect of the semiconductor layer with an insulating layer, can be prevented. Accordingly, further miniaturization and higher integration of the semiconductor device having memory elements are possible, and higher performance of the semiconductor device can be achieved. In addition, since defects such as shape defects of the film can be reduced, the semiconductor device can be manufactured with a high yield in the manufacturing process.

Embodiment Mode 7

This embodiment mode will describe a highly reliable semiconductor device having a CMOS circuit and a memory element where defects such as a short between a gate electrode layer and a semiconductor layer and a leakage current, which would otherwise be caused due to a coverage defect of the semiconductor layer with an insulating layer, can be prevented, with reference to the drawings. The method for manufacturing a semiconductor device in this embodiment mode will be described in detail with reference to FIGS. 5A to 6E.

Note that selection transistors provided in the memory portion require a higher driving voltage than transistors provided in the logic portion; therefore, it is preferable to vary, for example, the thickness of a gate insulating layer of the transistors provided in the memory portion and the thickness of a gate insulating layer of the transistors provided in the logic portion. For example, in order to obtain transistors with low driving voltage and small variations in threshold voltage, it is preferable to form thin film transistors having a thin gate insulating layer. On the other hand, in order to obtain transistors with high driving voltage and a gate insulating layer with high dielectric strength, it is preferable to form thin film transistors having a thick gate insulating layer Accordingly, this embodiment mode will describe the case of forming a thin insulating layer for the transistors in the logic portion, which require a low driving voltage and small variations in threshold voltage, and forming a thick insulating layer for the transistors in the memory portion, which require a high driving voltage and high dielectric strength of a gate insulating layer, referring to the drawings.

As base films over a substrate 100 having an insulating surface, an insulating layer 112a made of a silicon nitride oxide film with a thickness of 10 to 200 nm (preferably, 50 to 150 nm), and an insulating layer 112b made of a silicon oxynitride film with a thickness of 50 to 200 nm (preferably, 100 to 150 nm) are stacked by a sputtering method, a PVD (Physical Vapor Deposition) method, or a CVD (Chemical Vapor Deposition) method such as a low-pressure CVD (LPCVD) method or a plasma CVD method. Alternatively, it is also possible to use acrylic acid; methacrylic acid; derivatives thereof; thermally stable polymers such as polyimide, aromatic polyamide, or polybenzimidazole; or a siloxane resin. Note that the siloxane resin corresponds to a resin having a Si—O—Si bond. Siloxane has a skeletal structure with the bond of silicon (Si) and oxygen (O). As a substituent, an organic group containing at least hydrogen (e.g., an alkyl group or an aryl group) is used. Alternatively, a fluoro group may be used as the substituent. As a further alternative, both an organic group containing at least hydrogen and a fluoro group may be used as the substituent. Further, other resin materials can be used such as a vinyl resin (e.g., polyvinyl alcohol or polyvinyl butyral), an epoxy rein, a phenol resin, a novolac resin, an acrylic rein, a melamine resin, or a urethane resin. In addition, it is also possible to use an organic material such as benzocyclobutene, parylene, fluorinated arylene ether, or polyimide, or a composition material containing water-soluble homopolymers and water-soluble copolymers. Further, an oxazole resin such as photo-curing polybenzoxazole can also be used.

Further, a droplet discharge method, a printing method (a method by which patterns are formed such as screen printing or offset printing), a coating method such as spin coating, a dipping method, a dispensing method, or the like can be used. In this embodiment mode, the insulating layer 112a and the insulating layer 112b are formed by a plasma CVD. As the substrate 100, a glass substrate, a quartz substrate, a metal substrate, or a stainless steel substrate having an insulating layer formed on its surface can be used. Alternatively, a plastic substrate which can withstand the processing temperature in this embodiment mode, or a flexible substrate such as a film can also be used. As a plastic substrate, a substrate made of PET (polyethylene terephthalate), PEN (polyethylene naphthalate), PES (polyethersulfone), or the like can be used. As a flexible substrate, a synthetic resin such as acrylic can be used.

As the insulating layers functioning as base films, silicon oxide, silicon nitride, silicon oxynitride, silicon nitride oxide, or the like can be used, and either a single-layer structure or a stacked structure of two or three layers can be employed.

Next, a semiconductor layer is formed over the base films. The semiconductor layer may be formed to a thickness of 25 to 200 nm (preferably, 30 to 150 nm) by various methods (e.g., a sputtering method, an LPCVD method, or a plasma CVD method). In this embodiment mode, it is preferable to use a crystalline semiconductor layer which is obtained by crystallizing an amorphous semiconductor layer by laser irradiation.

As a method for forming the crystalline semiconductor layer, various methods (e.g., a laser crystallization method, a thermal crystallization method, or a thermal crystallization method using an element which promotes the crystallization such as nickel) may be used. Further, when a microcrystalline semiconductor is crystallized by laser irradiation, the crystallinity thereof can be increased. When an element which promotes the crystallization is not used, heating is conducted under a nitrogen atmosphere at 500° C. for one hour before conducting laser irradiation for an amorphous semiconductor layer, so that the concentration of hydrogen contained in the amorphous semiconductor layer is reduced to $1 \times 10^{20}$ atoms/cm$^3$ or less. This is because when an amorphous semiconductor layer containing much hydrogen is irradiated with laser light, the amorphous semiconductor layer will be destroyed. For the thermal treatment for crystallization, it is possible to use a heating oven, laser irradiation, irradiation with light emitted from a lamp (also called lamp annealing), or the like.

As a heating method, there is an RTA method such as GRTA (Gas Rapid Thermal Annealing) method or an LRTA (Lamp Rapid Thermal Annealing) method. GRTA is a method of thermal treatment using a high-temperature gas, and LRTA is a method of thermal treatment using light emitted from a lamp.

Alternatively, in the crystallization step for forming a crystalline semiconductor layer by crystallizing an amorphous semiconductor layer, the crystallization may be conducted by doping the amorphous semiconductor layer with an element which promotes the crystallization (also called a catalytic element or a metal element) and applying thermal treatment (550 to 750° C. for 3 minutes to 24 hours) thereto. The element which promotes the crystallization can be one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au).

As a method for introducing a metal element into the amorphous semiconductor layer, any method by which the metal element can remain on the surface or inside of the amorphous semiconductor layer can be used. For example, a sputtering method, a CVD method, a plasma treatment method (including a plasma CVD method), an adsorption method, or a method of applying a metal-salt solution can be used. Above all, the method using a solution is simple and advantageous in that the concentration of the metal element can be easily controlled. In addition, in order to improve the wettability of the surface of the amorphous semiconductor layer and spread an aqueous solution over the entire surface of the amorphous semiconductor layer, it is desirable to form an oxide film by UV irradiation under an oxygen atmosphere, a thermal oxidation method, treatment with ozone water containing hydroxyl radical or with hydrogen peroxide, or the like.

In order to remove or reduce the element which promotes the crystallization from the crystalline semiconductor layer, a semiconductor layer containing an impurity element is formed in contact with the crystalline semiconductor layer so that it can function as a gettering sink. As the impurity element, an impurity element which imparts n-type conductivity, an impurity element which imparts p-type conductivity, a rare gas element, or the like can be used. For example, one or more elements selected from among phosphorus (P), nitrogen (N), arsenic (As), antimony (Sb), bismuth (Bi), boron (B), helium (He), neon (Ne), argon (Ar), Kr (krypton), and Xe (xenon) can be used. A semiconductor layer containing a rare gas element is formed on the crystalline semiconductor layer containing the element which promotes the crystallization, and thermal treatment (550 to 750° C. for 3 minutes to 24 hours) is applied thereto. The element which promotes the crystallization and is contained in the crystalline semiconductor layer moves toward the semiconductor layer containing the rare gas element so that the element which promotes the crystallization and is contained in the crystalline semiconductor layer is removed or reduced. After that, the semiconductor layer containing the rare gas element functioning as the gettering sink is removed.

Laser irradiation can be conducted by scanning laser and the semiconductor layer relative to each other. In addition, a marker may be formed in order to overlap beams with high accuracy or to control the laser irradiation starting position and the laser irradiation termination position in the laser irradiation. The marker may be formed on the substrate at the same time as the formation of the amorphous semiconductor layer.

When using laser irradiation, a continuous wave (CW) laser beam or a pulsed laser beam can be used. As a laser beam herein, one or more of the following can be used: gas lasers such as an Ar laser, a Kr laser, and an excimer laser; a laser in which a medium such as single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ is doped with one or more of dopants such as Nd, Yb, Cr, Ti, Ho, Er, Tm, and Ta; a glass laser; a ruby laser; an alexandrite laser; a Ti:sapphire laser; a copper vapor laser; and a metal vapor laser. When irradiation is conducted with the fundamental wave of such a laser beam or the second to fourth harmonics of the fundamental wave, crystals with a large grain size can be obtained. For example, the second harmonic (532 nm) or the third harmonic (355 nm) of an Nd:YVO$_4$ laser (the fundamental wave of 1064 nm) can be used. This laser can be either a CW laser or a pulsed layer. When the laser is used as a CW laser, a laser power density of about 0.01 to 100 MW/cm$^2$ (preferably, 0.1 to 10 MW/cm$^2$) is required, and irradiation is conducted with a scanning rate set at about 10 to 2000 cm/sec.

Note that although the laser in which a medium such as single-crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ is doped with one or more of dopants such as Nd, Yb, Cr, Ti, Ho, Er, Tm, and Ta; an Ar ion laser, or a Ti:sapphire laser can be used as a CW laser, it can also be used as a pulsed laser with a repetition rate of 10 MHz or more by being combined with a Q-switch operation or mode locking. When a laser beam with a repetition rate of 10 MHz or more is used, it is possible for a semiconductor layer to be irradiated with the next pulse after it is melted by the previous laser but before it becomes solidified. Therefore, unlike the case of using a pulsed laser with a low repetition rate, it is possible to move a solid-liquid interface continuously in the semiconductor layer. Thus, crystal grains which have grown continuously in the scanning direction can be obtained.

When ceramic (polycrystals) is used as a medium, the medium can be formed into a desired shape in a short time at low cost. When single crystals are used, a medium with a columnar shape having a diameter of several mn and a length of several tens of mm is usually used. However, when ceramic is used, a medium larger than the case of using single crystals can be formed.

In both cases of using single crystals and polycrystals, the concentration of the dopant such as Nd or Yb contained in the medium which directly contributes to light emission cannot be changed largely. Therefore, there is a limitation to improving the output of the laser by increasing the concentration of the dopant. However, in the case of using ceramic, a drastic improvement in output can be achieved because the size of the medium can be significantly increased than the case of using single crystals.

Further, in the case of using ceramic, a medium with a parallelepiped shape or a rectangular parallelepiped shape can be formed easily. When such a medium is used and oscillated light is made travel within the medium in a zigzag manner, the oscillation path can be made long. Therefore, large amplification can be achieved and high output can be obtained. In addition, since a laser beam emitted from the medium with such a shape has a quadrangular cross section, it can easily be shaped into a linear beam unlike the case of using a circular beam, which is advantageous. When the laser beam emitted in this manner is shaped with optics, a linear beam with a short side of I mm or less and a long side of several mm to several m can be obtained easily. In addition, when an excitation light is uniformly shone on the medium, a linear beam with uniform energy distribution in the long-side direction can be obtained. Further, it is preferable that the laser be shone on the semiconductor layer at an incident angle of θ (0<θ<90°) in order to prevent interference of laser.

By irradiating the semiconductor layer with such a linear beam, the entire surface of the semiconductor layer can be irradiated more uniformly. In the case where uniform irradiation is required from one end to the other end of the linear laser beam, it is necessary to exercise ingenuity, for example, by using slits or the like so as to shield light at a portion where energy is attenuated.

It is also possible to irradiate the semiconductor layer with laser light in an inert gas atmosphere such as a rare gas or nitrogen. Accordingly, roughness of the surface of the semiconductor layer caused by laser irradiation can be suppressed, and variations in the threshold voltage of transistors caused by variations in interface state density can be suppressed.

Crystallization of the amorphous semiconductor layer may also be conducted by combining thermal treatment and laser irradiation. Alternatively, one of thermal treatment and laser irradiation may be conducted a plurality of times.

The thusly obtained semiconductor layer may be doped with a small amount of an impurity element (e.g., boron or phosphorus) in order to control the threshold voltage of thin film transistors. Alternatively, such doping with the impurity element may be conducted before the crystallization step of the amorphous semiconductor layer. When the amorphous semiconductor layer is doped with an impurity element and then subjected to thermal treatment to be crystallized, activation of the impurity element can also be performed. In addition, defects caused in doping can be ameliorated.

The semiconductor layer which is a crystalline semiconductor layer is selectively doped with an impurity element to form element isolation regions. By the element isolation regions, the semiconductor layer is isolated into a plurality of element regions. Mask layers 103*a* to 103*d* are formed over the semiconductor layer and then the semiconductor layer is doped with an impurity element 104 which does not contribute to the conductivity. By doping the semiconductor layer with the impurity element 104 which does not contribute to the conductivity, element isolation regions 651*a* to 651*h* as well as element regions 102*a* to 102*d* which are insulated from each other by the element isolation regions are formed (see FIG. 5A).

Next, mask layers 652*a* to 652*d* are formed over the semiconductor layer so as to cover the element regions 102*a* to 102*d*, the element isolation regions 651*c* and 651*d*, and a part of the element isolation regions 651*a*, 651*b*, 651*e*, 651*f*, 651*g*, and 651*h*. Then, the semiconductor layer is doped with an impurity element 653 which imparts p-type conductivity. By doping the semiconductor layer with the p-type impurity element 653, second element isolation regions 101*a* to 101*f* which are p-type impurity regions are formed in the semiconductor layer (see FIG. 5B). In regions which are not doped with the p-type impurity element 653, first element isolation regions 660*a* to 660*f* are formed.

Next, mask layers 654*a* to 654*d* are formed over the semiconductor layer so as to cover the element regions 102*a* to 102*d*, the first element isolation regions 660*a* to 660*f*, and the second element isolation regions 101*a* to 101*f*. Then, the semiconductor layer is doped with an impurity element 655 which imparts n-type conductivity. By doping the semiconductor layer with the n-type impurity element 655, second element isolation region 656*a* and 656*b* which are n-type impurity regions are formed in the semiconductor layer (see FIG. 5C). In regions which are not doped with the n-type impurity element 655, first element isolation regions 661*a* and 661*b* are formed.

In this embodiment mode, the element isolation regions and the element regions are formed in one continuous semiconductor layer. Therefore, the first element isolation regions

660a to 660f, 661a, and 661b; the second element isolation regions 101a to 101f, 656a, and 656b; and the element regions 102a to 102d which are insulated from each other by the element isolation regions are contiguous. Therefore, the surface of the regions is highly flat and has no steep steps.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain-regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

The masks are removed, and a first insulating layer 105 and a charge accumulating layer 106 are sequentially formed over the semiconductor layer.

Since the first insulating layer 105 is formed over the highly flat semiconductor layer, the coverage of the semiconductor layer is high and shape defects of the film could hardly occur. Therefore, defects such as a leakage current and a short between the charge accumulating layer 106 formed over the first insulating layer 105 and the element region 102c can be prevented. Thus, the semiconductor device of this embodiment mode which is a nonvolatile semiconductor memory device can be formed as a highly reliable semiconductor device where defects such as a short between a charge accumulating layer and a semiconductor layer and a leakage current, which would otherwise be caused due to a coverage defect of the semiconductor layer with the first insulating layer, can be prevented.

The first insulating layer 105 can be formed by applying thermal treatment, plasma treatment, or the like to the semiconductor layer. For example, by applying high-density-plasma oxidation, nitridation, or oxynitridation treatment to the semiconductor layer, the first insulating layer 105 is formed as an oxide film, a nitride film, or an oxynitride film on the semiconductor layer. Note that the first insulating layer 105 may also be formed by a plasma CVD method or a sputtering method.

For example, when a semiconductor layer containing Si as a main component is used as the semiconductor layer, and high-density-plasma oxidation or nitridation treatment is applied to the semiconductor layer, a silicon oxide layer or a silicon nitride layer is formed as the first insulating layer 105. In addition, after oxidizing the semiconductor layer by high-density-plasma treatment, nitridation treatment may be conducted by applying high-density-plasma treatment again. In that case, a silicon oxide layer is formed in contact with the semiconductor layer and a nitrogen-plasma-treated layer is formed on the surface of the silicon oxide layer or in the vicinity of the surface.

Here, the first insulating layer 105 is formed to a thickness of 1 to 10 nm, preferably 1 to 5 nm. For example, a silicon oxide layer with a thickness of about 3 nm is formed on the surface of the semiconductor layer by applying high-density-plasma oxidation treatment to the semiconductor layer, and then high-density-plasma nitridation treatment is applied thereto to form a nitrogen-plasma-treated layer on the surface of the silicon oxide layer or in the vicinity of the surface. Specifically, first, a silicon oxide layer is formed to a thickness of 3 to 6 nm on the semiconductor layer by plasma treatment under an oxygen atmosphere. Subsequently, by conducting plasma treatment under a nitrogen atmosphere, a nitrogen-plasma-treated layer containing a high concentration of nitrogen is provided on the surface of the silicon oxide layer or in the vicinity of the surface. Here, by conducting plasma treatment under a nitrogen atmosphere, a structure is obtained in which 20 to 50 atomic % nitrogen is contained in a region from the surface of the silicon oxide layer to a depth of about 1 nm. In the nitrogen-plasma-treated layer, silicon containing oxygen and nitrogen (silicon oxynitride) is formed. At this time, it is preferable to consecutively conduct the high-density-plasma oxidation treatment and the high-density-plasma nitridation treatment without exposure to the air. By consecutively conducting such high-density-plasma treatment, mixture of contaminants can be prevented and improvement in production efficiency can be achieved.

In the case of oxidizing the semiconductor layer by high-density-plasma treatment, the plasma treatment is conducted under an oxygen atmosphere (e.g., an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). Meanwhile, in the case of nitriding the semiconductor layer by high-density-plasma treatment, the plasma treatment is conducted under a nitrogen atmosphere (e.g., an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas).

As the rare gas, Ar can be used, for example. Alternatively, a mixed gas of Ar and Kr can also be used. In the case of conducting high-density-plasma treatment under a rare gas atmosphere, the first insulating layer 105 may contain the rare gas (which includes at least one of He, Ne, Ar, Kr, and Xe) which has been used for the plasma treatment. For example, when Ar is used, the first insulating layer 105 may contain Ar.

The high-density-plasma treatment is conducted in the atmosphere containing the above-described gas, with the conditions of a plasma electron density of $1 \times 10^{11}$ cm$^{-3}$ or more and a plasma electron temperature of 1.5 eV or less. Specifically, the plasma treatment is conducted with a plasma electron density in the range of $1 \times 10^{11}$ to $1 \times 10^{13}$ cm$^{-3}$, inclusive and a plasma electron temperature in the range of 0.5 to 1.5 eV, inclusive. Since the plasma electron density is high and the electron temperature in the vicinity of the treatment subject (here, the semiconductor layer) formed on the substrate 100 is low, plasma damage to the treatment subject can be prevented. In addition, since the plasma electron density is as high as $1 \times 10^{11}$ cm$^{-3}$ or more, an oxide or nitride film which is formed by oxidizing or nitriding the treatment subject by plasma treatment is superior in uniformity of the film thickness or the like to a film formed by a CVD method, a sputtering method, or the like. Thus, a dense film can be obtained. Further, since the plasma electron temperature is set as low as 1.5 eV or less, oxidation or nitridation treatment can be conducted at a temperature lower than that of the conventional plasma treatment or thermal oxidation treatment. For example, even when the plasma treatment is conducted at a temperature lower than the strain point of a glass substrate by 100° C. or more, oxidation or nitridation treatment can be sufficiently conducted. As a frequency for generating plasma, high frequency such as microwaves (e.g., 2.45 GHz) can be used.

In this embodiment mode, in the case of oxidizing a treatment subject by high-density-plasma treatment, a mixed gas of oxygen ($O_2$), hydrogen ($H_2$), and argon (Ar) is introduced. The mixed gas used here may be introduced with an oxygen flow rate of 0.1 to 100 sccm, a hydrogen flow rate of 0.1 to 100 sccm, and an argon flow rate of 100 to 5000 sccm. Note that the mixed gas is preferably introduced with a ratio of oxygen: hydrogen:argon=1:1:100. For example, the mixed gas may be introduced with an oxygen flow rate of 5 sccm, a hydrogen flow rate of 5 sccm, and an argon flow rate of 500 sccm.

In the case of conducting nitridation by high-density-plasma treatment, a mixed gas of nitrogen ($N_2$) and argon (Ar) is introduced. The mixed gas used here may be introduced with a nitrogen flow rate of 20 to 2000 sccm and an argon flow rate of 100 to 10000 sccm. For example, the mixed gas may be introduced with a nitrogen flow rate of 200 sccm and an argon flow rate of 1000 sccm.

In this embodiment mode, the first insulating layer 105 formed on the semiconductor layer which is provided in the memory portion functions as a tunnel insulating layer of a nonvolatile memory element which is completed later. Thus, the thinner the first insulating layer 105 is, the easier it will be for tunnel current to flow through the layer, and thus higher-speed operation of the memory can be achieved. In addition, the thinner the first insulating layer 105 is, the easier it will be for charges to be accumulated in a charge accumulating layer which is formed later, with a low voltage, and thus lower power consumption of the semiconductor device can be achieved. Therefore, the first insulating layer 105 is preferably formed to be thin.

As a general method for forming a thin insulating layer over a semiconductor layer, there is a thermal oxidation method. However, when a substrate which does not have a sufficiently high melting point such as a glass substrate is used as the substrate 100, it is very difficult to form the first insulating layer 105 by a thermal oxidation method. In addition, an insulating layer formed by a CVD method or a sputtering method does not have a sufficient film quality due to its internal defects, and has a problem in that defects such as pin holes will be produced when the film is formed to be thin. Further, when an insulating layer is formed by the CVD method or the sputtering method, the coverage of the ends of the semiconductor layer is not enough, and there may be a case where a conductive film or the like which is formed over the first insulating layer 105 later is shorted to the semiconductor layer. Thus, by forming the first insulating layer 105 by high-density-plasma treatment as shown in this embodiment, an insulating layer which is denser than an insulating layer formed by a CVD method, a sputtering method, or the like can be formed. As a result, high-speed operation of the memory can be achieved and the charge holding properties can be improved. Note that in the case of forming the first insulating layer 105 by a CVD method or a sputtering method, it is preferable to apply high-density-plasma oxidation, nitridation, or oxynitridation treatment to the surface of the insulating layer after forming the insulating layer.

The charge accumulating layer 106 functioning as a floating gate can be formed using silicon (Si), a silicon compound, germanium (Ge), or a germanium compound. As a silicon compound, silicon nitride, silicon nitride oxide, silicon carbide, silicon germanium which contains 10 atomic % or more of germanium, metal nitride, metal oxide or the like can be used. As a typical example of a germanium compound, silicon germanium can be given, in which case 10 atomic % or more of germanium is preferably contained with respect to silicon. This is because, if the concentration of germanium is less than 10 atomic %, the effect of the germanium as the constituent element would be small, and the bandgap of the charge accumulating layer would not become effectively small.

Although the charge accumulating layer 106 is applied to the semiconductor device in accordance with the invention for the purpose of accumulating charges, any other materials having similar functions can be used. For example, a ternary semiconductor containing germanium may be used, or the semiconductor material may be hydrogenated. Alternatively, as a material having a function of the charge accumulating layer of the nonvolatile memory element, oxide or nitride of the germanium or the germanium compound can be used.

As a material for forming the charge accumulating layer 106, metal nitride or metal oxide can be used. As metal nitride, tantalum nitride, tungsten nitride, molybdenum nitride, titanium nitride, or the like can be used. As metal oxide, tantalum oxide, titanium oxide, tin oxide, or the like can be used.

It is also possible to form the charge accumulating layer 106 to have a stacked structure of the above-described materials. When a layer made of the above-described silicon, silicon compound, metal nitride, or metal oxide is formed above a layer made of germanium or a germanium compound, the upper layer can be used as a barrier layer having a water-resistant property or a chemical-resistant property in the manufacturing process. Therefore, handling of the substrate in photolithography, etching, and washing processes becomes easier, and thus the productivity can be improved. That is, the processing of the charge accumulating layer can be facilitated.

Figure 5A:
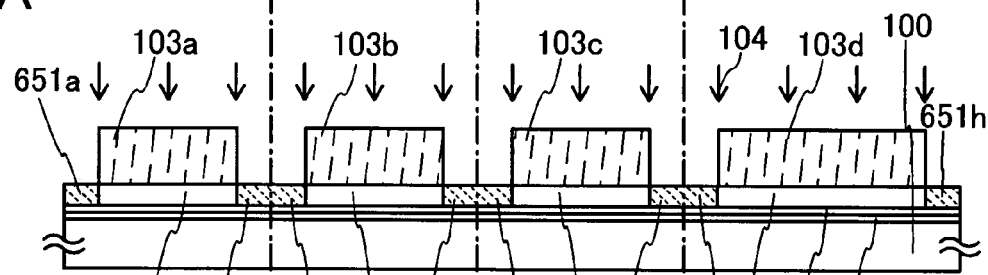
FIGS. 5A to 5F illustrate a method for manufacturing a semiconductor device of the invention.
Figure 5B:
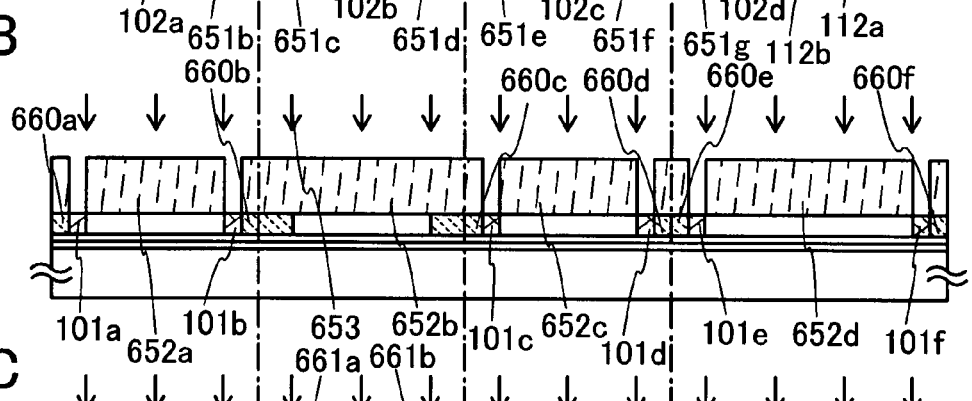
Figure 5C:
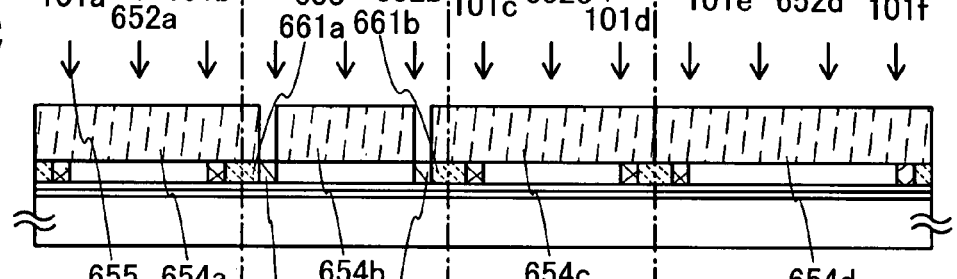
Figure 5D:
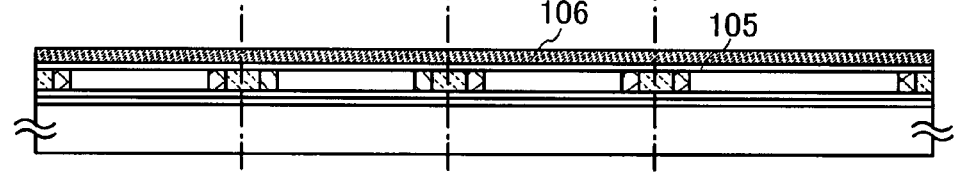
Figure 5E:
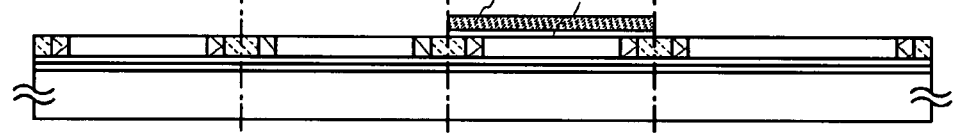
Figure 5F:
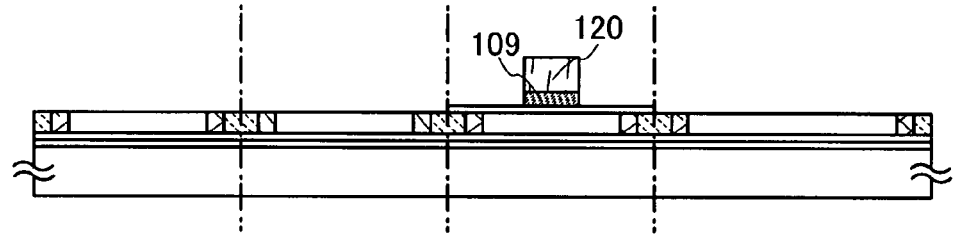

The first insulating layer 105 and the charge accumulating layer 106 are processed into desired shapes so that a first insulating layer 107 and a charge accumulating layer 108 are formed over the element region 102c which is used as the memory element (see FIG. 5E). Further, a mask layer 120 is formed over the charge accumulating layer 108 and the charge accumulating layer 108 is selectively etched using the mask layer 120, thereby forming a charge accumulating layer 109 (see FIG. 5F).

Next, impurity regions are formed in specific regions of the element region 102d. Here, after removing the mask layer 120, mask layers 121a to 121f are selectively formed so as to cover the element regions 102a to 102c and a part of the element region 102d. Then, an impurity element 119 is introduced into a part of the element region 102d which is not covered with mask layers 121a to 121f so that impurity regions 122a and 122b are formed (see FIG. 6A). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is introduced as the impurity element into the element region 102d.

Next, a second insulating layer 123 is formed so as to cover the element region 102d and the first insulating layer 107 and the charge accumulating layer 109 which are formed above the element region 102c.

The second insulating layer 123 is formed to have either a single layer or stacked layers by a CVD method, a sputtering method, or the like, using an insulating material such as silicon oxide, silicon nitride, silicon oxynitride ($SiO_xN_y$ where x>y>0), or silicon nitride oxide ($SiN_xO_y$ where x>y>0). Alternatively, the second insulating layer 123 can be formed using aluminum oxide ($AlO_x$), hafnium oxide ($HfO_x$), or tantalum oxide (TaO$_x$). For example, in the case of providing the second insulating layer 123 to have a single layer, a silicon oxynitride film or a silicon nitride oxide film is formed to a thickness of 5 to 50 nm by a CVD method. Meanwhile, in the case of providing the second insulating layer 123 to have a three-layer structure, a silicon oxynitride film is formed as a first insulating layer, a silicon nitride film is formed as a second insulating layer, and a silicon oxynitride film is formed as a third insulating layer. Further, oxide or nitride of germanium can be used for the second insulating layer 123.

Note that the second insulating layer 123 formed above the element region 102c functions as a control insulating layer of a nonvolatile memory element which is completed later, and the second insulating layer 123 formed above the element region 102d functions as a gate insulating layer of a transistor which is completed later.

Next, a third insulating layer 135 is formed so as to cover the element regions 102a and 102b.

The third insulating layer 135 is formed by using any of the above-described methods used for forming the first insulating layer 105. For example, by applying high-density-plasma oxidation, nitridation, or oxynitridation treatment to the semiconductor layer including the element isolation regions 101a to 101d, the third insulating layer 135 is formed as a silicon oxide film, a silicon nitride film, or a silicon oxynitride film on the semiconductor layer.

Here, the third insulating layer 135 is formed to a thickness of 1 to 20, preferably 1 to 10 nm. For example, a silicon oxide film is formed on the surface of the semiconductor layer including the element regions 102a and 102b and the element isolation regions 101a to 101d by applying high-density-plasma oxidation treatment to the semiconductor layer. Then, high-density-plasma nitridation treatment is applied to the silicon oxide film so that a silicon oxynitride film is formed on the surface of the silicon oxide film. In this case, the surface of the second insulating layer 123 formed above the element regions 102c and 102d is also oxidized or nitrided so that an oxide film or an oxynitride film is formed. The third insulating layer 135 formed above the element regions 102a and 102b functions as a gate insulating layer of transistors which are competed later.

Next, a conductive film is formed so as to cover the third insulating layer 135 formed above the element regions 102a and 102b in the semiconductor layer and also cover the second insulating layer 123 formed above the element regions 102c and 102d. Here, an example is shown where a first conductive film and a second conductive film are sequentially stacked as the conductive film. Needless to say, the conductive film may be formed to have a single layer or a stacked structure of more than two layers.

The first conductive film and the second conductive film can be formed using an element selected from among tantalum (Ta), tungsten (W), titanium (Ti), molybdenum (Mo), aluminum (Al), copper (Cu), chromium (Cr), niobium (Nb), and the like, or an alloy material or a compound material containing such an element as a main component. Alternatively, a metal nitride film obtained by nitriding the above-described metal can be used. Further, a semiconductor material typified by polycrystalline silicon doped with an impurity element such as phosphorus can also be used.

Here, a stacked structure is provided such that the first conductive film is formed using tantalum nitride and the second conductive film is stacked thereover using tungsten. Alternatively, the first conductive film may be formed as either a single-layer film or a stacked film using tungsten nitride, molybdenum nitride, and/or titanium nitride, and the second conductive film may also be formed as either a single-layer film or a stacked film using tantalum, molybdenum, and/or titanium.

Next, the first and second conductive films which are stacked are selectively etched to be removed so that the first conductive film and the second conductive film remain above a part of the element regions 102a to 102d in the semiconductor layer. Thus, first conductive layers 124a to 124d and second conductive layers 125a to 125d which function as gate electrode layers are formed (see FIG. 6B). Note that the first conductive layer 124c and the second conductive layer 125c formed above the element region 102c which is provided in the memory portion function as control gate electrode layers of a nonvolatile memory element which is completed later. In addition, the first conductive layers 124a, 124b, and 124d and the second conductive layers 125a, 125b, and 125d function as gate electrode layers of transistors which are completed later.

Figure 6A:
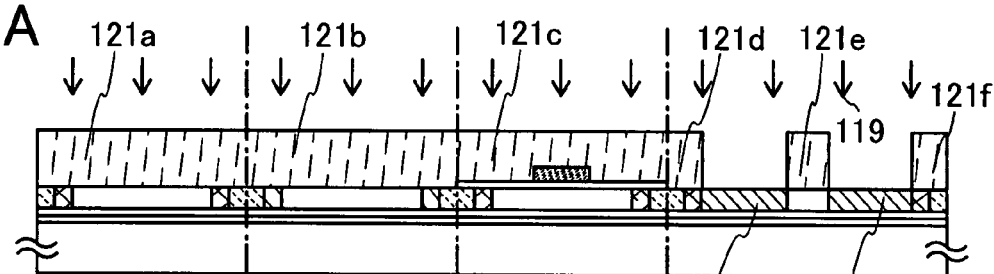
FIGS. 6A to 6E illustrate a method for manufacturing a semiconductor device of the invention.

Next, mask layers 126a to 126e are selectively formed so as to cover the element regions 102a, 102c, and 102d. Then, the element region 102b is doped with an impurity element 127, using the mask layers 126a to 126e, the first conductive layer 124b, and the second conductive layer 125b as masks, thereby forming impurity regions (see FIG. 6C). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, an impurity element (e.g., boron (B)) having a conductivity type opposite to that of the impurity element which has been introduced into the element region 102d in FIG. 6A is introduced. As a result, high-concentration impurity regions 132a and 132b which form source and drain regions and a channel formation region 134 are formed.

Next, mask layers 128a to 128g are selectively formed so as to cover the element region 102b. Then, the element regions 102a, 102c, and 102d are doped with an impurity element 129, using the mask layers 128a to 128g, the first conductive layers 124a, 124c, and 124d, and the second conductive layers 125a, 125c, and 125d as masks, thereby forming impurity regions (see FIG. 6D). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

Figure 6B:
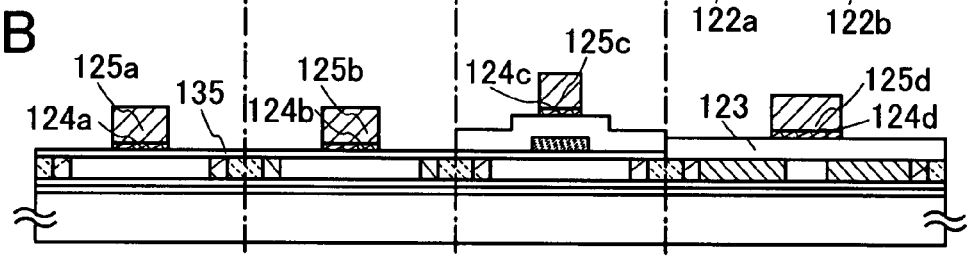
Figure 6C:
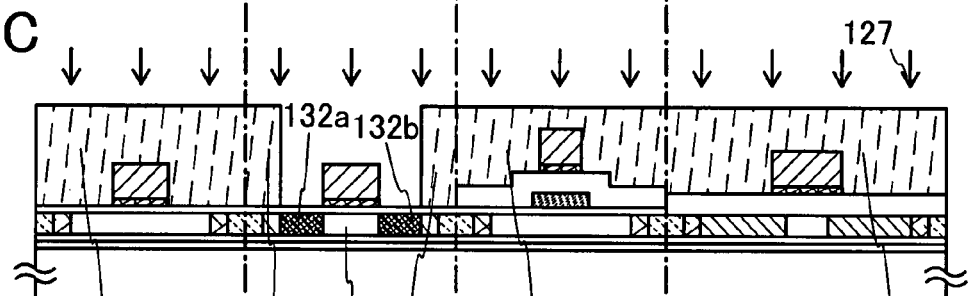
Figure 6D:
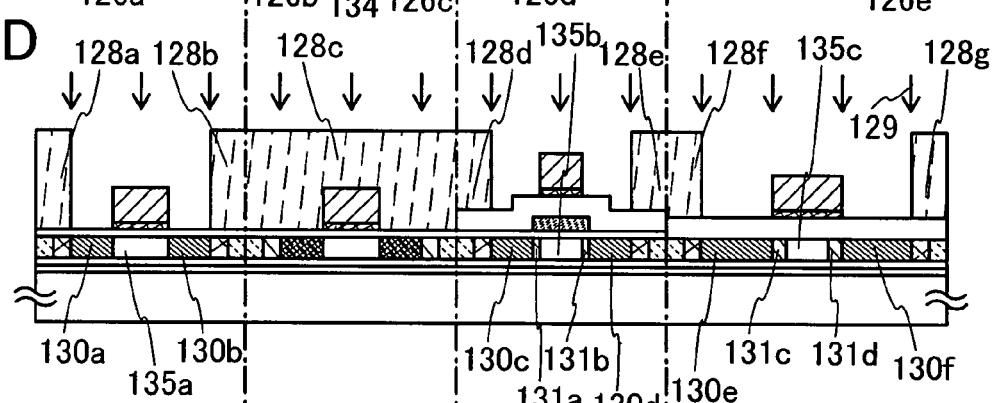
Figure 6E:
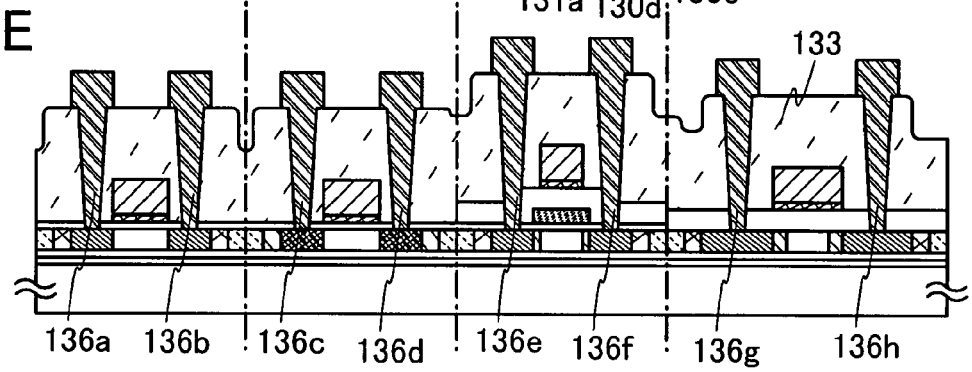

In FIG. 6D, by introducing the impurity element 129, high-concentration impurity regions 130a and 130b which form source and drain regions and a channel formation region 135a are formed in the element region 102a. In the element region 102c, high-concentration impurity regions 130c and 130d which form source and drain regions, low-concentration impurity regions 131a and 131b which form LDD (Lightly Doped Drain) regions, and a channel formation region 135b are formed. In the element region 102d, high-concentration impurity regions 130e and 130f which form source and drain regions, low-concentration impurity regions 131c and 131d which form LDD regions, and a channel formation region 135c are formed.

The low-concentration impurity regions 131a and 131b formed in the element region 102c are formed by an impurity element introduced in FIG. 6D which has passed through the charge accumulating layer 109 functioning as the floating gate. Thus, the channel formation region 135b is formed in a region of the element region 102c which overlaps with both of the second conductive layer 125c and the charge accumulating layer 109; the low-concentration impurity regions 131a and 131b are formed in a region of the element region 102c which overlaps with the charge accumulating layer 109 but does not overlap with the second conductive layer 125c; and the high-concentration impurity regions 130c and 130d are formed in a region of the element region 102c which overlaps with neither the charge accumulating layer 109 nor the second conductive layer 125c.

Next, an insulating layer 133 is formed so as to cover the second insulating layer 123, the third insulating layer 135, the first conductive layers 124a to 124d, and the second conductive layers 125a to 125d. Then, wiring layers 136a to 136h, which are electrically connected to the high-concentration impurity regions 130a to 130f, 132a, and 132b formed in the element regions 102a to 102d, are formed over the insulating layer 133 (see FIG. 6E).

The insulating layer 133 can be formed to have either a single layer or a stacked structure by a CVD method, a sputtering method, or the like, using an insulating layer containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (diamond-like carbon); an organic material such as epoxy, polyimide, polyamide, polyvinyl phenol, benzocyclobutene, or acrylic; and/or a siloxane material such as siloxane resin.

The wiring layers 136a to 136h are formed to have either a single layer or stacked layers by a CVD method, a sputtering method, or the like, using an element selected from among aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (Cu), and silicon (Si), or an alloy material or a compound material containing such an element as a main component. An alloy material containing aluminum as a main component corresponds to, for example, a material containing aluminum as a main component and also containing nickel, or an alloy material containing aluminum as a main component and also containing nickel and one or both of carbon and silicon. The wiring layers 136a to 136h are preferably formed to have a stacked structure of a barrier film, an aluminum silicon (Al—Si) film, and a barrier film, or a stacked structure of a barrier film, an aluminum silicon (Al—Si) film, a titanium nitride (TiN) film, and a barrier film. Note that the barrier film corresponds to a thin film made of titanium, titanium nitride, molybdenum, or molybdenum nitride. Aluminum and aluminum silicon, which have low resistance values and are inexpensive, are most suitable for the material of the wiring layers 136a to 136h. In addition, when the barrier layers are provided as the top layer and the bottom layer, generation of hillocks of aluminum or aluminum silicon can be prevented. Further, when a barrier film made of titanium which is an element having an excellent reducing property is used, even if a thin natural oxide film is formed on the crystalline semiconductor layer, the natural oxide film can be chemically reduced and thus an excellent contact between the barrier film and the crystalline semiconductor layer can be obtained.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer, a control gate electrode layer, a gate electrode layer, and a semiconductor layer and a leakage current, which would otherwise be caused due to a coverage defect of the semiconductor layer with an insulating layer, can be prevented. Accordingly, further miniaturization and higher integration of the semiconductor device having memory elements are possible, and higher performance of the semiconductor device can be achieved. In addition, since defects such as shape defects of the film can be reduced, the semiconductor device can be manufactured with a high yield in the manufacturing process.

This embodiment mode can be freely implemented in combination with any of the other embodiment modes.

Embodiment Mode 8

This embodiment mode will describe an example of a highly reliable semiconductor device having a CMOS circuit and a memory element where defects such as a short between a gate electrode layer and a semiconductor layer and a leakage current, which would otherwise be caused due to a coverage defect of the semiconductor layer with an insulating layer can be prevented, with reference to the drawings. The method for manufacturing a semiconductor device in this embodiment mode will be described in detail with reference to FIGS. 7A to 8E. The semiconductor device in this embodiment mode differs from the semiconductor device in Embodiment Mode 7 in shapes of the gate electrode layer and the control gate electrode layer. Note that portions common to both embodiment modes are denoted by common reference numerals and description thereof is omitted.

An insulating layer 112a and an insulating layer 112b functioning as base films are stacked over a substrate 100 having an insulating surface.

Next, a semiconductor layer 150 is formed over the base films. The semiconductor layer 150 may be formed to a thickness of 25 to 200 nm (preferably, 30 to 150 nm) by various methods (e.g., a sputtering method or a plasma CVD method). In this embodiment mode, it is preferable to use a crystalline semiconductor layer which is obtained by crystallizing an amorphous semiconductor layer by laser irradiation.

The thusly obtained semiconductor layer may be doped with a small amount of an impurity element (e.g., boron or phosphorus) in order to control the threshold voltage of thin film transistors. Alternatively, such doping with the impurity element may be conducted before the crystallization step of the amorphous semiconductor layer. When the amorphous semiconductor layer is doped with an impurity element and then subjected to thermal treatment to be crystallized, activation of the impurity element can also be performed. In addition, defects caused in doping can be ameliorated.

The mask is removed, and a first insulating layer 105 is formed over the semiconductor layer 150.

The first insulating layer 105 can be formed by applying thermal treatment, plasma treatment, or the like to the semiconductor layer. For example, by applying high-density-plasma oxidation, nitridation, or oxynitridation treatment to the semiconductor layer, the first insulating layer 105 is formed as an oxide film, a nitride film, or an oxynitride film on the semiconductor layer. Note that the first insulating layer 105 may also be formed by a plasma CVD method or a sputtering method.

For example, when a semiconductor layer containing Si as a main component is used as the semiconductor layer, and high-density-plasma oxidation or nitridation treatment is applied to the semiconductor layer, a silicon oxide layer or a silicon nitride layer is formed as the first insulating layer 105. In addition, after oxidizing the semiconductor layer by high-density-plasma treatment, nitridation treatment may be conducted by applying high-density-plasma treatment again. In that case, a silicon oxide layer is formed in contact with the semiconductor layer and a nitrogen-plasma-treated layer is formed on the surface of the silicon oxide layer or in the vicinity of the surface.

Here, the first insulating layer 105 is formed to a thickness of 1 to 10 nm, preferably 1 to 5 nm. For example, a silicon oxide layer with a thickness of about 3 nm is formed on the surface of the semiconductor layer by applying high-density-plasma oxidation treatment to the semiconductor layer, and then high-density-plasma nitridation treatment is applied thereto to form a nitrogen-plasma-treated layer on the surface of the silicon oxide layer or in the vicinity of the surface. Specifically, first, a silicon oxide layer is formed to a thickness of 3 to 6 nm on the semiconductor layer by plasma treatment under an oxygen atmosphere. Subsequently, by conducting plasma treatment under a nitrogen atmosphere, a nitrogen-plasma-treated layer containing a high concentration of nitrogen is provided on the surface of the silicon oxide layer or in the vicinity of the surface. Here, by conducting plasma treatment under a nitrogen atmosphere, a structure is obtained in which 20 to 50 atomic % nitrogen is contained in a region from the surface of the silicon oxide layer to a depth of about 1 nm. In the nitrogen-plasma-treated layer, silicon containing oxygen and nitrogen (silicon oxynitride) is formed. At this time, it is preferable to consecutively conduct the high-density-plasma oxidation treatment and the high-density-plasma nitridation treatment without exposure to the air. By consecutively conducting such high-density-plasma treatment, mixture of contaminants can be prevented and improvement in production efficiency can be achieved.

In this embodiment mode, the first insulating layer 1 OS formed on the semiconductor layer which is provided in the memory portion functions as a tunnel insulating layer of a nonvolatile memory element which is completed later. Thus, the thinner the first insulating layer 105 is, the easier it will be for tunnel current to flow through the layer, and thus higher-speed operation of the memory can be achieved. In addition, the thinner the first insulating layer 105 is, the easier it will be for charges to be accumulated in a charge accumulating layer which is formed later, with a low voltage, and thus lower power consumption of the nonvolatile semiconductor memory device can be achieved. Therefore, the first insulating layer 105 is preferably formed to be thin.

The semiconductor layer which is a crystalline semiconductor layer is selectively doped with an impurity element through the first insulating layer 105, thereby forming element isolation regions. By the element isolation regions, the semiconductor layer is isolated into a plurality of element regions. Mask layers 103a to 103d are formed over the semiconductor layer and then the semiconductor layer is doped with an impurity element 104 which does not contribute to the conductivity. By doping the semiconductor layer with the impurity element 104 which does not contribute to the conductivity, element isolation regions 651a to 651h as well as element regions 102a to 102d which are insulated from each other by the element isolation regions are formed (see FIG. 7B).

Next, mask layers 652a to 652d are formed over the semiconductor layer so as to cover the element regions 102a to 102d, the element isolation regions 651c and 651d, and a part of the element isolation regions 651a, 651b, 651e, 651f, 651g, and 651h. Then, the semiconductor layer is doped with an impurity element 653 which imparts p-type conductivity through the first insulating layer 105. By doping the semiconductor layer with the p-type impurity element 653, second element isolation regions 101a to 101f which are p-type impurity regions are formed in the semiconductor layer (see FIG. 7C). In regions which are not doped with the p-type impurity element 653, first element isolation regions 660a to 660f are formed.

Next, mask layers 654a to 654d are formed over the semiconductor layer so as to cover the element regions 102a to 102d, the first element isolation regions 660a to 660f, and the second element isolation regions 101a to 101f. Then, the semiconductor layer is doped with an impurity element 655 which imparts n-type conductivity. By doping the semiconductor layer with the n-type impurity element 655, second element isolation region 655a and 656b which are n-type impurity regions are formed in the semiconductor layer (see FIG. 7D). In regions which are not doped with the n-type impurity element 655, first element isolation regions 661a and 661b are formed.

In this embodiment mode, the element isolation regions and the element regions are formed in one continuous semiconductor layer. Therefore, the first element isolation regions 660a to 660f, 661a, and 661b, the second element isolation regions 101a to 101f, 656a, and 656b, and the element regions 102a to 102d which are insulated from each other by the element isolation regions are contiguous. Therefore, the surface of the regions is highly flat and has no steep steps.

Since the semiconductor layer 150 is doped with an impurity element through the first insulating layer 105 by a doping method or the like, physical energy required for doping the semiconductor layer 150 with the impurity element can be controlled. Therefore, the energy in doping can be lessened to a level that does not cause damage and the like to the semiconductor layer, and the crystallinity of the semiconductor layer can be selectively lowered to form element isolation regions. It is also possible to once remove the first insulating layer 105 after forming the element isolation regions and the element regions by doping with an impurity element and then form the first insulating layer 105 again. Further, plasma treatment may be applied to the insulating layer which is formed again so that the surface becomes densified.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Since the first insulating layer 105 is formed over the highly flat semiconductor layer, the coverage of the semiconductor layer is high and shape defects of the film could hardly occur. Therefore, defects such as a leakage current and a short between the charge accumulating layer 106 formed over the first insulating layer 105 and the element region 102*c* can be prevented. Therefore, the semiconductor device of this embodiment mode which is a nonvolatile semiconductor memory device can be formed as a highly reliable semiconductor device where defects such as a short between a charge accumulating layer, a control gate electrode layer which is formed later, and a semiconductor layer and a leakage current, which would otherwise be caused due to a coverage defect of the semiconductor layer with the first insulating layer, can be prevented.

Figure 7A:
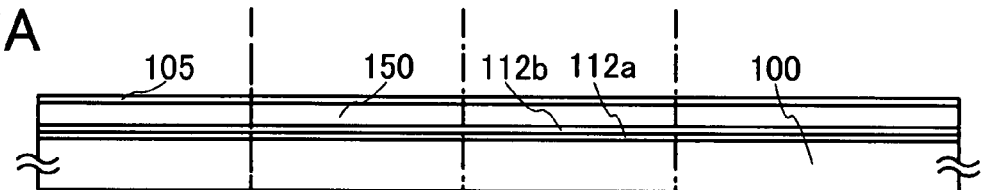
FIGS. 7A to 7F illustrate a method for manufacturing a semiconductor device of the invention.
Figure 7B:
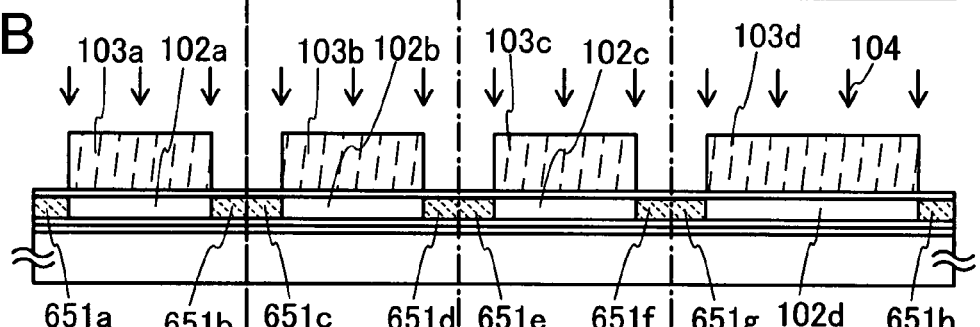
Figure 7C:
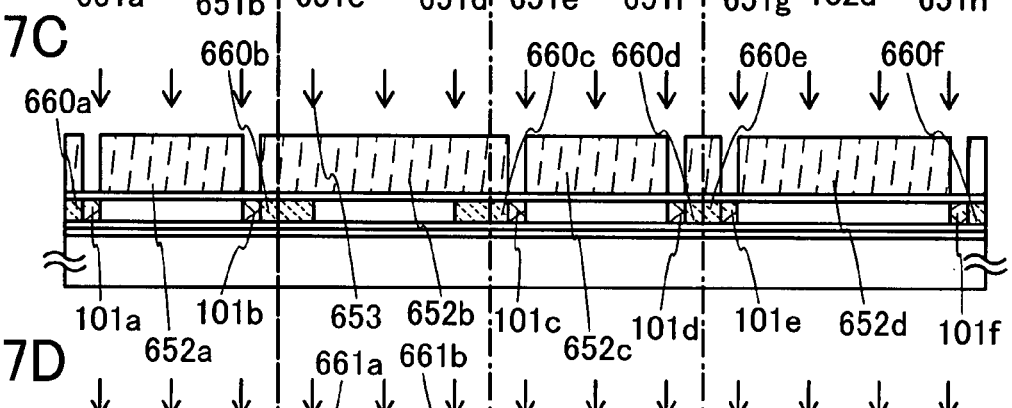
Figure 7D:
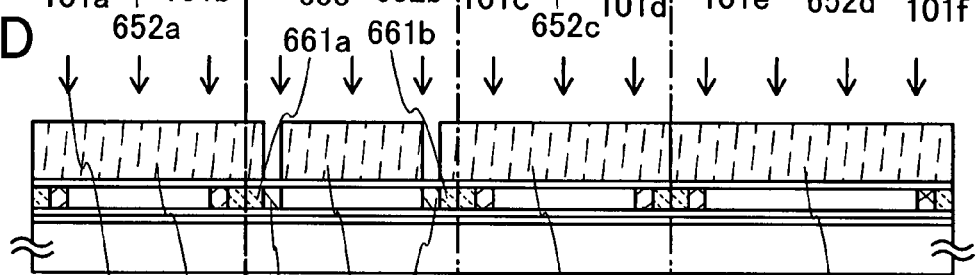
Figure 7E:
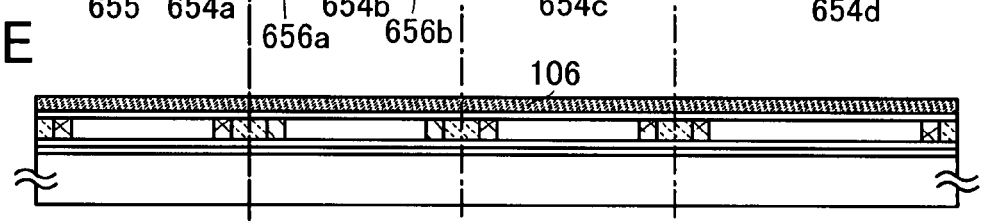

A charge accumulating layer 106 is formed over the first insulating layer 105 (see FIG. 7E).

The charge accumulating layer 106 can be formed using silicon, a silicon compound, germanium, or a germanium compound. As a silicon compound, silicon nitride, silicon nitride oxide, silicon carbide, silicon germanium which contains 10 atomic % or more of germanium, metal nitride, metal oxide, or the like can be used. As a typical example of a germanium compound, silicon germanium can be given, in which case 10 atomic % or more of germanium is preferably contained with respect to silicon. This is because, if the concentration of germanium is less than 10 atomic %, the effect of the germanium as the constituent element would be small, and the bandgap of the charge accumulating layer would not become effectively small.

Although the charge accumulating layer 106 is applied to the semiconductor device in accordance with the invention for the purpose of accumulating charges, any other materials having similar functions can be used. For example, a ternary semiconductor containing germanium may be used, or the semiconductor material may be hydrogenated. Alternatively, as a material having a function of the charge accumulating layer of the nonvolatile memory element, oxide or nitride of the germanium or the germanium compound can be used.

As a material for forming the charge accumulating layer 106, metal nitride or metal oxide can be used. As metal nitride, tantalum nitride, tungsten nitride, molybdenum nitride, titanium nitride, or the like can be used. As metal oxide, tantalum oxide, titanium oxide, tin oxide, or the like can be used.

It is also possible to form the charge accumulating layer 106 to have a stacked structure of the above-described materials. When a layer made of the above-described silicon, silicon compound, metal nitride, or metal oxide is formed above a layer made of germanium or a germanium compound, the upper layer can be used as a barrier layer having a water-resistant property or a chemical-resistant property in the manufacturing process. Therefore, handling of the substrate in photolithography, etching, and washing processes becomes easier, and thus the productivity can be improved. That is, the processing of the charge accumulating layer can be facilitated.

Figure 7F:
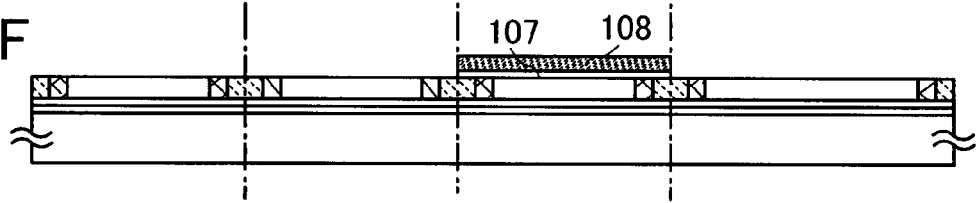

The first insulating layer 105 and the charge accumulating layer 106 are processed into desired shapes so that a first insulating layer 107 and a charge accumulating layer 108 are formed over the element region 102c which is used as the memory element (see FIG. 7F). Further, a mask layer 120 is formed over the charge accumulating layer 108 and the charge accumulating layer 108 is selectively etched using the mask layer 120, thereby forming a charge accumulating layer 109 (see FIG. 8A).

Next, a second insulating layer 123 is formed so as to cover the element region 102d and the first insulating layer 107 and the charge accumulating layer 109 which are formed above the element region 102c.

Note that the second insulating layer 123 formed above the element region 102c functions as a control insulating layer of a nonvolatile memory element which is completed later, and the second insulating layer 123 formed above the element region 102d functions as a gate insulating layer of a transistor which is completed later.

Next, a third insulating layer 135 is formed so as to cover the element regions 102a and 102b.

Next, a conductive film is formed so as to cover the third insulating layer 135 formed above the element regions 102a and 102b in the semiconductor layer and also cover the second insulating layer 123 formed above the element regions 102c and 102d. Here, an example is shown where a first conductive film and a second conductive film are sequentially stacked as the conductive film. Needless to say, the conductive film may be formed to have a single layer or a stacked structure of more than two layers.

Next, the first and second conductive films which are stacked are selectively etched to be removed so that the first conductive film and the second conductive film remain above a part of the element regions 102a to 102d in the semiconductor layer. Thus, first conductive layers 154a to 154d, and second conductive layers 155a to 155d which function as gate electrode layers are formed (see FIG. 8B). Note that the first conductive layer 154c and the second conductive layer 155c formed above the element region 102c which is provided in the memory portion function as control gate electrode layers of a nonvolatile memory element which is completed later. In addition, the first conductive layers 154a, 154b, and 154d, and the second conductive layers 155a, 155b, and 155d function as gate electrode layers of transistors which are completed later.

Next, mask layers 156a to 156e are selectively formed so as to cover the element regions 102a, 102c, and 102d. Then, the element region 102b is doped with an impurity element 157, using the mask layers 156a to 156e, the first conductive layer 154b, and the second conductive layer 155b as masks, thereby forming impurity regions (see FIG. 8C). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, an impurity element (e.g., boron) is introduced. As a result, high-concentration impurity regions 162a and 162b which form source and drain regions, low-concentration impurity regions 164a and 164b which form LDD regions, and a channel formation region 165 are formed in the element region 102b.

Next, mask layers 158a to 158g are selectively formed so as to cover the element region 102b. Then, the element regions 102a, 102c, and 102d are doped with an impurity element 159, using the mask layers 158a to 158g, the first conductive layers 154a, 154c, and 154d, and the second conductive layers 155a, 155c, and 155d as masks, thereby forming impurity regions (see FIG. 8D). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

In FIG. 8D, by introducing the impurity element, high-concentration impurity regions 160a and 160b which form source and drain regions, low-concentration impurity regions 161e and 161f which form LDD regions, and a channel formation region 167a are formed in the element region 102a. In the element region 102c, high-concentration impurity regions 160c and 160d which form source and drain regions, low-concentration impurity regions 161a and 161b which form LDD regions, and a channel formation region 167b are formed. In the element region 102d, high-concentration impurity regions 160e and 160f which form source and drain regions, low-concentration impurity regions 161c and 161d which form LDD (Lightly Doped Drain) regions, and a channel formation region 167c are formed.

Next, an insulating layer 163 is formed so as to cover the second insulating layer 123, the third insulating layer 135, the first conductive layers 154a to 154d, and the second conductive layers 155a to 155d. Then, wiring layers 166a to 166h, which are electrically connected to the high-concentration impurity regions 160a to 160f, 162a, and 162b formed in the element regions 102a to 102d, are formed over the insulating layer 163 (see FIG. 8E).

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer and a control gate electrode layer or between a gate electrode layer and a semiconductor layer and a leakage current, which would otherwise be caused due to a coverage defect of the semiconductor layer with the insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

This embodiment mode can be freely implemented in combination with any of the other embodiment modes.

Embodiment Mode 9

This embodiment mode will describe an example of a highly reliable semiconductor device having a CMOS circuit and a memory element where defects such as a short between a gate electrode layer and a semiconductor layer and a leakage current, which would otherwise be caused due to a coverage defect of the semiconductor layer with an insulating layer, can be prevented, with reference to the drawings. The method for manufacturing a semiconductor device in this embodiment mode will be described in detail with reference to FIGS. 9A to 10C. The semiconductor device in this embodiment mode differs from the semiconductor device in Embodiment Mode 7 in shapes of the first insulating layer and the second insulating layer. Note that portions common to both embodiment modes are denoted by common reference numerals and description thereof is omitted.

In Embodiment Mode 9, a semiconductor device having a CMOS circuit and a memory element, which is in the state shown in FIG. 6B, is manufactured.

Figure 9A:
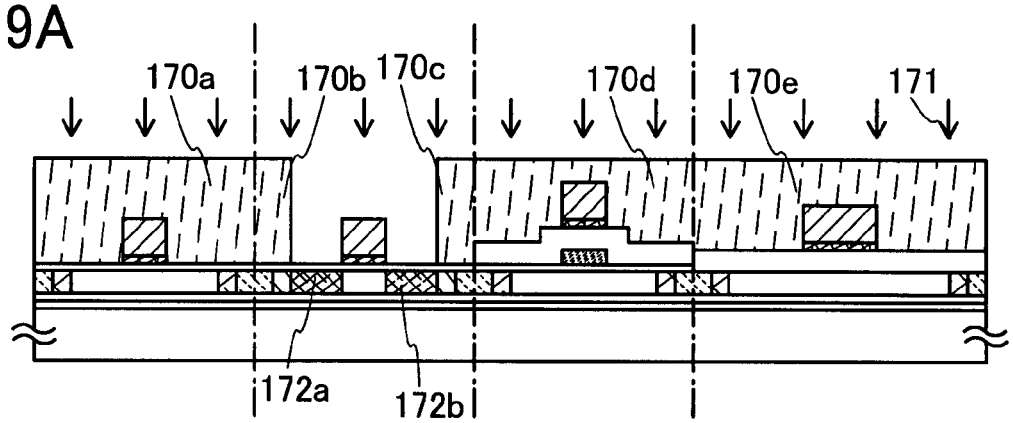
FIGS. 9A to 9C illustrate a method for manufacturing a semiconductor device of the invention.

As shown in FIG. 9A, mask layers 170a to 170e are selectively formed so as to cover the element regions 102a, 102c, and 102d. Then, the element region 102b is doped with an impurity element 171, using the mask layers 170a to 170e, the first conductive layer 154b, and the second conductive layer 155b as masks, thereby forming impurity regions (see FIG. 9A). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. As a result, impurity regions 172a and 172b are formed in the element region 102b.

Next, mask layers 173a to 173g are selectively formed so as to cover the element region 102b. Then, the element regions 102a, 102c, and 102d are doped with an impurity element 174, using the mask layers 173a to 173g, the first conductive layers 154a, 154c, and 154d, and the second conductive layers 155a, 155c, and 155d as masks, thereby forming impurity regions (see FIG. 9B). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

Figure 9B:
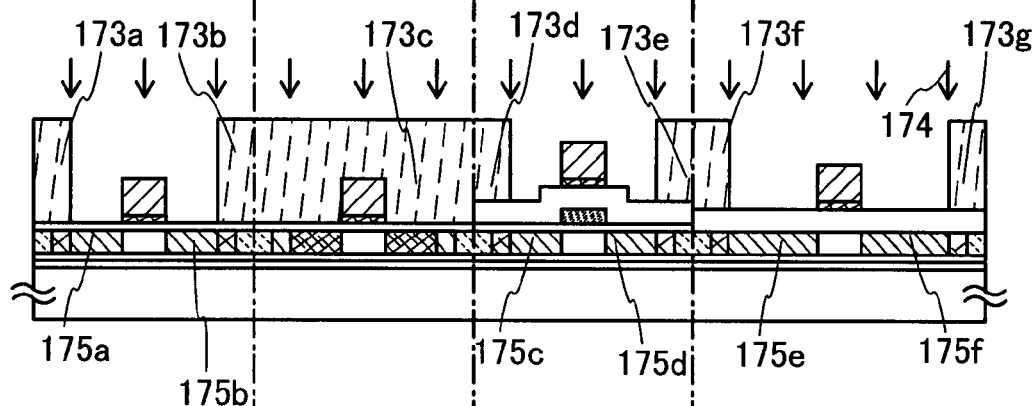
Figure 9C:
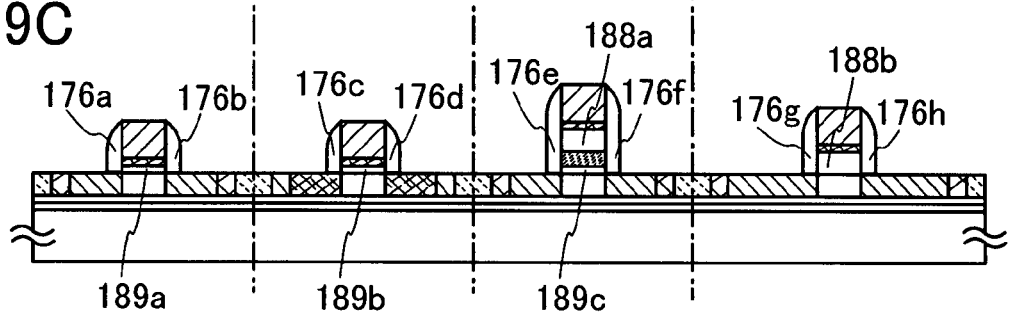

In FIG. 9B, by introducing the impurity element 174, impurity regions 175a and 175b are formed in the element region 102a; impurity regions 175c and 175d are formed in the element region 102c; and impurity regions 175e and 175f are formed in the element region 102d.

Next, the first insulating layer 107, the second insulating layer 123, and the third insulating layer 135 are selectively etched using the first conductive layers 154a to 154d and the second conductive layers 155a to 155d as masks, thereby forming insulating layers 188a, 188b, and 189a to 189c. Then, insulating layers (also called sidewalls) 176a to 176h, which have a contact with the side surfaces of the first conductive layers 154a to 154d, the second conductive layers 155a to 155d, the charge accumulating layer 109, and the insulating layers 188a, 188b, and 189a to 189c, are formed.

As shown in FIG. 10A, mask layers 178a to 178e are selectively formed so as to cover the element regions 102a, 102b, and 102d. Then, the element region 102b is doped with an impurity element 179, using the mask layers 178a to 178e, the first conductive layer 154b, the second conductive layer 155b, and the insulating layers 176c, 176d, and 189a as masks, thereby forming impurity regions (see FIG. 10A). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, an impurity element (e.g., boron) is introduced. As a result, high-concentration impurity regions 180a and 180b which form source and drain regions, low-concentration impurity regions 187a and 187b which form LDD regions, and a channel formation region 169 are formed in the element region 102b.

Next, mask layers 181a to 181g are selectively formed so as to cover the element region 102b. Then, the element regions 102a, 102c, and 102d are doped with an impurity element 182, using the mask layers 181a to 181g, the first conductive layers 154a, 154c, and 154d, the second conductive layers 155a, 155c, and 155d, and the insulating layers 176a, 176b, 176e, 176f, 176g, and 176h as masks, thereby forming impurity regions (see FIG. 10B). As the impurity element, an impurity element which imparts n-type conductivity or an impurity element which imparts p-type conductivity is used. As the n-type impurity element, phosphorus (P), arsenic (As), or the like can be used. As the p-type impurity element, boron (B), aluminum (Al), gallium (Ga), or the like can be used. Here, phosphorus (P) is used as the impurity element.

In FIG. 10B, by introducing the impurity element, high-concentration impurity regions 183a and 183b which form source and drain regions, low-concentration impurity regions 184a and 184b which form LDD regions, and a channel formation region 198a are formed in the element region 102a. In the element region 102c, high-concentration impurity regions 183*c* and 183*d* which form source and drain regions, low-concentration impurity regions 184*c* and 184*d* which form LDD (Lightly Doped Drain) regions, and a channel formation region 198*b* are formed. In the element region 102*d*, high-concentration impurity regions 183*e* and 183*f* which form source and drain regions, low-concentration impurity regions 184*e* and 184*f* which form LDD regions, and a channel formation region 198*c* are formed.

Next, insulating layers 199 and 186 are formed so as to cover the first conductive layers 154*a* to 154*d*, the second conductive layers 155*a* to 155*d*, and the insulating layers 176*a* to 176*h*. Then, wiring layers 185*a* to 185*h*, which are electrically connected to the high-concentration impurity regions 183*a* to 183*f*, 180*a*, and 180*b* formed in the element regions 102*a* to 102*d*, are formed over the insulating layers 199 and 186 (see FIG. 10C).

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ $\Omega$·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer, a control gate electrode layer or a gate electrode layer, and a semiconductor layer and a leakage current, which would otherwise be caused due to a coverage defect of the semiconductor layer with the insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

This embodiment mode can be freely implemented in combination with any of the other embodiment modes.

Embodiment Mode 10

This embodiment mode will describe a nonvolatile semiconductor memory device as another example of a highly reliable semiconductor device where defects such as a short between a charge accumulating layer, a control gate electrode layer, and a semiconductor layer and a leakage current, which would otherwise be caused due to a coverage defect of the semiconductor layer with an insulating layer, can be prevented, with reference to the drawings.

In the memory elements shown in Embodiment Modes 2 to 9, examples where a metal or a semiconductor material is used for a channel accumulating layer are shown. In this embodiment mode, an insulating layer, e.g., an insulating layer containing conductive particles or semiconductor particles such as silicon or germanium is used as a charge accumulating layer.

Although the charge accumulating layer is applied to the nonvolatile semiconductor memory device in accordance with the invention for the purpose of accumulating charges, any other materials having similar functions can be used. For example, an insulating layer having internal defects which trap charges, an insulating layer containing conductive particles or semiconductor particles such as silicon or germanium can be used. As typical examples of such a material, a silicon compound and a germanium compound can be given. Examples of the silicon compound include silicon nitride to which oxygen is added, silicon oxide to which nitrogen is added, silicon nitride to which oxygen and hydrogen are added, silicon oxide to which nitrogen and hydrogen are added, and the like. Examples of the germanium compound include germanium nitride, germanium oxide, germanium nitride to which oxygen is added, germanium oxide to which nitrogen is added, germanium nitride to which oxygen and hydrogen are added, germanium oxide to which nitrogen and hydrogen are added, and the like. Alternatively, the charge accumulating layer may contain germanium particles or silicon germanium particles.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a charge accumulating layer, a control gate electrode layer, and a semiconductor layer and a leakage current, which would otherwise be caused due to a coverage defect of the semiconductor layer with an insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

This embodiment mode can be freely implemented in combination with any of the other embodiment modes.

Embodiment Mode 11

This embodiment mode will describe an example of a highly reliable semiconductor device where defects such as a short between a gate electrode layer and a semiconductor layer and a leakage current, which would otherwise be caused due to a coverage defect of the semiconductor layer with an insulating layer, can be prevented, with reference to the drawings.

Embodiment Modes 1 to 10 have shown examples where a semiconductor layer is provided over a substrate having an insulating surface. In this embodiment mode, an example is shown where a semiconductor substrate made of Si or the like, or an SOI substrate is used instead of the above-described thin film process.

An SOI (Silicon on Insulator) substrate which is obtained by forming a single-crystalline semiconductor layer over an insulating surface can be formed by a wafer-bonding method or a SIMOX (Separation by IMplanted OXygen) method in which oxygen ions are implanted into a Si substrate so that an insulating layer is formed inside the Si substrate.

In this embodiment mode, in order to form a plurality of semiconductor elements over an insulating surface, a semiconductor layer is not separated into a plurality of island-shape semiconductor layers, but instead, element isolation regions, which electrically insulate a plurality of element regions functioning as semiconductor elements, are formed in one semiconductor layer, i.e., a first element isolation region with high resistance and a second element isolation region which has a contact with the element region and has a conductivity type opposite to that of the source and drain regions of the element region.

Each of the plurality of element regions is provided so as to be surrounded by the second element isolation region which is the impurity region having a conductivity type opposite to that of the source and drain regions of the element regions. Further, the first element isolation region which is the high-resistance region is provided adjacent to the outer side of the second element isolation region. Therefore, a first element region and a second element region are positioned close to each other by interposing a second element isolation region having a contact with the first element region, a first element isolation region, and a second element isolation region having a contact with the second element region between the first element region and the second element region.

When the source regions and the drain regions of the first element region and the second element region have the same conductivity type, e.g., n-type impurity regions, the second element isolation regions of both the element regions are p-type impurity regions having a conductivity type opposite to that of the element regions. On the other hand, when the first element region and the second element region have opposite conductivity types such that the source and drain regions of the first element region are n-type impurity regions and the source and drain regions of the second element region are p-type impurity regions, the second element isolation regions of the two element regions have opposite conductivity types correspondingly, such that the second element isolation region of the first element region is a p-type impurity region and the second element isolation region of the second element region is an n-type impurity region.

The first element isolation region, which is close to the element region with the second element isolation region interposed therebetween, is formed by selectively doping one semiconductor layer with a first impurity element which does not contribute to the conductivity, in order to electrically insulate elements from each other.

As the first impurity element which does not contribute to the conductivity (which does not improve the conductivity), at least one impurity element selected from the group consisting of oxygen, nitrogen, and carbon can be used. The conductivity of the element isolation region doped with the first impurity element which does not contribute to the conductivity is lowered, whereas the resistance of the element isolation region is increased because its crystallinity is lowered by the physical impact on the semiconductor layer at doping (this effect can also be called a so-called sputtering effect). Since the element isolation region with the increased resistance has lower electron field-effect mobility, it can electrically insulate the element regions from each other. On the other hand, a region which is not doped with the impurity element can be used as the element region because electron field-effect mobility which is high enough for the region to function as an element is retained therein.

The resistivity of the first element isolation region is preferably $1 \times 10^{10}$ Ω·cm or more, and the concentration of the first impurity element such as oxygen, nitrogen, or carbon is preferably $1 \times 10^{20}$ cm$^{-3}$ or more and less than $4 \times 10^{22}$ cm$^{-3}$.

Since the crystallinity of the first element isolation region is lowered by adding the impurity element, it can also be said that the first element isolation region has been changed into an amorphous state. On the other hand, since the element region is a crystalline semiconductor layer, when a semiconductor element is formed using the element region, its channel formation region has higher crystallinity than the first element isolation region. Thus, high electron field-effect mobility as a semiconductor element can be obtained.

As the first impurity element added into the first element isolation region, a rare gas element such as argon (Ar), neon (Ne), krypton (Kr), or xenon (Xe) may also be used. When such a rare gas element with a relatively high mass is also added in addition to the element such as oxygen, nitrogen, or carbon, physical impact on the semiconductor layer can be increased. Therefore, the crystallinity of the first element isolation region can be lowered more effectively.

The second element isolation region having a contact with the element region and provided between the element region and the first element isolation region is formed by doping the semiconductor layer with a second impurity element which imparts a conductivity type opposite to that of the source and drain regions of the element region.

The element region includes a source region, a drain region, and a channel formation region. The source and drain regions are impurity regions having one conductivity type (e.g., either n-type impurity regions or p-type impurity regions). By doping the second element isolation region with the second impurity element which imparts a conductivity type opposite to that of the source and drain regions of the element region, the second element isolation region is formed as an impurity region having a conductivity type opposite to that of the source and drain regions of the adjacent element region. That is, when the source and drain regions of the element region are n-type impurity regions, the adjacent second element isolation region may be formed as a p-type impurity region, and vice versa, when the source and drain regions of the element region are p-type impurity regions, the adjacent second element isolation region may be formed as an n-type impurity region. The element region and the second element isolation region which are adjacent to each other form a PN junction. Thus, the second element isolation region which is provided between element regions can further insulate the element regions from each other.

The invention is characterized in that one semiconductor layer is isolated into a plurality of element regions by forming element isolation regions for insulating the element regions in the semiconductor layer, i.e., a first element isolation region, which is a high-resistance region doped with a first impurity element which does not contribute to the conductivity, and a second element isolation region, which is an impurity region doped with a second impurity element which imparts a conductivity type opposite to that of the source and drain regions of the element region. By the invention, element regions can be isolated from each other by the effects yielded by the first element isolation region and the second element isolation region. Therefore, a higher element insulation/isolation effect can be obtained.

The doping of the semiconductor layer with the impurity elements for forming the first element isolation region and the second element isolation region can be conducted by using an ion implantation method, an (ion) doping method, or the like.

Further, in the element isolation regions, the first impurity element and the second impurity element may have concentration gradients. Needless to say, the first impurity element and the second impurity element may be added so that they are contained in the first element isolation region and the second element isolation region respectively at substantially a uniform concentration. That is, the peak concentration of the first impurity element in the first element isolation region and the peak concentration of the second impurity element in the second element isolation region can be set arbitrarily. In addition, since the second element isolation region has only to be an impurity region having a conductivity type opposite to that of the source and drain regions of the adjacent element region, it may also contain another impurity element which imparts the same conductivity type as that of the source and drain regions of the adjacent element region with a low concentration in addition to the impurity element which imparts the opposite conductivity type. Alternatively, the second element isolation region may also contain the first impurity element. In that case, the second element isolation region can be formed by doping a part of the first element isolation region with the second impurity element.

Therefore, when the invention is employed, a semiconductor layer can be isolated into a plurality of element regions without being separated into island shapes, and steps resulting from the ends of the semiconductor layer are not produced. Thus, an insulating layer can be formed over a flat semiconductor layer, and the coverage of the semiconductor layer with the insulating layer can be improved. Therefore, a highly reliable semiconductor device and a method for manufacturing the semiconductor device can be provided, where defects such as a short between a gate electrode layer and a semiconductor layer and a leakage current, which would otherwise be caused due to a coverage defect of the semiconductor layer with an insulating layer, can be prevented. Accordingly, further miniaturization and higher integration of the semiconductor device are possible, and higher performance of the semiconductor device can be achieved. In addition, since defects such as shape defects of the film can be reduced, the semiconductor device can be manufactured with a high yield in the manufacturing process.

This embodiment mode can be freely implemented in combination with any of the other embodiment modes.

Embodiment Mode 12

This embodiment mode will describe examples of the application of a semiconductor device capable of wireless data communication, which includes the above-described nonvolatile semiconductor memory device formed using the invention and the like. A semiconductor device capable of wireless data communication is also called an RFID tag, an ID tag, an IC tag, an IC chip, an RF tag, a wireless tag, an electronic tag, or a wireless chip depending on the use application.

Figure 22A:
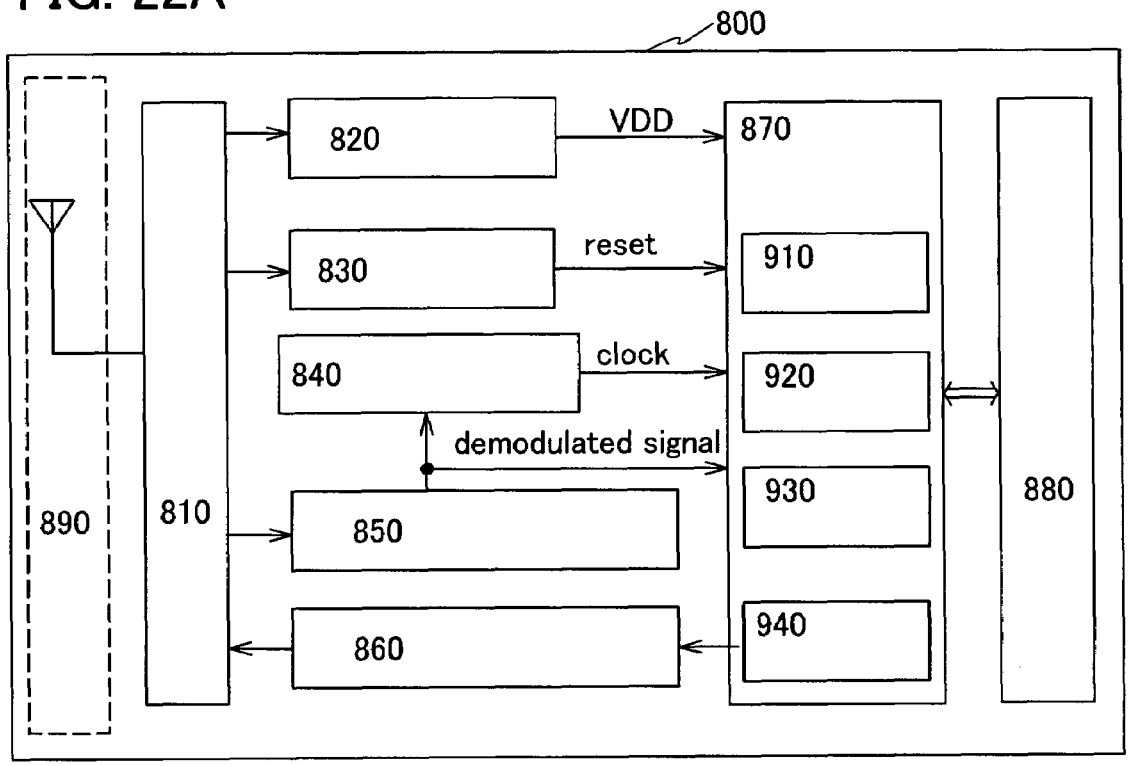
FIGS. 22A to 22C illustrate examples of the application of a semiconductor device of the invention.

A semiconductor device 800 has a function of wireless data communication, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (FIG. 22A). The high-frequency circuit 810 is a circuit which receives signals from the antenna 890, and outputs signals which are received from the data modulation circuit 860 to the antenna 890; the power supply circuit 820 is a circuit which generates power supply potentials from the signals received; the reset circuit 830 is a circuit which generates reset signals; the clock generation circuit 840 is a circuit which generates various clock signals based on the signals input from the antenna 890; the data demodulation circuit 850 is a circuit which demodulates the signals received and outputs them to the control circuit 870; and the data modulation circuit 860 is a circuit which modulates the signals received from the control circuit 870. The control circuit 870 includes, for example, a code extraction circuit 910, a code judging circuit 920, a CRC judging circuit 930, and an output unit circuit 940. Note that the code extraction circuit 910 is a circuit which extracts a plurality of codes included in the instructions transmitted to the control circuit 870; the code judging circuit 920 is a circuit which judges the content of the instructions by comparing the extracted code with a reference code; and the CRC judging circuit 930 is a circuit which detects the presence of transmission errors or the like based on the judged code.

Next, an example of the operation of the above-described semiconductor device is described. First, the antenna 890 receives a radio signal. When the radio signal is transmitted to the power supply circuit 820 through the high-frequency circuit 810, the power supply circuit 820 generates a high power supply potential (hereinafter referred to as VDD). VDD is supplied to each circuit included in the semiconductor device 800. In addition, a signal transmitted to the data demodulation circuit 850 through the high-frequency circuit 810 is demodulated (hereinafter the signal is referred to as a demodulated signal). Further, a signal transmitted to the reset circuit 830 through the high-frequency circuit 810 and the demodulated signal which has passed through the clock generation circuit 840 are transmitted to the control circuit 870. The signals transmitted to the control circuit 870 are analyzed by the code extraction circuit 910, the code judging circuit 920, the CRC judging circuit 930, and the like. Then, data on the semiconductor device which is stored in the memory circuit 880 is output in response to the analyzed signal. The output data of the semiconductor device is encoded in the output unit circuit 940. Further, the encoded data of the semiconductor device 800 is modulated in the data modulation circuit 860, and then transmitted as a radio signal through the antenna 890. Note that the low power supply potential (hereinafter referred to as VSS) is common to the plurality of circuits included in the semiconductor device 800; therefore, GND can be used as the VSS. In addition, the nonvolatile semiconductor memory device and the like formed using the invention can be applied to the memory circuit 880.

In this manner, by communicating signals between the semiconductor device 800 and a reader/writer, data on the semiconductor device can be read out.

The semiconductor device 800 may be either of a type where power supply to each circuit is conducted by using electromagnetic waves without providing a built-in battery, or of a built-in battery type where power supply to each circuit is conducted by using both electromagnetic waves and a built-in battery.

Figure 22B:
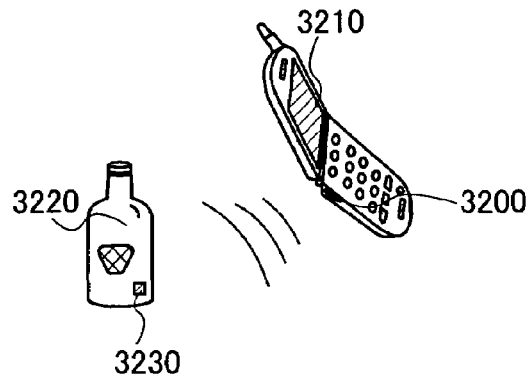
Figure 22C:
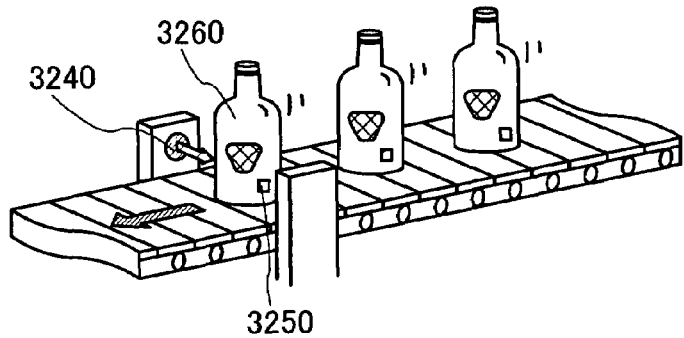

Next, examples of the application of the semiconductor device which can perform wireless data communication are described. A side surface of a portable terminal which includes a display portion 3210 is provided with a reader/writer 3200, and a side surface of a product 3220 is provided with a semiconductor device 3230 (FIG. 22B). When the reader/writer 3200 is put close to the semiconductor device 3230 provided on the product 3220, data on the raw material or source of the product, inspection result in each production step, history of the distribution process, product description, and the like is displayed on the display portion 3210. In addition, when carrying a product 3260 on a belt conveyor, inspection of the product 3260 can be conducted by using a reader/writer 3240 and a semiconductor device 3250 provided on the product 3260 (FIG. 22C). In this manner, by using the semiconductor device for a system, data acquisition can be easily conducted, and thus a higher function and higher added value can be realized.

A nonvolatile semiconductor memory device or the like which is a semiconductor device formed using the invention can be applied to various fields of electronic devices having memories. For example, the nonvolatile semiconductor memory device of the invention can be applied to electronic devices such as cameras (e.g., video cameras or digital cameras), goggle displays (e.g., head mounted displays), navigation systems, audio reproducing apparatuses (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image). FIGS. 23A to 23E show specific examples of such electronic devices.

Figure 23A:
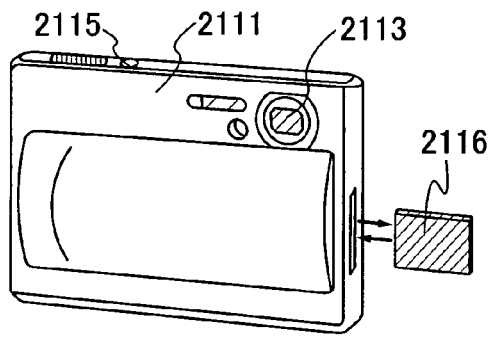
FIGS. 23A to 23E illustrate examples of the application of a semiconductor device of the invention.
Figure 23B:
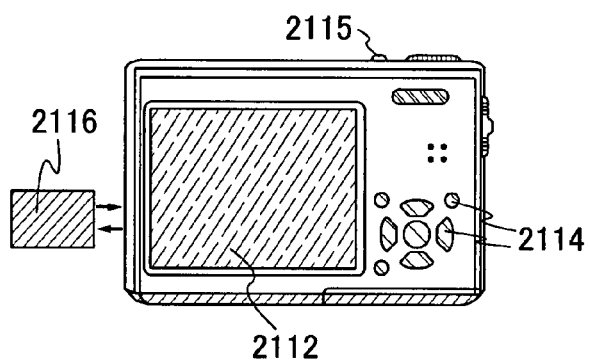

FIGS. 23A and 23B show digital cameras. FIG. 23B shows a rear side of FIG. 23A. This digital camera includes a housing 2111, a display portion 2112, a lens 2113, operating keys 2114, a shutter 2115, and the like. In addition, the digital camera also includes a removable nonvolatile memory 2116, and data picked up by the digital camera is stored in the memory 2116. A nonvolatile semiconductor memory device or the like which is a semiconductor device formed using the invention can be applied to the memory 1225.

Figure 23C:
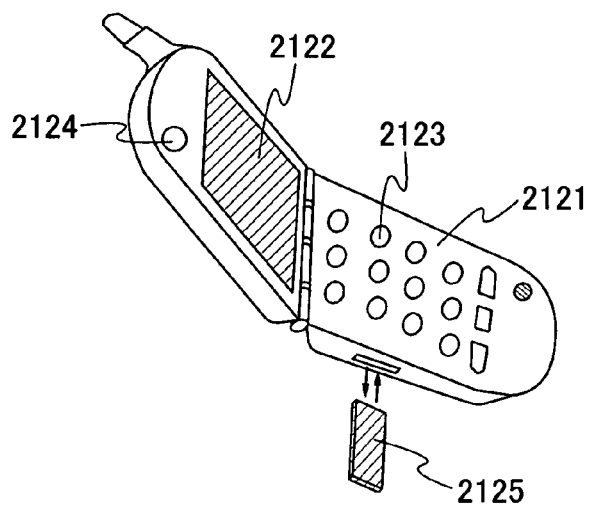

FIG. 23C shows a mobile phone which is one typical example of a portable terminal. This mobile phone includes a housing 2121, a display portion 2122, operating keys 2123, and the like. In addition, the mobile phone also includes a removable nonvolatile memory 2125, and data such as the phone number of the mobile phone, image data, audio data, and the like can be stored in the memory 2125 and reproduced. A nonvolatile semiconductor memory device or the like which is a semiconductor device formed using the invention can be applied to the memory 2125.

Figure 23D:
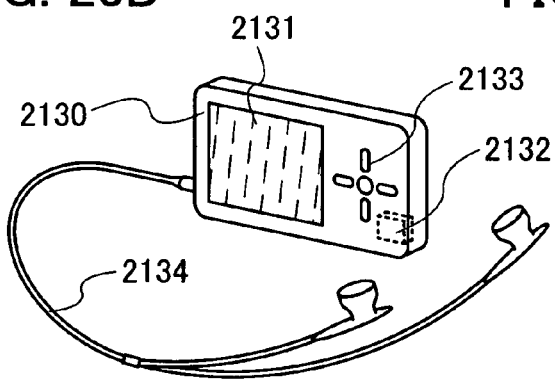

FIG. 23D shows a digital player which is one typical example of an audio device. The digital player shown in FIG. 23D includes a main body 2130, a display portion 2131, a memory portion 2132, operating portions 2133, a pair of earphones 2134, and the like. Note that instead of the pair of earphones 2134, headphones or wireless earphones can be used. A nonvolatile semiconductor memory device or the like which is a semiconductor device formed using the invention can be applied to the memory portion 2132. In addition, by using a NAND-type nonvolatile memory with a storage capacity of 20 to 200 gigabytes (GB), and operating the operating portions 2133, images or audio (music) can be recorded and reproduced. Note that by displaying white text on a black background of the display portion 2131, power consumption can be suppressed. This is particularly effective for the portable audio device. Note also that the nonvolatile semiconductor memory device provided in the memory portion 2132 may be removable.

Figure 23E:
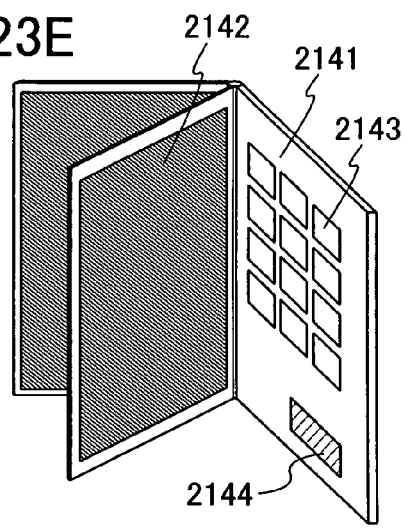

FIG. 23E shows an e-book device (also called an e-book reader). This e-book device includes a main body 2141, a display portion 2142, operating keys 2143, and a memory portion 2144. In addition, a modem may be built into the main body 2141, or a structure capable of wireless data transmission/reception may be employed. A nonvolatile semiconductor memory device or the like which is a semiconductor device formed using the invention can be applied to the memory portion 2144. In addition, by using a NAND-type nonvolatile memory with a storage capacity of 20 to 200 gigabytes (GB), and operating the operating keys 2143, images or audio (music) can be recorded and reproduced. Note that the nonvolatile semiconductor memory device provided in the memory portion 2144 may be removable.

As described above, the applicable range of the semiconductor device of the invention (in particular, a nonvolatile semiconductor memory device or the like which is a semiconductor device formed using the invention) is so wide that the semiconductor device can be applied to various fields of electronic devices having memories.

Embodiment Mode 13

According to the invention, a semiconductor device functioning as a chip including a processor circuit (hereinafter also called a, processor chip, a wireless chip, a wireless processor, a wireless memory, or a wireless tag) can be formed. The semiconductor device of the invention can be used for various applications. For example, the invention can be applied to bills, coins, securities, documents, bearer bonds, packaging containers, books, storage media, personal belongings, vehicles, foods, clothes, healthcare items, consumer products, medicals, electronic devices, and the like.

A semiconductor device having memory elements formed using the invention can be freely transferred to various substrates. Therefore, inexpensive materials can be selected for the substrate, and the semiconductor device can be provided with various functions according to the intended use, and further, the semiconductor device can be manufactured at low cost. Therefore, since a chip including a processor circuit in accordance with the invention has characteristics of a low cost, compact size, thin body, and lightweight, it is suitable for bills, coins, books which are often carried about, personal belongings, clothes, and the like.

Figure 21A:
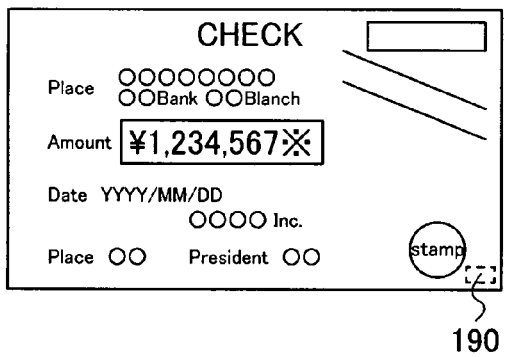
FIGS. 21A to 21G illustrate examples of the application of a semiconductor device of the invention.
Figure 21B:
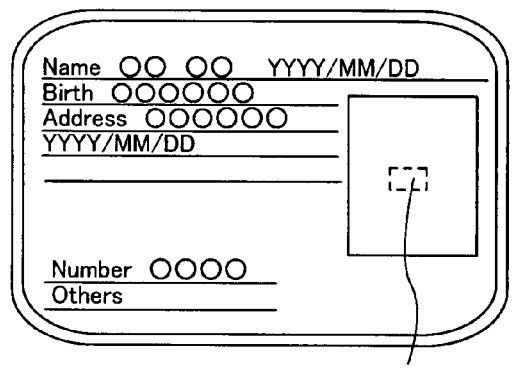
Figure 21C:
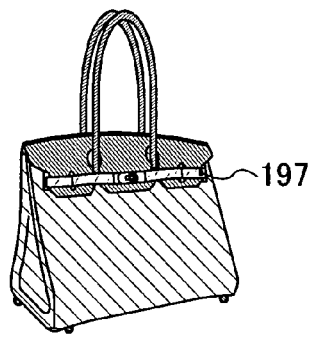
Figure 21D:
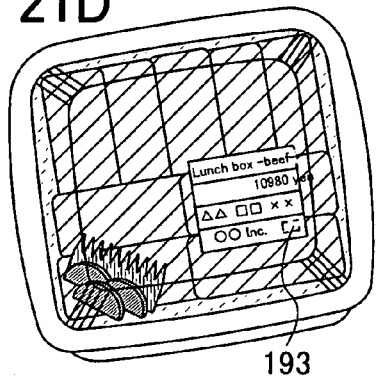
Figure 21E:
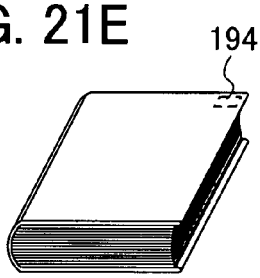
Figure 21F:
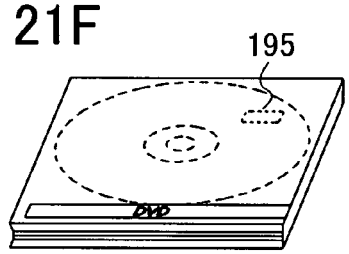
Figure 21G:
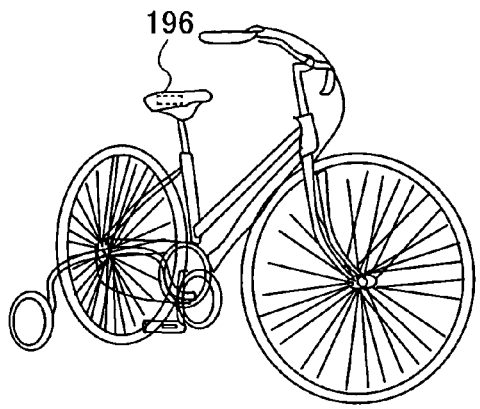

The bills and coins are currency in the market and include notes that are circulating as the real money in specific areas (cash vouchers), memorial coins, and the like. The securities include checks, certificates, promissory notes, and the like, and can be provided with a chip 190 including a processor circuit (FIG. 21A). The documents include driver's licenses, resident's cards, and the like, and can be provided with a chip 191 including a processor circuit (see FIG. 21B). The personal belongings include shoes, a pair of glasses, and the like, and can be provided with a chip 197 including a processor circuit (see FIG. 21C). The bearer bonds include stamps, rice coupons, various gift coupons, and the like. The packaging containers include paper for wrapping a lunch box or the like, plastic bottles, and the like, and can be provided with a chip 193 including a processor circuit (see FIG. 21D). The books include documents and the like, and can be provided with a chip 194 including a processor circuit (see FIG. 21E). The storage media include DVD software, video tapes, and the like, and can be provided with a chip 195 including a processor circuit (see FIG. 21F). The means of transportation include wheeled cycles or vehicles such as bicycles, vessels, and the like, and can be provided with a chip 196 including a processor circuit (see FIG. 21G). The foods include food items, beverages, and the like. The clothes include clothing, footwear, and the like. The healthcare items include medical devices, health appliances, and the like. The consumer products include furniture, lighting apparatuses, and the like. The medicals include medicines, agricultural chemicals, and the like. The electronic devices include liquid crystal display devices, EL display devices, television sets (television receivers or thin television receivers), mobile phones, and the like.

The semiconductor device of the invention is mounted on a printed board, attached to a surface of a product, or embedded in a product, so that it is fixed on the product. For example, the semiconductor device of the invention is embedded in paper of a book or an organic resin of a package. The semiconductor device of the invention can realize a compact size, slim body, and lightweight. Therefore, even when it is fixed on a product, the design of the product itself will not be spoiled. In addition, when the semiconductor device of the invention is applied to bills, coins, securities, bearer bonds, documents, and the like, authentication functions can be provided. In addition, when the semiconductor device of the invention is applied to packaging containers, storage media, personal belongings, foods, clothes, consumer products, electronic devices, and the like, efficiency of a system such as an inspection system can be increased.

The present application is based on Japanese Priority application No. 2006-127007 filed on Apr. 28, 2006 with the Japanese Patent Office, the entire contents of which are hereby incorporated by reference.

What is claimed is:

1. A semiconductor device comprising:
 a semiconductor layer provided over an insulating surface, and comprising:
  an element region comprising a source region, a drain region, and a channel formation region;
  a first element isolation region containing at least one first impurity element selected from the group consisting of oxygen, nitrogen, and carbon; and
  a second element isolation region containing a second impurity element imparting a conductivity type opposite to that of the source region and the drain region to the second element isolation region,
 wherein the first element isolation region is provided in contact with the second element isolation region,
 wherein the second element isolation region is provided in contact with the element region, and
 wherein the first element isolation region has lower crystallinity than the channel formation region.

2. The semiconductor device according to claim 1, further comprising:
 an insulating layer provided over the first element isolation region, the second element isolation region, and the element region; and
 a conductive layer provided over the insulating layer,
 wherein the conductive layer is provided so as to cover the first element isolation region, the second element isolation region, and the element region with the insulating layer interposed therebetween.

3. The semiconductor device according to claim 1, wherein the source region or the drain region forms a PN junction with the second element isolation region.

4. The semiconductor device according to claim 1,
 wherein the element region is surrounded by the second element isolation region; and
 wherein the second element isolation region is surrounded by the first element isolation region.

5. The semiconductor device according to claim 1, wherein a concentration of the first impurity element contained in the first element isolation region is $1\times10^{20}$ cm$^{-3}$ or more and less than $4\times10^{22}$ cm$^{-3}$.

6. A semiconductor device comprising:
 a semiconductor layer provided over an insulating surface, and comprising:
  a first element region comprising a first source region, a first drain region, and a first channel formation region;
  a second element region comprising a second source region, a second drain region, and a second channel formation region;
  a first element isolation region containing at least one first impurity element selected from the group consisting of oxygen, nitrogen, and carbon;
  a second element isolation region containing a second impurity element imparting a conductivity type opposite to that of the first source region and the first drain region; and
 a third element isolation region containing a third impurity element imparting a conductivity type opposite to that of the second source region and the second drain region,
 wherein the first element region and the second element region are close to each other with the first element isolation region, the second element isolation region and the third element isolation region interposed therebetween,
 wherein the first element isolation region is provided in contact with the second element isolation region and the third element isolation region,
 wherein the second element isolation region is provided in contact with the first element region,
 wherein the third element isolation region is provided in contact with the second element region,
 wherein the first source region, the first drain region, the second source region, and the second drain region have the same conductivity type,
 wherein the second element isolation region and the third element isolation region have the same conductivity type, and
 wherein the first element isolation region has lower crystallinity than the first channel formation region and the second channel formation region.

7. The semiconductor device according to claim 6, further comprising:
 an insulating layer provided over the first element isolation region, the second element isolation region, the third element isolation region, the first element region, and the second element region; and
 a conductive layer provided over the insulating layer, wherein the conductive layer is provided over the first element isolation region, the second element isolation region, and the first element region, or over the first element isolation region, the third element isolation region, and the second element region, with the insulating layer interposed therebetween.

8. The semiconductor device according to claim 6,
wherein the first source region or the first drain region forms a PN junction with the second element isolation region; and
wherein the second source region or the second drain region forms a PN junction with the third element isolation region.

9. The semiconductor device according to claim 6, wherein a concentration of the first impurity element contained in the first element isolation region is $1 \times 10^{20}$ cm$^{-3}$ or more and less than $4 \times 10^{22}$ cm$^{-3}$.

10. The semiconductor device according to claim 6, wherein the second impurity element and the third impurity element are same material.

11. A semiconductor device comprising:
a semiconductor layer over an insulating surface, comprising:
  a first element isolation region containing at least one first impurity element selected from the group consisting of oxygen, nitrogen, and carbon;
  a second element isolation region containing an impurity element imparting p-type conductivity to the second element isolation region;
  a third element isolation region containing an impurity element imparting n-type conductivity to the third element isolation region;
  a first element region comprising a first source region, a first drain region, and a first channel formation region, and being in contact with the second element isolation region, wherein the first source region and the first drain region are n-type impurity regions; and
  a second element region comprising a second source region, a second drain region, and a second channel formation region, and being in contact with the third element isolation region, wherein the second source region and the second drain region are p-type impurity regions,
wherein the first element region and the second element region are close to each other with the first element isolation region, the second element isolation region, and the third element isolation region interposed therebetween,
wherein the first element isolation region is provided in contact with the second element isolation region and the third element isolation region,
wherein the second element isolation region is provided in contact with the first element region,
wherein the third element isolation region is provided in contact with the second element region, and
wherein the first element isolation region has lower crystallinity than the first channel formation region and the second channel formation region.

12. The semiconductor device according to claim 11, further comprising:
an insulating layer provided over the first element region, the second element region, the first element isolation region, the second element isolation region, and the third element isolation region; and
a conductive layer provided over the insulating layer,
wherein the conductive layer is provided over the first element region, the second element region, the first element isolation region, the second element isolation region, and the third element isolation region with the insulating layer interposed therebetween.

13. The semiconductor device according to claim 11,
wherein the first source region or the first drain region forms a PN junction with the second element isolation region; and
wherein the second source region or the second drain region forms a PN junction with the third element isolation region.

14. The semiconductor device according to claim 11, wherein a concentration of the first impurity element contained in the first element isolation region is $1 \times 10^{20}$ cm$^{-3}$ or more and less than $4 \times 10^{22}$ cm$^{-3}$.

* * * * *